United States Patent
Tsukamoto

(10) Patent No.: US 6,703,951 B2
(45) Date of Patent: Mar. 9, 2004

(54) ANALOG TO DIGITAL CONVERTER WITH ENCODER CIRCUIT AND TESTING METHOD THEREFOR

(75) Inventor: Sanroku Tsukamoto, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 228 days.

(21) Appl. No.: 09/906,797

(22) Filed: Jul. 18, 2001

(65) Prior Publication Data

US 2001/0043150 A1 Nov. 22, 2001

Related U.S. Application Data

(62) Division of application No. 09/034,219, filed on Mar. 4, 1998.

(30) Foreign Application Priority Data

Jul. 18, 1997 (JP) .............................................. 9-193688
Jul. 25, 1997 (JP) .............................................. 9-199988

(51) Int. Cl.[7] ................................................. H03M 7/16
(52) U.S. Cl. .......................................... 341/120; 341/97
(58) Field of Search ................................ 341/120, 155, 341/97, 126, 746, 718

(56) References Cited

U.S. PATENT DOCUMENTS

| | | |
|---|---|---|
| 4,733,220 A | 3/1988 | Knierim |
| 4,884,075 A | 11/1989 | Mangelsdorf |
| 4,939,518 A | 7/1990 | Hotta et al. |
| 4,990,913 A | 2/1991 | Beauducel |

(List continued on next page.)

FOREIGN PATENT DOCUMENTS

| | | |
|---|---|---|
| JP | 8-265153 | 10/1996 |
| KR | 94-21424 | 9/1994 |

OTHER PUBLICATIONS

U.S. patent application Ser. No. 09/906,816, Tsukamoto, filed Jul. 18, 2001.

Van Valburg, Johan et al., "An 8–b 650–MHz Folding ADC", *IEEE Journal of Solid–State Circuits*, vol. 27, No. 12, Dec. 1992, pp. 1662–66.

Ito, Masao et al., "A 10 bit 20 MS/s 3V Supply CMOS A/D Converter", *IEEE Journal of Solid–State Circuits*, vol. 29, No. 12, Dec. 1994, pp. 1531–1536.

Akazawa, Yukio et al., "A 4000MSPS 8b Flash AD Conversion LSI", Session IX: High–Speed ADCs, 1987 IEEE International Solid State Circuits Conference, Feb. 25, 1987, pp. 98–99.

Mangelsdort, Christopher W., A 400–MHz Input Flash Converter with Error Correction, *IEEE Journal of Solid–State Circuits*, vol. 25, No. 1, Feb. 1990, pp. 184–191.

Gendai, Yuji et al., "8b 500MHz A/D Converter", ICD 91–85, 1991, pp. 29–35 (with English Abstract).

Matsuzawa, Akira et al., "An 8b 600MHz Flash A/D Converter with Multistage Duplex Gray Coding", ICD 91–86, pp. 37–42 (with English Abstract). (1991).

*Primary Examiner*—Brian Young
(74) *Attorney, Agent, or Firm*—Staas & Halsey LLP

(57) ABSTRACT

A high speed A/D converter includes a series of encoder sections for converting a thermometer code to a gray code and an error signal production section for detecting a babble error in the gray code and generating an error signal indicating such a babble error. An error correction section corrects babble errors in the gray code in response to the error signal. The corrected gray code is then converted to a binary code with a gray code to binary code converter. When the high speed A/D converter is incorporated in a semiconductor device, the A/D converter may be tested using a sampling clock having a phase which varies successively with respect to the input analog signal to sample the analog signal, and then evaluating the corresponding generated digital signal.

20 Claims, 48 Drawing Sheets

U.S. PATENT DOCUMENTS

| | | |
|---|---|---|
| 5,182,560 A | 1/1993 | Shiwaku |
| 5,283,582 A | 2/1994 | Krenik |
| 5,307,067 A | 4/1994 | Kimura et al. |
| 5,410,197 A | 4/1995 | Krenik |
| 5,548,287 A | 8/1996 | Gendai |
| 5,563,598 A | 10/1996 | Hickling |
| 5,633,636 A | 5/1997 | Reyhani |
| 5,644,312 A | 7/1997 | Deevy et al. |
| 5,818,210 A | 10/1998 | Ueno |
| 6,034,630 A | 3/2000 | Komatsu et al. |
| 6,229,472 B1 | 5/2001 | Nishida |
| 6,298,459 B1 * | 10/2001 | Tsukamoto ........ 341/158 |
| 6,377,200 B1 | 4/2002 | Lee |
| RE37,716 E | 5/2002 | Sutardja et al. |
| 6,404,373 B1 | 6/2002 | Yu et al. |
| 6,411,233 B1 | 6/2002 | Sutardja |
| 6,445,329 B1 | 9/2002 | Abassi et al. |
| 2001/0043150 A1 | 11/2001 | Tsukamoto |

\* cited by examiner

Fig. 11 b1 type babble error b2H type babble error b2L type bubble error b1 type bubble error b1 type babble error No babble error b1 type babble error b2H type babble error b2L type babble error No babble error b2H type babble error b2L type babble error

Fig.48

| | | | | | | | | | | | | | |
|---|---|---|---|---|---|---|---|---|---|---|---|---|---|
| Gray (Original Data) | G2 | 0 | 0 | 0 | 0 | 1 | 1 | 1 | 1 | 1 | 1 | 0 | 0 |
| | G1 | 0 | 0 | 1 | 1 | 1 | 1 | 0 | 0 | 0 | 1 | 1 | 0 |
| | g0a | 0 | 0 | 0 | 0 | 0 | 1 | 1 | 0 | 0 | 0 | 1 | 1 |
| | g0b | 0 | 1 | 1 | 0 | 0 | 0 | 0 | 0 | 1 | 1 | 0 | 0 |
| Error Detection | Ea | 0 | 0 | 0 | 0 | 0 | 0 | 0 | 0 | 0 | 0 | 1 | 1 |
| | Eb | 0 | 0 | 0 | 0 | 0 | 0 | 0 | 0 | 1 | 1 | 0 | 0 |
| Binary (Not Corrected) | B2 | 0 | 0 | 0 | 0 | 1 | 1 | 1 | 1 | 1 | 1 | 0 | 0 |
| | B1 | 0 | 0 | 1 | 1 | 0 | 0 | 1 | 1 | 1 | 0 | 1 | 0 |
| | B0 | 0 | 1 | 0 | 1 | 0 | 1 | 0 | 1 | 0 | 1 | 0 | 1 |
| Decimal (Not Corrected) | | 0 | 1 | 2 | 3 | 4 | 5 | 6 | 7 | 6 | 5 | 2 | 1 |
| Gray (Corrected) | g2Z | 0 | 0 | 0 | 0 | 1 | 1 | 1 | 1 | 0 | 0 | 1 | 1 |
| | g1Z | 0 | 0 | 1 | 1 | 1 | 1 | 0 | 0 | 0 | 1 | 1 | 0 |
| | g0Z | 0 | 1 | 1 | 0 | 0 | 1 | 1 | 0 | 0 | 0 | 0 | 0 |
| Binary (Corrected) | B2Z | 0 | 0 | 0 | 0 | 1 | 1 | 1 | 1 | 0 | 0 | 1 | 1 |
| | B1Z | 0 | 0 | 1 | 1 | 0 | 0 | 1 | 1 | 0 | 1 | 0 | 1 |
| | B0Z | 0 | 1 | 0 | 1 | 0 | 1 | 0 | 1 | 0 | 1 | 0 | 1 |
| Decimal (Corrected) | | 0 | 1 | 2 | 3 | 4 | 5 | 6 | 7 | 0 | 3 | 4 | 7 |

| Comment | In Normal Operation | In Error |
|---|---|---|
| | Error detectable area / Error detectable area / / Error detectable area / Error detectable area | Invert G2 and any error bit |

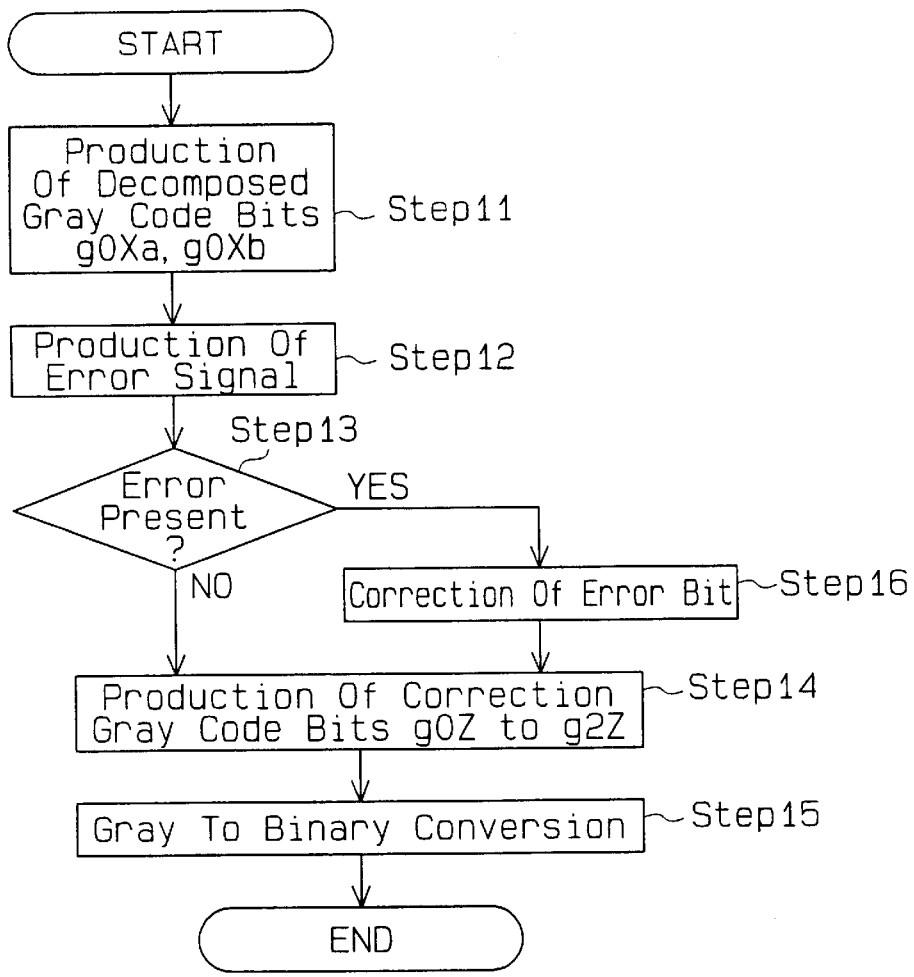

Fig.51

| | | | | | | | | | | | | | |
|---|---|---|---|---|---|---|---|---|---|---|---|---|---|
| Gray (Original Data) | G2 | 0 | 0 | 0 | 0 | 1 | 1 | 1 | 1 | 0 | 0 | 1 | 1 |
| | G1 | 0 | 0 | 1 | 1 | 1 | 1 | 0 | 0 | 1 | 0 | 0 | 1 |
| | g0a | 1 | 0 | 0 | 0 | 0 | 0 | 0 | 1 | 1 | 0 | 0 | 1 |
| | g0b | 0 | 0 | 0 | 1 | 1 | 0 | 0 | 0 | 0 | 1 | 1 | 0 |
| Error Detection | EXa | 0 | 0 | 0 | 0 | 0 | 0 | 0 | 0 | 1 | 0 | 0 | 1 |
| | EXb | 0 | 0 | 0 | 0 | 0 | 0 | 0 | 0 | 0 | 1 | 1 | 0 |
| Binary (Not Corrected) | B2 | 0 | 0 | 0 | 0 | 1 | 1 | 1 | 1 | 0 | 0 | 1 | 1 |
| | B1 | 0 | 0 | 1 | 1 | 0 | 0 | 1 | 1 | 1 | 0 | 1 | 0 |
| | B0 | 0 | 1 | 0 | 1 | 0 | 1 | 0 | 1 | 1 | 0 | 1 | 1 |
| Decimal (Not Corrected) | | 0 | 1 | 2 | 3 | 4 | 5 | 6 | 7 | 3 | 0 | 7 | 4 |
| Gray (Corrected) | g2Z | 0 | 0 | 0 | 0 | 1 | 1 | 1 | 1 | 0 | 0 | 1 | 1 |
| | g1Z | 0 | 0 | 1 | 1 | 1 | 1 | 0 | 0 | 0 | 1 | 1 | 0 |
| | g0Z | 0 | 1 | 1 | 0 | 0 | 1 | 1 | 0 | 1 | 1 | 1 | 1 |
| Binary (Corrected) | B2Z | 0 | 0 | 0 | 0 | 1 | 1 | 1 | 1 | 0 | 0 | 1 | 1 |
| | B1Z | 0 | 0 | 1 | 1 | 0 | 0 | 1 | 1 | 0 | 1 | 0 | 1 |
| | B0Z | 0 | 1 | 0 | 1 | 0 | 1 | 0 | 1 | 1 | 0 | 1 | 0 |
| Decimal (Corrected) | | 0 | 1 | 2 | 3 | 4 | 5 | 6 | 7 | 1 | 2 | 5 | 6 |
| Comment | | In Normal Operation | | | | | | | | In Error | | | |
| | | Error detectable area | | Error detectable area | Error detectable area | | | Error detectable area | | Invert G2 and any error bit | | | |

Fig.53

| Decimal | | 0 | 1 | 2 | 3 | 4 | 5 | 6 | 7 |
|---|---|---|---|---|---|---|---|---|---|
| Binary | B2 | 0 | 0 | 0 | 0 | 1 | 1 | 1 | 1 |
| | B1 | 0 | 0 | 1 | 1 | 0 | 0 | 1 | 1 |
| | B0 | 0 | 1 | 0 | 1 | 0 | 1 | 0 | 1 |
| Gray | G2 | 0 | 0 | 0 | 0 | 1 | 1 | 1 | 1 |
| | G1 | 0 | 0 | 1 | 1 | 1 | 1 | 0 | 0 |
| | g0a | 0 | 0 | 0 | 0 | 0 | 1 | 1 | 0 |
| | g0b | 0 | 1 | 1 | 0 | 0 | 0 | 0 | 0 |
| | g0Xa | 1 | 0 | 0 | 0 | 0 | 0 | 0 | 1 |
| | g0Xb | 0 | 0 | 0 | 1 | 1 | 0 | 0 | 0 |

Fig.54

| | | | | | | | | | | | | | | | | | |
|---|---|---|---|---|---|---|---|---|---|---|---|---|---|---|---|---|---|
| Gray (Original Data) | G2 | 0 | 0 | 0 | 0 | 1 | 1 | 1 | 1 | 0 | 1 | 1 | 0 | 1 | 0 | 0 | 1 |
| | G1 | 0 | 0 | 1 | 1 | 1 | 1 | 0 | 0 | 1 | 0 | 1 | 0 | 0 | 1 | 0 | 1 |
| | g0a | 0 | 0 | 0 | 0 | 0 | 1 | 1 | 0 | 0 | 0 | 0 | 0 | 0 | 1 | 1 | 0 |
| | g0b | 0 | 1 | 1 | 0 | 0 | 0 | 0 | 0 | 0 | 1 | 1 | 0 | 0 | 0 | 0 | 0 |
| | g0Xa | 1 | 0 | 0 | 0 | 0 | 0 | 0 | 1 | 1 | 0 | 0 | 0 | 0 | 0 | 0 | 1 |
| | g0Xb | 0 | 0 | 0 | 1 | 1 | 0 | 0 | 0 | 0 | 0 | 0 | 1 | 1 | 0 | 0 | 0 |
| Error Detection | Er | 0 | 0 | 0 | 0 | 0 | 0 | 0 | 0 | 0 | 1 | 1 | 0 | 0 | 1 | 1 | 0 |
| | ErX | 0 | 0 | 0 | 0 | 0 | 0 | 0 | 0 | 1 | 0 | 0 | 1 | 1 | 0 | 0 | 1 |
| Binary (Not Corrected) | B2 | 0 | 0 | 0 | 0 | 1 | 1 | 1 | 1 | 0 | 1 | 1 | 0 | 1 | 0 | 0 | 1 |
| | B1 | 0 | 0 | 1 | 1 | 0 | 0 | 1 | 1 | 1 | 1 | 0 | 0 | 1 | 1 | 0 | 0 |
| | B0 | 0 | 1 | 0 | 1 | 0 | 1 | 0 | 1 | 1 | 0 | 1 | 0 | 1 | 0 | 1 | 0 |
| Decimal (Not Corrected) | | 0 | 1 | 2 | 3 | 4 | 5 | 6 | 7 | 3 | 6 | 5 | 0 | 7 | 2 | 1 | 4 |
| Gray (Corrected) | g2Z | 0 | 0 | 0 | 0 | 1 | 1 | 1 | 1 | 0 | 0 | 0 | 0 | 1 | 1 | 1 | 1 |
| | g1Z | 0 | 0 | 1 | 1 | 1 | 1 | 0 | 0 | 0 | 0 | 1 | 1 | 1 | 1 | 0 | 0 |
| | g0Z | 0 | 1 | 1 | 0 | 0 | 1 | 1 | 0 | 1 | 0 | 0 | 1 | 1 | 0 | 0 | 1 |
| Binary (Corrected) | B2Z | 0 | 0 | 0 | 0 | 1 | 1 | 1 | 1 | 0 | 0 | 0 | 0 | 1 | 1 | 1 | 1 |
| | B1Z | 0 | 0 | 1 | 1 | 0 | 0 | 1 | 1 | 0 | 0 | 1 | 1 | 0 | 0 | 1 | 1 |
| | B0Z | 0 | 1 | 0 | 1 | 0 | 1 | 0 | 1 | 1 | 0 | 1 | 0 | 1 | 0 | 1 | 0 |
| Decimal (Corrected) | | 0 | 1 | 2 | 3 | 4 | 5 | 6 | 7 | 1 | 0 | 3 | 2 | 5 | 4 | 7 | 6 |
| Comment | | In Normal Operation (Error detectable area) | | | | | | | | In Error — Invert G1 and any error bit | | | | | | | |

ANALOG TO DIGITAL CONVERTER WITH ENCODER CIRCUIT AND TESTING METHOD THEREFOR

This application is a divisional of application Ser. No. 09/034,219, filed Mar. 4, 1998, now allowed.

BACKGROUND OF THE INVENTION

The present invention relates to an analog to digital (A/D) converter, and, more particularly, to an A/D converter including an encoder.

A/D converters are often used with microprocessors to convert an analog signal to a corresponding digital signal which is processed by the microprocessor. Due to the increased speed of microprocessors, for example, from 50 MHZ to 300 MHZ, there is a need for faster A/D converters. A/D converters of the parallel type and the serial and parallel type are advantageous for high speed operation. Such A/D converters generally comprise a plurality of comparators for comparing an analog input signal with analog reference voltages and an encoder for converting output signals of the comparators to a multibit digital signal. The speed and accuracy of the A/D converter can be improved by increasing the speed and accuracy of the encoder.

A conventional, parallel-type A/D converter comprises a comparator section, a logical boundary detection section for detecting a logical boundary of comparator output signals and an encoder section. The encoder section often includes a wired-OR type ROM. Referring to FIG. 1, a first example of a conventional parallel-type A/D converter which outputs a five (5) bit digital signal is shown. The A/D converter comprises a comparator section 1 having comparators CM1 to CM31 and associated resistors R, a logical boundary detection section 2 having NOR circuits DE0 to DE31, and an encoder section 3a having ROM cells 4.

Between a high potential side reference voltage $V_{RH}$ and a low potential side reference voltage $V_{RL}$, thirty two resistors are connected in series. The two resistors R positioned on opposite ends of the series connection have a resistance value equal to half that of the other resistors R. A junction between each adjacent one of the resistors R is connected to a first input terminal of a corresponding one of 31 comparators CM1 to CM31. A voltage difference between the reference voltages $V_{RH}$ and $V_{RL}$ is divided by the resistors R, and reference voltages $V_{R1}$ to $V_{R31}$ obtained by the division are input to the comparators CM1 to CM31, respectively. An analog input signal Ain is input to second terminals of the comparators CM1 to CM31. The comparators CM1 to CM31 compare the analog input signal Ain with the reference voltages $V_{R1}$ to $VR_{31}$, in response to a control signal output from a control circuit (not shown).

Each of the comparators CM1 to CM31 outputs an output signal S1 to S31 high and an output signal /S1 to /S31 low when the potential of the analog input signal Ain is lower than the reference voltage $V_{R1}$ to $V_{R31}$. On the other hand, when the potential of the analog input signal Ain is higher than the reference voltage $V_{R1}$ to $V_{R31}$, each of the comparators CM1 to CM31 outputs an output signal S1 to S31 low and an output signal /S1 to /S31 high.

For example, if the potential of the analog input signal Ain is higher than the reference voltage $V_{R4}$ but lower than the reference voltage $V_{R5}$, then the comparators CM1 to CM4 output thermometer code bits wherein the output signals S1 to S4 have L levels and the output signals /S1 to /S4 have H levels. Meanwhile, the comparators CM5 to CM31 output thermometer code bits wherein the output signals S5 to S31 have H levels and the output signals /S5 to /S31 have L levels.

Each of the output signals S1 to S31 of the comparators CM1 to CM31 is input to a first terminal of a corresponding one of the NOR circuits DE1 to DE31 while each of the output signals /S1 to /S31 of the comparators CM1 to CM31 is input to a second input terminal of a corresponding one of the NOR circuits DE0 to DE30. Further, one of a pair of terminals of each of the NOR circuits DE0 and DE31 is connected to the ground GND. Each of the NOR circuits DE0 to DE31 outputs a signal high if both of the input signals thereto have L levels, and only one of the NOR circuits DE0 to DE31 outputs a signal high by operation of the comparators CM1 to CM31. The output signals of the NOR circuits DE0 to DE31 are output to word lines WL0 to WL31, respectively.

The encoder section 3a includes five bit lines BL0 to BL4 corresponding to a 5-bit digital output signal B0 to B4. ROM cells 4 for outputting the output signal B0 to B4 in the form of a binary code are connected at predetermined locations between the word lines WL0 to WL31 and the bit lines BL0 to BL4. Each of the ROM cells 4 comprises an N-channel MOS transistor, shown in FIG. 2. The gate of the transistor is connected to one of the word lines WL and the drain is connected to one of the bit lines BL while the source is connected to the ground GND.

The bit lines BL0 to BL4 are connected to a power supply $V_{DD}$ through switch circuits SW0 to SW4, respectively, such that, when the switch circuits SW0 to SW4 are closed, the bit lines BL0 to BL4 are precharged. Each of the switch circuits SW0 to SW4 preferably comprises a P-channel MOS transistor.

If the level of one of the word lines changes to an H level after the switch circuits SW0 to SW4 are opened, then ROM cells connected to the activated word line are turned on and the levels of the bit lines which are connected to the ROM cells are changed to an L level. For example, if the level of the word line WL0 is changed to an H level, then the output signals B0 to B4 are "00000"; and if the level of the word line WL2 is changed to an H level, then the output signals B0 to B4 are "01000".

Since the encoder section 3a employs a ROM circuit which requires a precharging operation, the operation speed of the comparator section 1 is lower than the operation speed of the encoder section 3a. Accordingly, the conversion speed is determined by the comparator section 1.

The output signals of the comparator section 1 in normal operation either are a thermometer code which exhibits only one logical boundary or exhibit the same logic value. However, a babble error sometimes occurs with a thermometer code. The babble error which occurs probabilistically most frequently is reversal of one output logic value in the output signals /S1 to /S31 of the comparators CM1 to CM31. If such a babble error is input to the NOR circuits DE0 to DE31, then two word lines exhibit H levels simultaneously, and an incorrect output signal B0 to B4 is output.

Particularly, the encoder section 3a constructed to output a binary code, sometimes has a large error due to a babble error. In particular, if the word lines WL14 and WL16 shown in FIG. 3 exhibit H levels simultaneously due to a babble error, then the output signal B0 to B4 are all zero and a large error occurs with the output signal B0 to B4.

In order to solve such a problem, an A/D converter having a modified logical boundary detection section 2, as shown in FIG. 4, has been proposed. Referring to FIG. 4, the A/D converter is constructed such that the NOR circuits DE0 to DE31 have 3-input terminals. If an nth NOR circuit is represented as NOR circuit DEn, an output signal Sn of the comparators CMn and output signals /S(n+1) and /S(n+2) of two higher order comparators CM(n+1) and CM(n+2) are input to the NOR circuit DEn. When a babble error (a different logic value is included in a thermometer code) occurs, the babble error location is not discriminated as a logical boundary, and only one of the word lines WL exhibits H levels and an output signals B0 to B4 having correct values or values near to correct values are output.

However, even where the NOR circuits DE0 to DE31 have 3-inputs, if, for example, such a babble error that an output logic value spaced by a two or more logic value distance is reversed, then two word lines spaced by a two word line distance exhibit an H level simultaneously. If, for example, the word lines WL14 and WL17 shown in FIG. 3 simultaneously exhibit H levels, then the output signals B0 to B4 are all zero, which is a large error.

In order to solve the disadvantage, an A/D converter which includes an encoding section 3b which outputs a Gray code (reflected binary code) in place of a binary code has been proposed.

Referring to FIG. 5, the encoding section 3b is different from the encoder section 3a which outputs a binary code in terms of the positions of the ROM cells 4. That is, the encoding section 3b outputs signals G0 to G4 of a Gray code wherein one of the word lines WL exhibits an H level. Where a thermometer code is recognized as a decimal number (Decimal), a corresponding relationship between the output signals B0 to B4 of a binary code (Binary) and the output signals G0 to G4 of a Gray code (Gray) corresponding to a thermometer code is illustrated in FIG. 9. The output signals G0 to G4 are output to a next stage circuit through a conversion circuit which converts a Gray code into a binary code.

In such an A/D converter, even if a babble error is output from the comparator section 1 and the logical boundary detection section 2 outputs an H level, for example, to the word lines WL14 and WL17 in FIG. 6 simultaneously, the encoding section 3b outputs the output signals G0 to G4 same as that only when the word line WL14 exhibits an H level. Accordingly, even if a most likely value is provided when the word line WL15 or the word line WL16 exhibits an H level, the encoder section 3b does not output signals having large errors.

Thus, if a babble error occurs with an output signal of the comparator section 1, an error is suppressed, as shown in FIGS. 12 to 14.

FIG. 12 illustrates operation when a babble error ". . . 11101000. . . " (type b1), wherein an output logic value of a thermometer code spaced by a one logic value distance is reversed, is input to the logical boundary detection section 2 having 2-input NOR circuits, and output signals of the logical boundary detection section 2 are converted into a Gray code by the encoding section 3b. The abscissa indicates a decimal value of a normal thermometer code while the ordinate is a value obtained by converting an output signal of a Gray code output from the encoding section 3b to a decimal number.

FIG. 13 illustrates operation when a babble error ". . . 111001000. . . " (type b2H), wherein an output logic value of a thermometer code spaced by a two logic value distance is reversed, is input to the logical boundary detection section 2 having 3-input NOR circuits, and output signals of the logical boundary detection section 2 are converted into a Gray code by the encoding section 3b. The abscissa and the ordinate are the same as FIG. 12.

FIG. 14 illustrates operation when a babble error ". . . 111011000. . . " (type b2L), wherein an output logic value of "1" of a thermometer code spaced by a two logic value distance is reversed to "0", is input to the logical boundary detection section 2 having 3-input NOR circuits, and output signals of the logical boundary detection section 2 are converted into a Gray code by the encoding section 3b. The abscissa and the ordinate are the same as FIG. 12.

Since the encoding section which outputs a Gray code suppresses an error, as opposed to the encoding section which outputs a binary code, it is advantageous. However, conversion circuit for converting a Gray code to a binary code is required. However, an error is still generated with respect to a value which is considered to be most likely.

Accordingly, yet another A/D converter has been proposed wherein logical processing by a majority decision circuit is performed for a thermometer code output from the comparator section. However, employment of the majority decision circuit increases the circuit scale of the A/D converter. Therefore, in order to suppress an increase in circuit scale, it has been proposed to form the majority decision circuit from an analog circuit (J. van de Valburg and R. J. van de Plassche, "An 8-bit 650-MHZ folding ADC", *IEEE Journal of Solid-State Circuits,* Vol. 27, pp.1662–1666, December 1992). However, even an analog majority decision circuit does not exhibit a sufficient effect against a babble error of the type b2H or the type b2L wherein an output logic value spaced by a two logic value distance is inverted.

An A/D converter having an irregular decoding logic for the logic boundary detection section is also been proposed, so that, even if a babble error occurs, a most likely digital output signal is output (C. W. Mangelsdorf, "A 400-MHZ Input Flash Converter with Error Correction", *Journal of Solid-State Circuits,* Vol. 25, pp.184–191, February 1990). Another A/D converter wherein logical boundary detection is performed for upper bits and lower bits into which the thermometer code is divided instead of performing logical boundary detection between adjacent outputs of a thermometer code (Y. Gendai et al., "An 8b 500-MHZ ADC", *Digest of International Solid-State Circuit Conference,* TPM 10.5, pp.29–35, February 1991), has been proposed, and a further A/D converter wherein the logical boundary detection section performs logical comparison of a thermometer code for every other bit to suppress production of a babble error (A. Matsuzawa et al., "An 8b 600-MHZ Flash A/D with multistage duplex gray coding", *Symp. VLSI Circ. Dig. Tech. Papers,* pp.37–42, May 1991) has been proposed. These A/D converters eliminate or correct a babble error produced in a thermometer code by the logical boundary detection section.

In contrast, an A/D converter of the twin encoder type is available wherein a babble error is corrected by the encoder section. In the A/D converter, an average of output signals of an encoder comprising P-channel MOS transistors and another encoder comprising N-channel MOS transistors is calculated (M. Ito et al., "A 10-bit 20 MS/s 3 V Supply CMOS AD Converter", 1994 *Journal of Solid-State Circuits,* Vol. 25, pp.1531–1536, February 1990). However, using the design, the circuit scale of the encoder is doubled.

Also an A/D converter having a reduced number of logic stages of a conversion circuit for converting a Gray code into a binary code is available, in which an encoder outputs a Quasi Gray code so that the operation speed of the encoder is improved (Y. Akazawa, "A 400 MSPS 8b Flash A/D Conversion LSI", *ISSCC Digest of Technical Papers,* pp.98–99, February 1987).

The encoding sections of the A/D converters of the parallel type are all constructed in the form of a ROM using wired OR gates. In this construction, a precharging operation is required for each operation cycle, and the precharging operation requires approximately half of one cycle. Thus, the precharge time requirement makes it difficult to improve the operation speed of the encoding section.

Further, since the encoding section does not function to correct an error caused by a babble error which occurs in a thermometer code, correction of a babble error is performed principally by the logical boundary detection section. However, even if an encoding section which outputs a Gray code which has a comparatively low degree in error is used, an error of an output signal by a babble error is not fully removed.

High speed A/D converters having conversion speeds exceeding 10 MS/s (Mega Sample/sec) are used not only for image processing, but recently, for data reading apparatus, such as a hard disk drive, and also for high speed data communication devices using QPSK (Quadrature Phase Shift Keying) or QAM (Quadrature Amplitude Modulation). Accordingly, conversion speeds exceeding 100 MS/s and an error rate exceeding $10^{-10}$ are required. Consequently, a performing test of an A/D converter which operates at a high speed must performed with certainty.

An A/D converter is performance tested by connecting the A/D converter to a testing apparatus. Then, a clock signal and an analog input signal are input from the testing apparatus to the A/D converter. The A/D converter samples the analog input signal in response to the clock signal, converts the sampled analog signal into a digital signal and outputs the digital signal to the testing apparatus. The testing apparatus evaluates the digital signal output from the A/D converter to determine whether it meets its performance specifications.

With an increase in operation speed of an A/D converter, an increase in frequency of a clock signal and an analog input signal input from the testing apparatus is required. In a performance test, the clock signal supplied from the testing apparatus is required to have a frequency two or three times as high as that in ordinary use, and the analog input signal is required to be input with a frequency higher than ¼ that of the clock signal.

Although, the testing apparatus can supply such a high frequency, it is difficult to produce a corresponding high speed analog signal. Also it is difficult to deliver a digital signal output in a high speed cycle from an A/D converter to a testing apparatus to evaluate it, such that present testing apparatus do not perform adequately.

It is a first object of the present invention to provide an encoder which has a function of correcting a babble error included in a thermometer code input thereto and also has an improved operation speed.

It is a second object of the present invention to provide a testing method which adequately performs a performance test of a high speed A/D converter.

SUMMARY OF THE INVENTION

Briefly stated, the present invention provides a semiconductor device including: an analog signal production circuit for receiving a sampling clock signal and producing an analog signal having a phase which varies successively with respect to the sampling clock signal; and an A/D converter for sampling the analog signal in accordance with the sampling clock signal to generate a digital signal. The A/D converter includes: a comparator section for receiving the analog signal and generating a corresponding thermometer code; an encoder section for receiving the thermometer code, detecting a logical boundary of the thermometer code, and producing a corresponding gray code digital signal therefrom; and a gray code to binary code conversion section for converting the gray code to a binary code.

The present invention provides an encoder for encoding a thermometer code including: an encoder circuit for detecting a logical boundary of the thermometer code to produce a Gray code signal, wherein the Gray code signal comprises a lower order bit and an upper order bit, and a particular relationship is set between the lower order bit and the upper order bit when the Gray code signal is error free; an error detector circuit, coupled to the encoder circuit, for detecting whether the particular relationship is satisfied and generating an error bit signal when the particular relationship is not satisfied; an error correction circuit, coupled to the encoder circuit and the error detector circuit, for correcting an error bit of the Gray code signal in response to the error bit signal and generating a corrected bit signal; and a Gray to binary converter circuit connected to the error correction circuit for converting the Gray code signal including the corrected bit signal into a binary code signal.

The present invention provides an encoder for encoding a thermometer code including: an encoder circuit for detecting a logical boundary of the thermometer code to produce a Gray code signal including an upper bit and decomposed lower order bits regarding a lower order bit of the Gray code, wherein a particular relationship is set between the upper bit and the decomposed lower order bits when the Gray code in error free; an error detector circuit, coupled to the encoder circuit, for detecting whether the particular relationship between the lower order and upper order bits is satisfied and generating an error bit signal when the particular relationship is not satisfied; and a Gray to binary converter circuit, coupled to the encoder circuit and the error detector circuit, for correcting an error bit of the Gray code signal in response to the error bit signal and converting the Gray code signal including corrected bit signal into a binary code signal.

The present invention provides a method of converting a Gray code to a binary code, the Gray code including a plurality of decomposed Gray code bits. The method includes the steps of: logically processing the plurality of decomposed Gray code bits to produce a plurality of binary code bits for one bit of the binary code; and logically processing the plurality of binary code bits to produce one bit of the binary code.

The present invention provides an apparatus for converting a Gray code to a binary code, the Gray code including decomposed Gray code bits. The apparatus includes: a first logic circuit for logically processing the plurality of decomposed Gray code bits to produce a plurality of binary code bits for one bit of the binary code; and a second logic circuit for logically processing the plurality of binary code bits to produce one bit of the binary code.

The present invention provide an A/D converter including: a plurality of comparators for receiving and comparing an analog input voltage with reference voltages different from each other and producing a thermometer code based upon the comparison results; a logical boundary detector, coupled to the comparators, for detecting a logical boundary of the thermometer code and outputting a logical boundary detection signal; and an encoder coupled to the logical boundary detector for receiving the logical boundary detection signal and generating a binary code signal. The encoder includes: an encoder circuit for receiving the logical boundary detection signal to produce a Gray code signal, wherein the Gray code signal comprises a lower order bit and an upper order bit, and a particular relationship is set between the lower order bit and the upper order bit when an error code bit is not included in the Gray code; an error detector circuit coupled to the encoder circuit for detecting whether the particular relationship between the lower order and upper order bits is set and generating an error bit signal when the particular relationship is not satisfied; an error correction circuit, coupled to the encoder circuit and the error detector circuit, for correcting an error bit of the Gray code signal in response to the error bit signal and generating a corrected bit signal; and a Gray to binary converter circuit for converting the Gray code signal including the corrected bit signal into a binary code signal.

The present invention provides an error correction method for an encoded signal including a thermometer code. The method includes the steps of: detecting a logical boundary of the thermometer code; producing, based on the detected logical boundary, a Gray code including a lower order bit and an upper order bit, wherein a particular relationship is set between the lower order bit and the upper order bit when an error code bit is not included in the Gray code; determining whether the particular relationship is satisfied; and correcting an error code bit included in the Gray code using a predetermined error code processing procedure when the particular relationship is not satisfied.

The present invention provides an error correction method for an encoded signal including a thermometer code. The method includes the steps of: detecting a logical boundary of the thermometer code; producing, based on the detected logical boundary, a Gray code including a lower order bit and an upper order bit; dividing the lower order bit into a front lower order bit of a logical target and a back lower order bit of a non-logical target; decomposing the front lower order bit into decomposed front lower order bits and decomposing the back lower order bit into decomposed back lower bits, so that a particular relationship is set between the decomposed front and back lower order bits and the upper order bit when an error code bit is not included in the Gray code; determining whether the particular relationship is satisfied; and correcting an error code bit included in the Gray code using a predetermined error code processing procedure when the particular relationship is not satisfied.

The present invention provides a recording medium having recorded thereon a computer readable program code for correcting an error code included in a Gray code. The Gray code includes a lower order bit and an upper order bit, which have a particular relationship set therebetween. The computer readable program performs the steps of: detecting whether the particular relationship is satisfied; and correcting an error code bit included in the Gray code when the particular relationship is not satisfied.

The present invention provides a recording medium having recorded thereon a computer readable program code for correcting an error code included in a Gray code. The Gray code has a lower order bit and an upper order bit. The lower order bit includes a logical target lower order bit and a non-logical target lower order bit. The computer readable program performs the steps of: decomposing at least one of the logical and non-logical target lower order bits to generate decomposed Gray code; comparing the decomposed Gray code with the upper order bit to detect an error code bit; and correcting the error code bit included in the Gray code.

The present invention provides a recording medium having recorded thereon a computer readable program code for correcting an error code included in a Gray code. The Gray code has a lower order bit and an upper order bit. The lower order bit includes a logical target lower order bit and a non-logical target lower order bit. The computer readable program performs the steps of: decomposing at least one of the logical and non-logical target lower order bits to generate decomposed lower order bits; comparing the decomposed lower order bits with the upper order bit to detect an error code bit; and correcting the error code bit included in the Gray code.

The present invention provides a recording medium having recorded thereon a computer readable program code for correcting an error code included in a Gray code. The Gray code has a lower order bit and an upper order bit. The lower order bit includes a logical target lower order bit and a non-logical target lower order bit. The computer readable program performs the steps of: decomposing at least one of the logical and non-logical target lower order bits to generate decomposed lower order bits; comparing the decomposed lower order bits with the upper order bit to detect an error code bit; correcting the error code bit included in the Gray code by inverting the error code bit; and converting the Gray code including the corrected code bit into a binary code.

The present invention provides a recording medium having recorded thereon a computer readable program code for detecting a logical boundary of a thermometer code. The computer readable program performs the steps of: inputting three or more every other bits of a thermometer code; and successively comparing the three or more every other bits of the thermometer code to detect the logical boundary of the thermometer code.

The present invention provides a testing method for an A/D converter including the steps of: detecting a logical boundary of a thermometer code to produce a Gray code including a lower order bit and an upper order bit which have a particular relationship; determining whether the particular relationship is satisfied; generating an error signal when the particular relationship is not satisfied; detecting whether an error code is included in the thermometer code based on the error signal.

The present invention provides a testing method for an A/D converter operating in accordance with a sampling clock signal. The method includes the steps of: producing an analog signal having a phase which varies successively with respect to the sampling clock signal; sampling the analog signal in accordance with the sampling clock signal to generate a digital signal using the A/D convertor; and evaluating the digital signal.

The present invention provides a testing method for an A/D converter operating in accordance with a sampling clock signal. The method includes the steps of: producing an analog signal having one of a DC level and amplitude which varies successively with respect to the sampling clock signal; sampling the analog signal in accordance with the sampling clock signal to generate a digital signal using the A/D converter; and evaluating the digital signal.

The present invention provides a testing method for an A/D converter converting an analog signal to a digital signal. The method includes the steps of: producing a sampling clock signal having a phase which varies successively with respect to the analog signal; sampling the analog signal in accordance with the sampling clock signal to generate the digital signal using the A/D converter; and evaluating the digital signal.

The present invention provides a testing method for an A/D converter including the steps of: producing a sampling clock signal having one of a DC level and amplitude which varies successively with respect to an analog signal; sampling the analog signal in accordance with the sampling clock signal to generate a digital signal using the A/D converter; and evaluating the digital signal.

The present invention provides a testing method for an A/D converter operating in accordance with a sampling clock signal. The method includes the steps of: producing an analog signal from the sampling clock signal; producing a comparison reference voltage which successively varies; providing the analog signal and the comparison reference voltage to the A/D converter; sampling the analog signal in accordance with the sampling clock signal to generate a digital signal based on the sampled analog signal and the comparison reference voltage using the A/D converter; and evaluating the digital signal.

The present invention provides a semiconductor device including: an analog signal production circuit for receiving a sampling clock signal and producing an analog signal having a phase which varies successively with respect to the sampling clock signal; and an A/D converter for sampling the analog signal in accordance with the sampling clock signal to generate a digital signal.

The present invention provides a semiconductor device including: an analog signal production circuit for receiving a sampling clock signal and producing an analog signal having one of a DC level and amplitude which varies successively with respect to the sampling clock signal; and an A/D converter for receiving the analog signal and sampling the analog signal in accordance with the sampling clock signal to generate a digital signal.

The present invention provides a semiconductor device including: a clock signal production circuit for receiving an analog signal and producing a sampling clock signal having a phase which varies successively with respect to the analog signal; and an A/D converter for receiving the analog signal and sampling the analog signal in accordance with the sampling clock signal to generate a digital signal.

The present invention provides a semiconductor device including: a clock signal production circuit for receiving an analog signal and producing a sampling clock signal having one of a DC level and amplitude which varies successively with respect to the analog signal; and an A/D converter for receiving the analog signal and sampling the analog signal in accordance with the sampling clock signal to generate a digital signal.

The present invention provides a semiconductor device including: an analog signal production circuit for receiving a sampling clock signal and producing an analog signal; a comparison reference voltage production circuit for producing a comparison reference voltage which successively varies; and an A/D converter for receiving the analog signal and the comparison reference voltage and sampling the analog signal in accordance with the sampling clock signal, the A/D converter further generating a digital signal based on the sampled analog signal and the comparison reference voltage.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings.

FIG. 9 is a diagrammatic view illustrating a relationship between a Gray code and a binary code;

FIG. 10 is a diagrammatic view illustrating a relationship between a Gray code and a binary code where a thermometer code including a babble error of the b1 type is encoded;

FIG. 11 is a diagrammatic view illustrating a relationship between a Gray code and a binary code when an error is corrected;

FIG. 48 is a diagrammatic view illustrating a code produced in a process of the first operation;

FIG. 49 is a flow chart illustrating a second operation of the third embodiment;

FIG. 50 is a diagrammatic view illustrating a decomposition Gray code of the second operation;

FIG. 51 is a diagrammatic view illustrating a code produced in a process of the second operation;

FIG. 53 is a diagrammatic view illustrating a decomposition Gray code of the third operation;

FIG. 54 is a diagrammatic view illustrating a code produced in a process of the third operation;

DETAILED DESCRIPTION OF THE PREFERRED EMBODIMENTS

Figure 9:
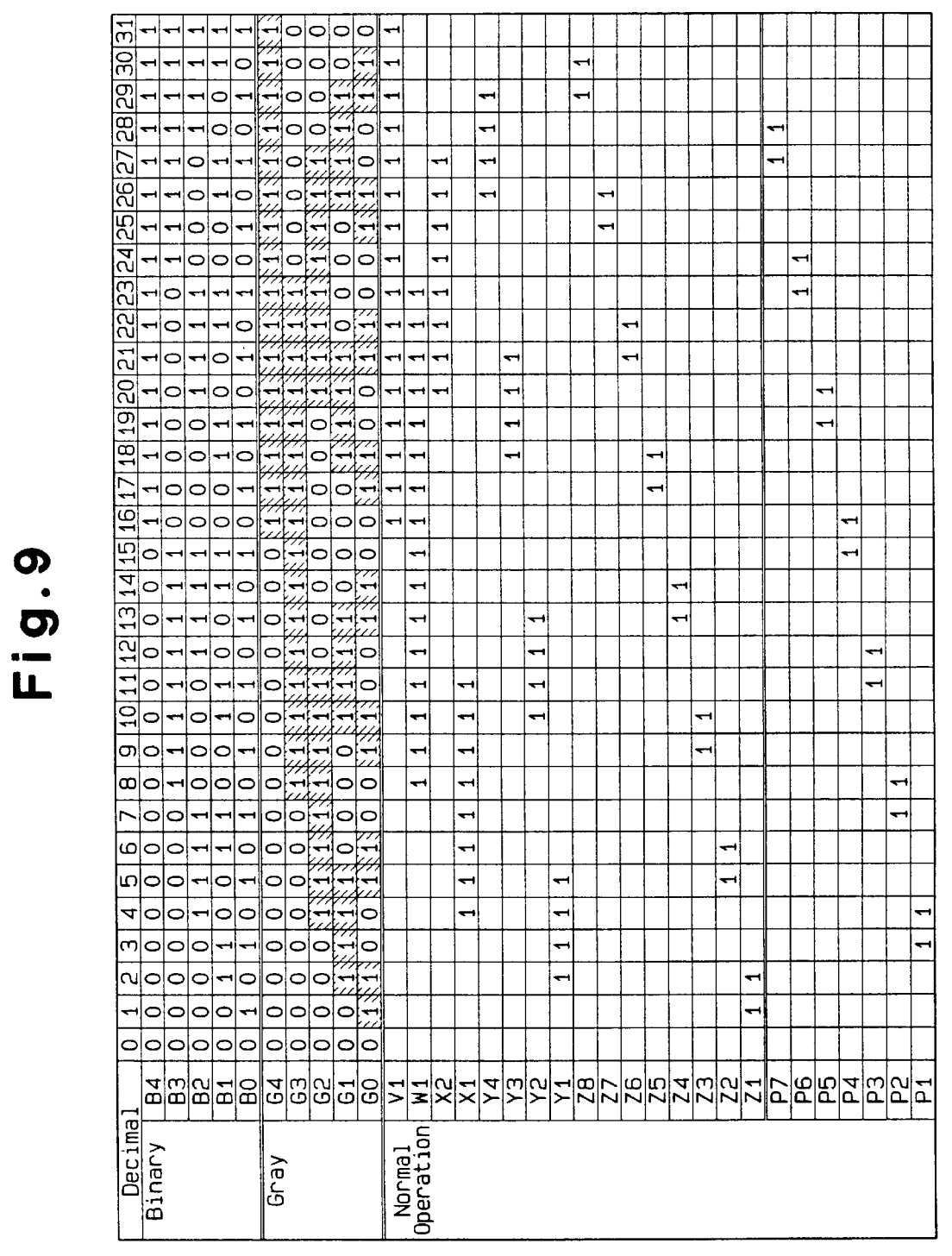

First, the principle of error correction in an encoder of the present invention is described. FIG. 9 illustrates code values when each decimal value (Decimal) is normally converted into a 5-bit binary code B0 to B4 and a 5-bit Gray code G0 to G4.

Figure 7:
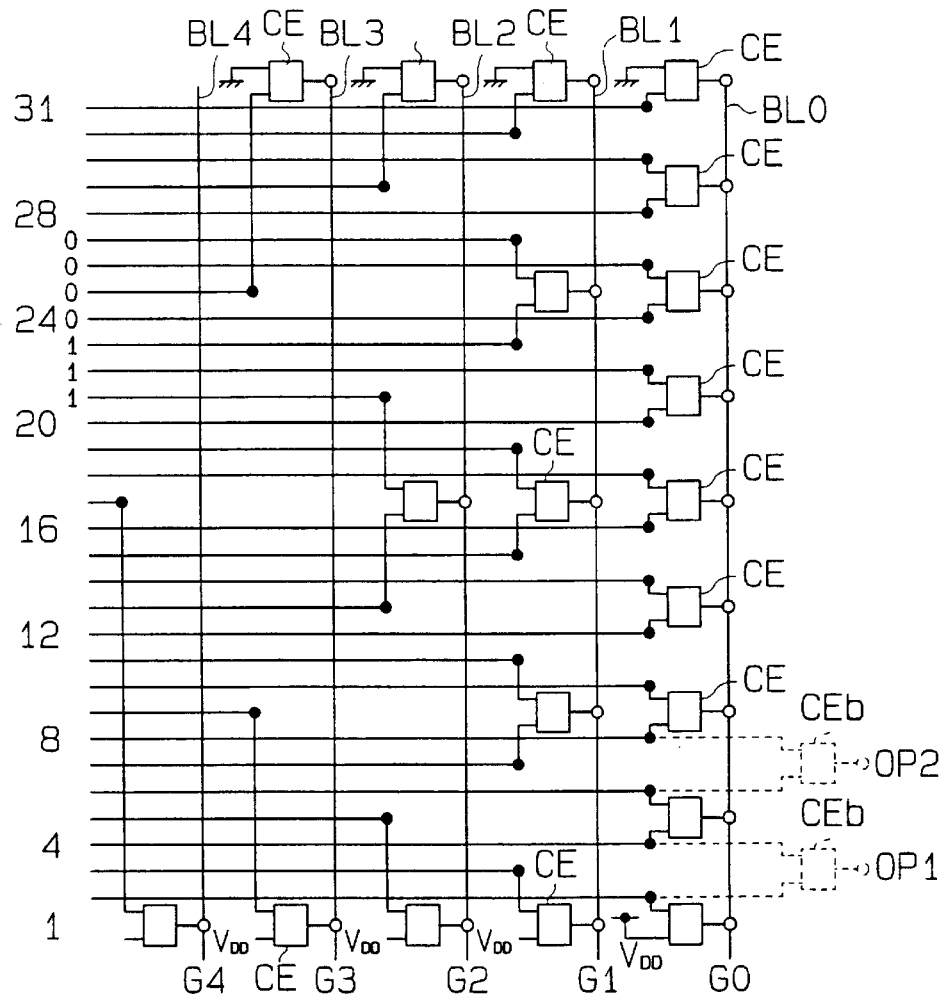
FIG. 7 is a circuit diagram of a prior art encoder which outputs a Gray code.
Figure 8:
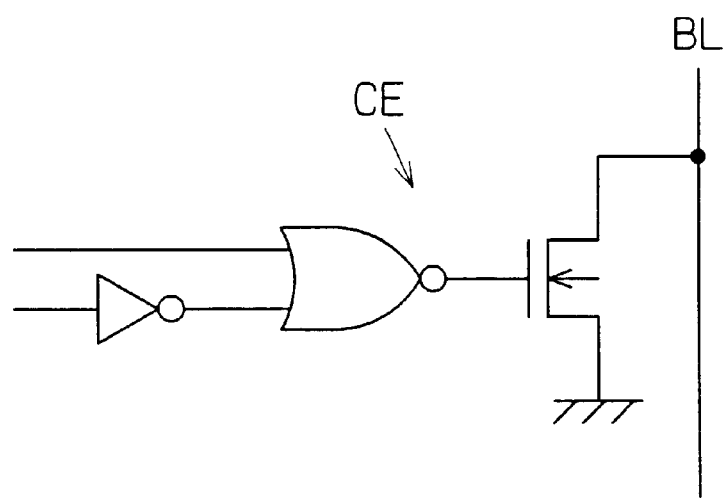
FIG. 8 is a circuit diagram of a logical boundary detection circuit and a ROM cell of the encoder of FIG. 7.
Figure 12:
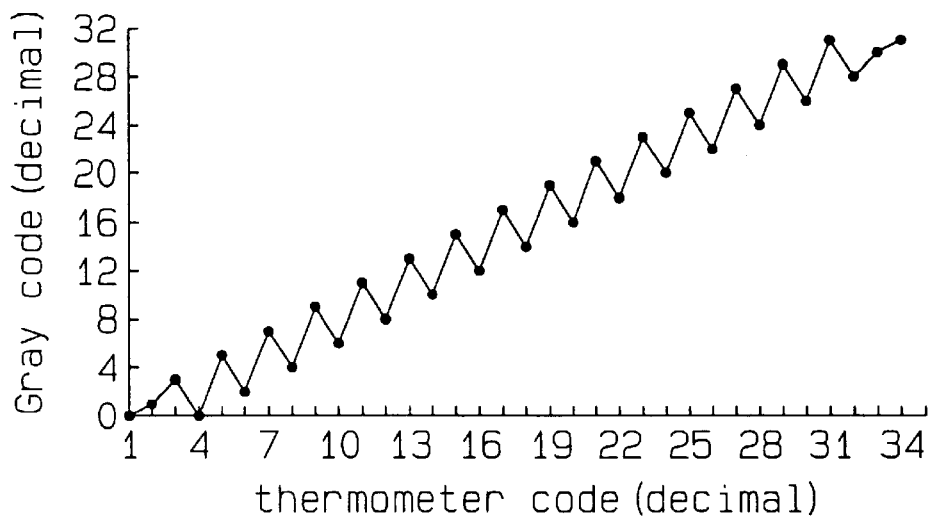
FIG. 12 is a diagram illustrating input/output values when a thermometer code including a babble error of the b1 type is encoded by a Gray code system.
Figure 13:
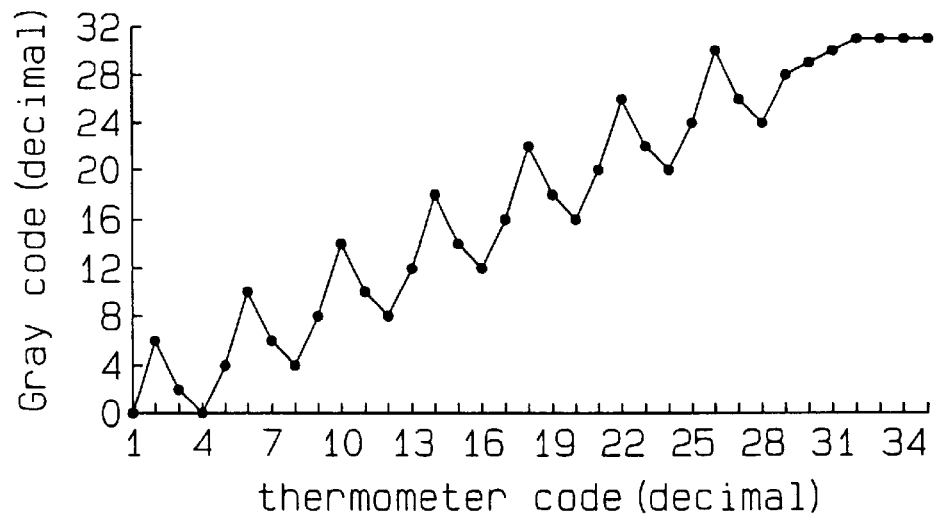
FIG. 13 is a diagram illustrating input/output values when a thermometer code including a babble error of the b2H type is encoded by a Gray code system.
Figure 14:
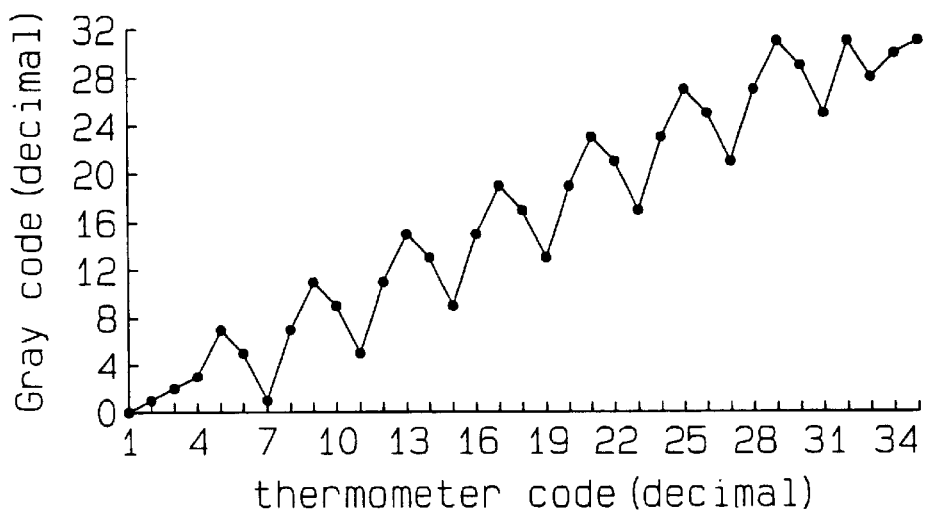
FIG. 14 is a diagram illustrating input/output values when a thermometer code including a babble error of the b2L type is encoded by a Gray code system.

The Gray code G0 to G4 is produced, for example, by an encoder of the bit independent decoding type, as shown in FIG. 7, which detects a logical boundary of a thermometer code as a decimal value in the form of a Gray code. A detailed design of a prior art ROM cell CE used with the encoder of FIG. 7 is illustrated in FIG. 8, in which the thermometer code changes its bits to "1" in order from the least significant bit.

Of the Gray code G0 to G4, G0 is the least significant bit and G4 is the most significant bit. The Gray code G0 to G4 is a reflected binary code wherein only one bit in codes corresponding to two adjacent decimal values exhibit inversion bits. B0 to B4 are a binary code corresponding to the Gray code G0 to G4. B0 is the least significant bit and B4 is the most significant bit.

In the prior art encoder shown in FIG. 7, the Gray code bits G0 to G4 are output from wired OR circuits comprising bit lines BL0 to BL4 provided in a one-by-one corresponding relationship thereto. For example, for bits G0 and G1, all of the combinations of "00", "10", "01" and "11" are present. Therefore, even if at least one of G0 and G1 is in error, presence or absence of the error cannot be detected from a combination of G0 and G1.

Bit G0 is produced by logically ORing output signals of nine ROM cells CE connected to the bit line BL0, and is decomposed into output signals Z1 to Z8 of the nine ROM cells CE (FIG. 9). If G1 and G2 are decomposed similarly, then G1=Y1+Y2+Y3+Y4 and G2=X1+X2. Then, G3=W1 and G4=V1.

Referring to FIG. 9, the relationship between X1 and Z2 is shown, such that when Z2=1, X1=1. Accordingly, when Z2=1, if X1=0, then an error is detected, signifying a thermometer code which includes a babble error. Similarly, when Z3=1, X1=1; when Z4=1, W1=1; when Z5=1, W1=V1=1; when Z6=1, X2=W1=V1=1; when Z7=1, X2=V1=1; and when Z8=1, V1=1. If any of the conditions just mentioned are not satisfied, then the presence of a babble error in the thermometer code can be detected.

Meanwhile, in codes corresponding, for example, to decimal values "3" and "4", Z1 to Z8 exhibit "0" simultaneously, and such a particular relationship cannot be determined. In other words, when Z1 to Z8 are on the target logic of "1", a particular relationship can be determined, but when Z1 to Z8 are on the non-target logic of "0", the particular relationship cannot be determined.

Therefore, in order to expand such a principle to the entire area of decimal values including the non-target logic, where Z1 to Z8 are regarded as a front code, a back code P1 to P7 to the front code Z1 to Z8 is set. As shown in FIG. 7, the back code P1 to P7 is a code output from ROM cells CEb connected between adjacent ROM cells CE connected to the bit line BL0 of the least significant bit. Accordingly, the back code P1 to P7 is a code generated using the ROM cells CEb by detecting a logic boundary of a thermometer code which is not detected by the ROM cells CE. From such a back code, when P1=1, Y1=1; when P2=1, X1=1; when P3=1, Y2=W1=1; when P4=1; W1=1; when P5=1, Y3=W1=V1=1; when P6=1, X2=V1=1; and when P7=1, Y4=V1=1. By setting a such front code and back code, the presence of a babble error can be detected over an entire area of thermometer codes.

Figure 10:
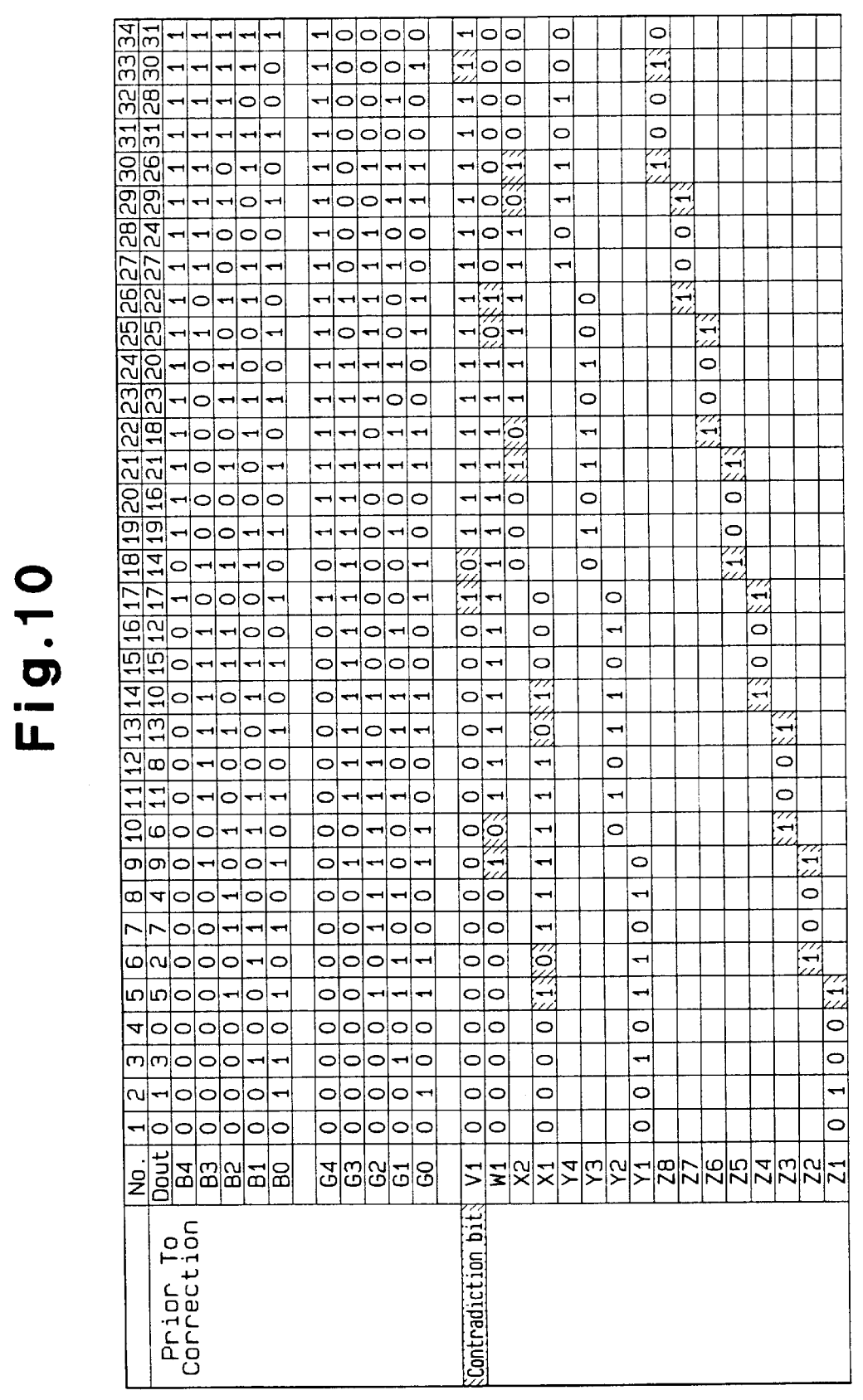
Figure 15:
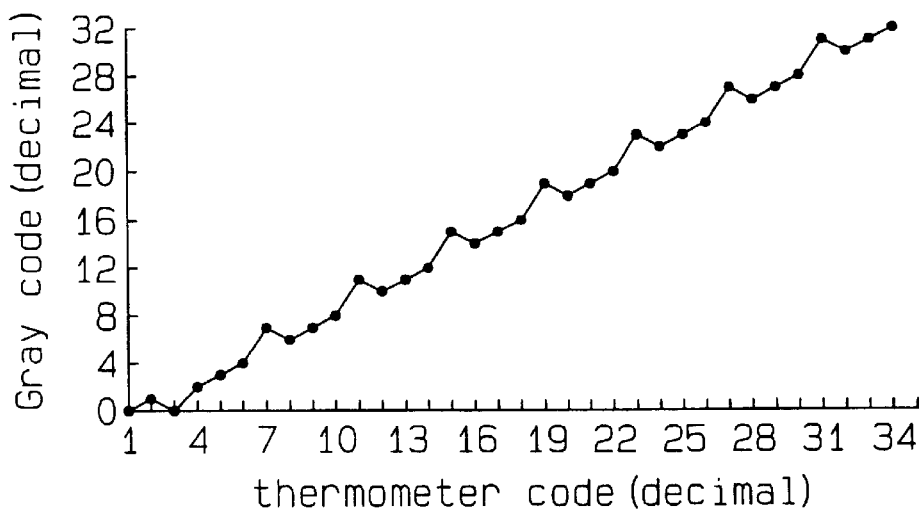
FIG. 15 is a diagram illustrating input/output values when a thermometer code including a babble error of the b1 type is corrected with a front code of a Gray code.

FIG. 10 illustrates values of codes including "... 110100...". That is, a babble error of the type b1, is included in thermometer codes corresponding to different decimal values. The values in the shaded boxes are values in which an error only from a front code of a Gray code is detected. Non-corrected Dout represents decimal values obtained by conversion of the encoder output whose error is not corrected. If the values in shaded boxes are inverted, then the detected errors are corrected to most likely values. The output of the encoder including such a correction is illustrated in FIG. 15. Referring to FIG. 15, the abscissa indicates an analog value input to the A/D converter, and the ordinate indicates an analog value obtained by conversion of the encoder output.

Figure 11:
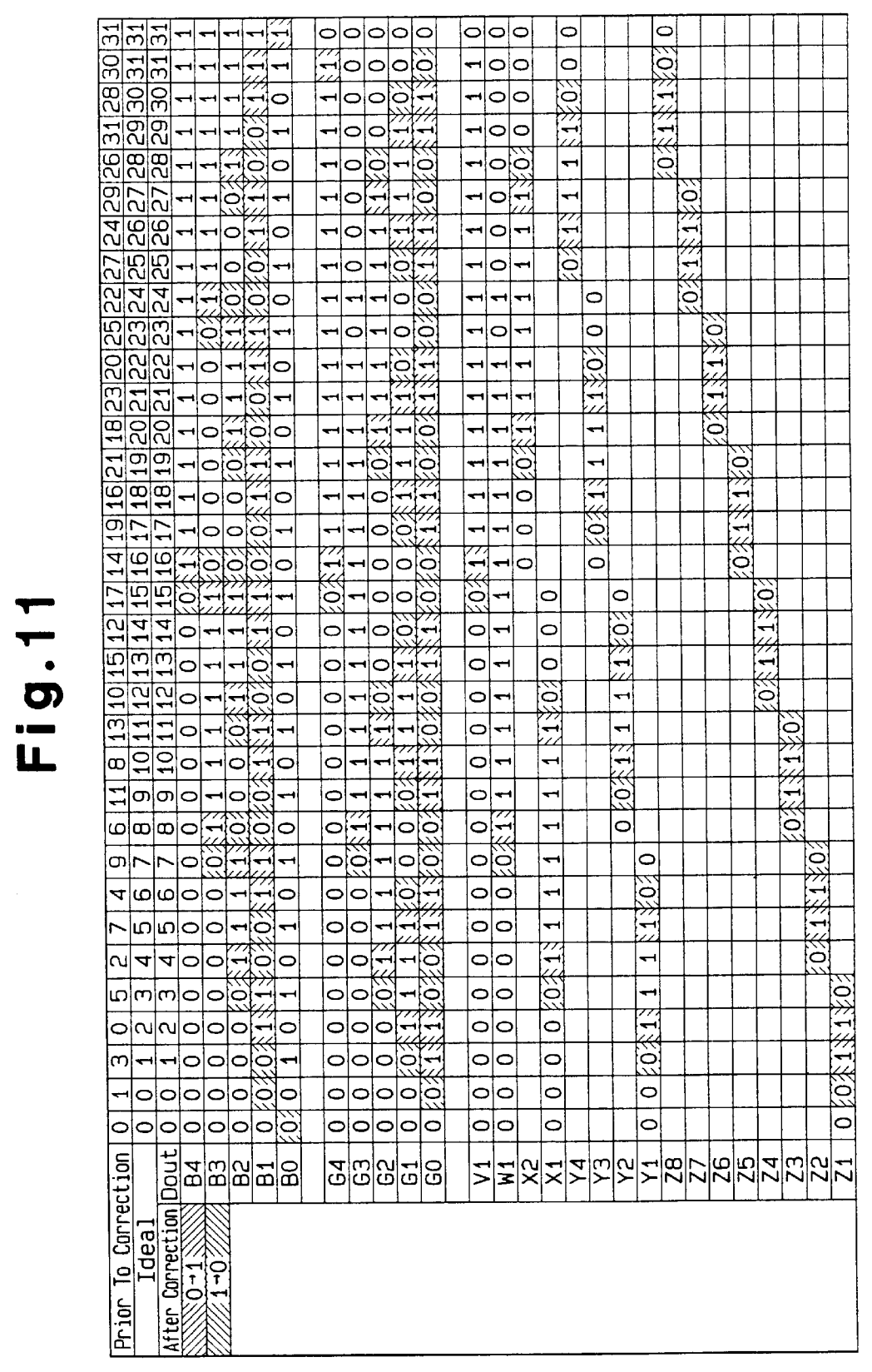
Figure 16:
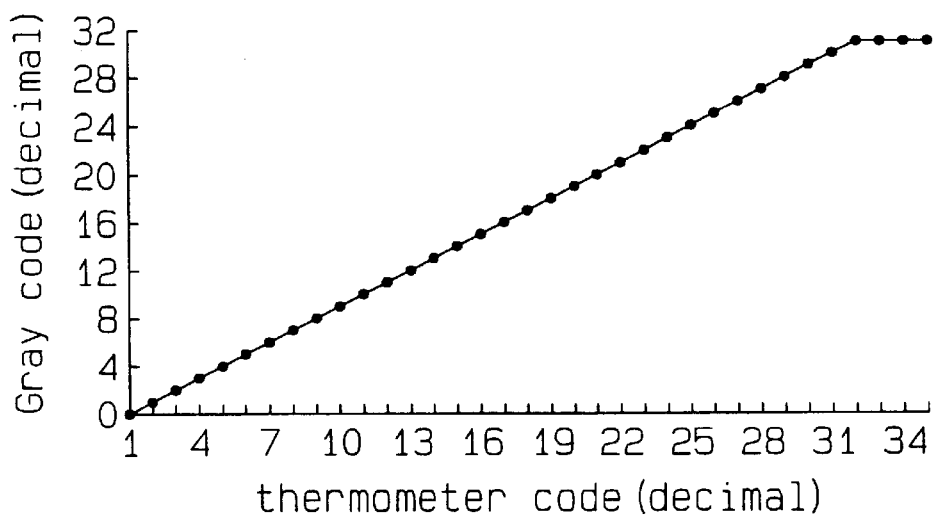
FIG. 16 is a diagram illustrating input/output values when a thermometer code including a babble error of the b1 type is corrected with a front code and a back code of a Gray code.

FIG. 11 illustrates corrected codes obtained by performing error correction for the codes illustrated in FIG. 10, using front codes and back codes and inverting the values. As a result, the Gray codes after the correction have most likely values and coincide with the correct Gray codes illustrated in FIG. 9. FIG. 16 illustrates the output of the encoder based on the codes after the correction illustrated in FIG. 11.

Figure 17:
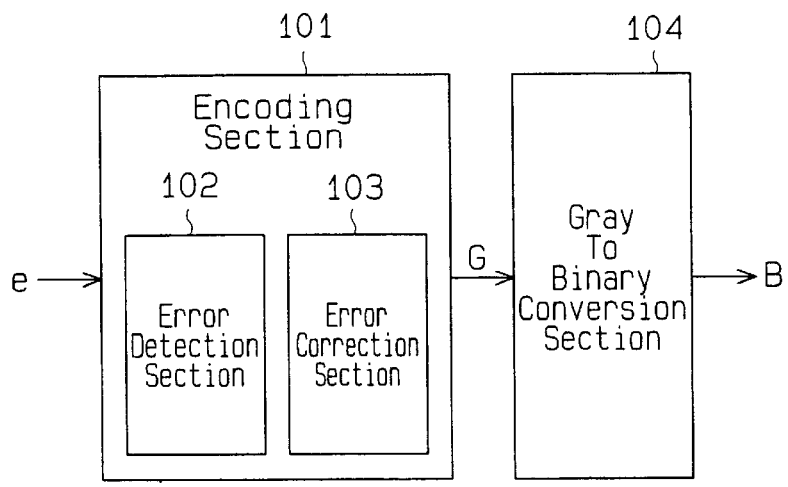
FIG. 17 is a block diagram of an encoder of the present invention.

FIG. 17 shows an outline of an encoder in accordance with the present invention. Referring to FIG. 17, an encoding section 101 detects a logic boundary of a thermometer code and produces a digital signal of a Gray code G. A Gray to binary conversion section 104 converts the Gray code G output from the encoding section 101 to a digital signal of a binary code B. The encoding section 101 includes an error detection section 102 for detecting whether or not values of upper order bits and lower order bits of the Gray code G have a particular relationship to detect an error code included in the Gray code G, and an error correction section 103 for correcting the error code detected by the error detection section 102.

Thus, the encoder functions to correct a babble error included in a thermometer code.

Figure 18:
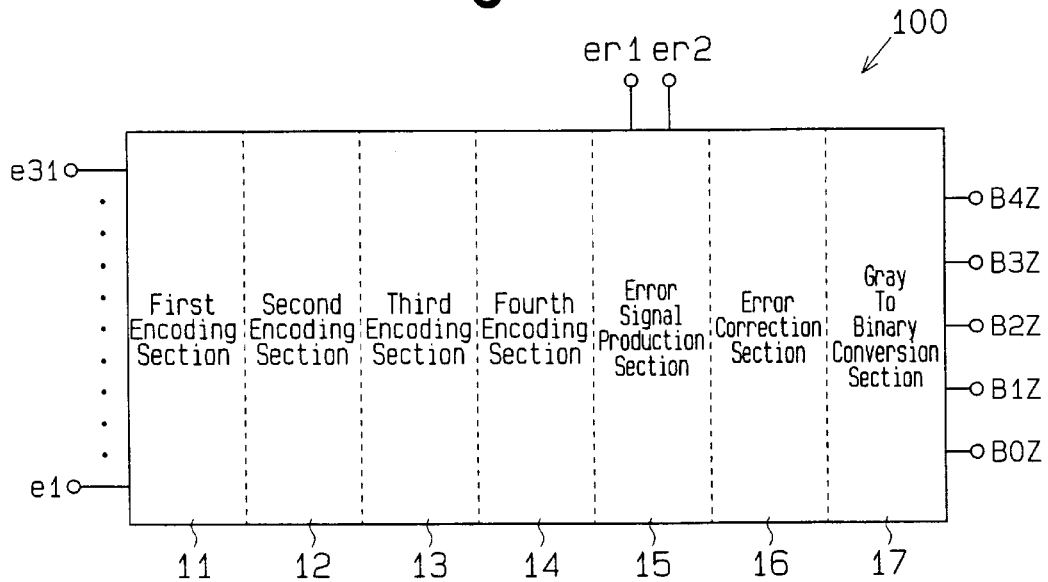
FIG. 18 is a more detailed block diagram showing a first embodiment of the present invention.

FIG. 18 shows a general construction of an encoder 100 according to the first embodiment which produces and outputs digital signals B0Z to B4Z of a 5-bit binary code based on an input of a thermometer code e1 to e31 output from a comparator section similar to that in the conventional examples.

The encoder 100 includes first to fourth encoding sections 11 to 14 for producing a 5-bit Gray code based on the thermometer code e1 to e31, an error signal production section 15 for detecting, based on the produced Gray code, whether or not a babble error is present in the thermometer code e1 to e31 and outputting, when a babble error is present, an error signal, an error correction section 16 for correcting the error in the Gray code in response to the error signal, and a Gray to binary conversion section 17 for producing a binary code B0Z to B4Z from the corrected Gray code.

Figure 19:
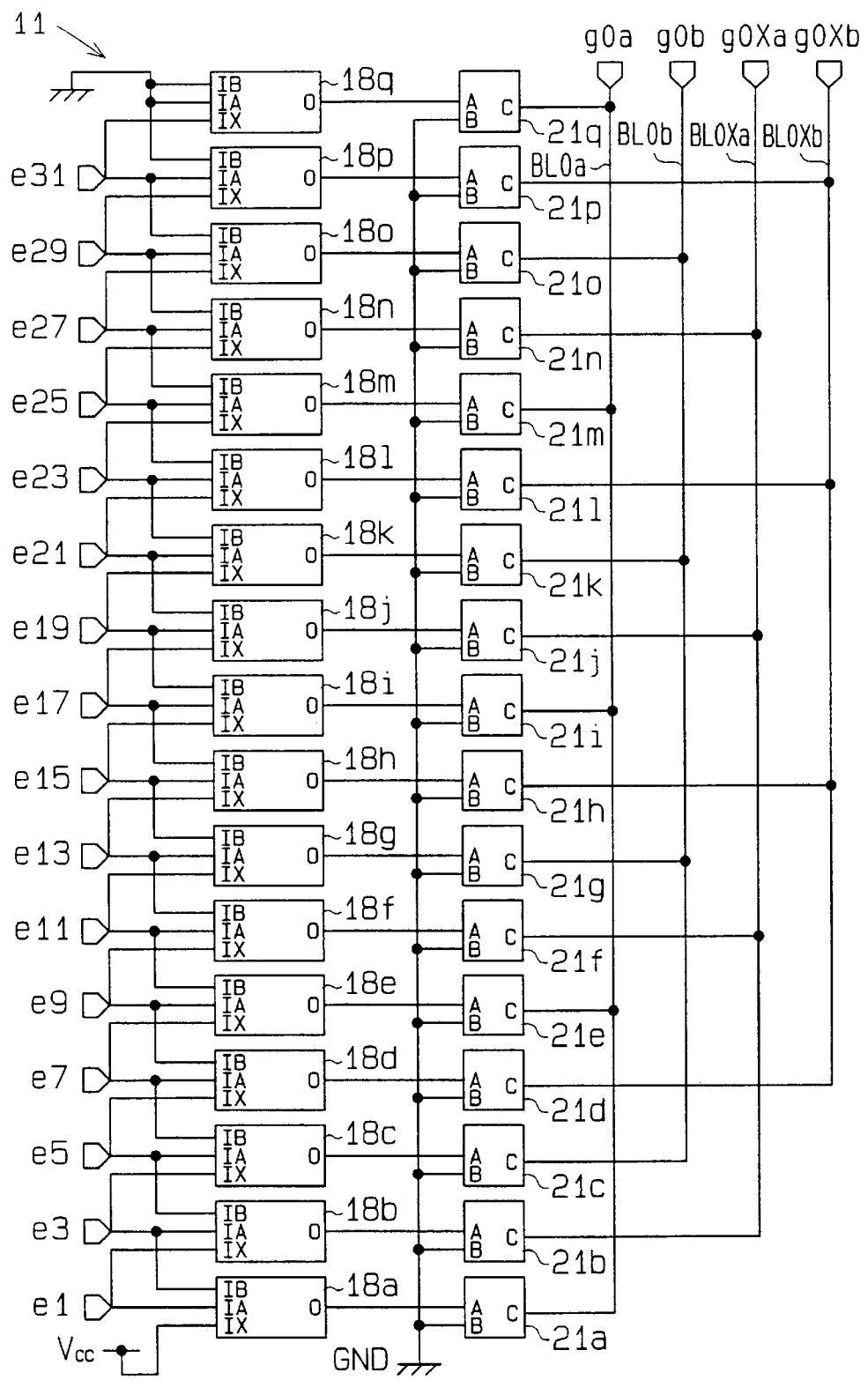
FIG. 19 is a circuit diagram showing a first encoding section of the first embodiment of the present invention.

A detailed construction of the first encoding section 11 is shown in FIG. 19. Referring to FIG. 19, each of seventeen logical boundary detection circuits 18a to 18q has three input terminals IB, IA and IX. To the input terminals IA of the logical boundary detection circuits 18a to 18p, the odd-numbered thermometer code bits e1, e3, . . . , e31 of the thermometer code e1 to e31 are input, respectively. Meanwhile, the ground GND level is input to the input terminals IA and IB of the highest order logical boundary detection circuit 18q. To the input terminals IX of the logical boundary detection circuits 18b to 18q, the odd-numbered thermometer code bits e1, e3, . . . , e31 are input. A power supply signal $V_{CC}$ is supplied to the input terminal IX of the lowest order logical boundary detection circuit 18a.

Figure 26:
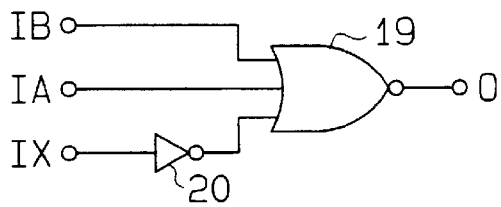
FIG. 26 is a circuit diagram showing a logical boundary detection circuit of the present invention.

A detailed construction of the logical boundary detection circuits 18a to 18p is shown in FIG. 26. Input terminals IB and IA are connected to a NOR circuit 19. The input terminal IX is connected to an inverter circuit 20, and an output terminal of the inverter circuit 20 is connected to the NOR circuit 19.

Referring again to FIG. 19, in each of the logical boundary detection circuits 18b to 18q, only when an L level is input to the input terminals IB and IA and an H level is input to the input terminal IX, an output signal O having an H level is output. The output signals O of the logical boundary detection circuits 18a to 18q are input to terminals A of ROM cells 21a to 21q, respectively. Terminals C of the ROM cells 21a to 21q are each connected to one of bit lines BL0a to BL0Xb. Terminals B of the ROM cells 21a to 21q are connected to the ground GND.

Figure 27:
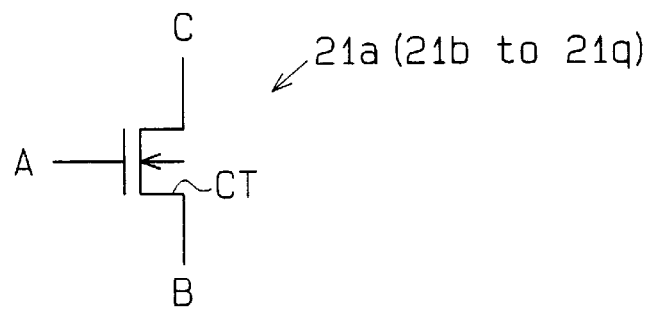
FIG. 27 is a circuit diagram showing a ROM cell of the present invention.

Each of the ROM cells 21a to 21q comprises an N-channel MOS transistor CT as shown in FIG. 27. The terminal A is connected to the gate of the N-channel MOS transistor CT, the terminal C is connected to the drain, and the terminal B is connected to the source. Accordingly, if any of the output signals O of the logical boundary detection circuits 18a to 18q has an H level, the N-channel MOS transistor CT of that one of the ROM cells 21a to 21q is turned on, and the Gray code bits G0a, g0b, g0Xa or g0Xb are output from the bit lines BL0a, BL0b, BL0Xa or BL0Xb. At this time, the bit lines BL0a, BL0b, BL0Xa or BL0Xb to which the one of the ROM cells 21a to 21q is connected has the ground GND level.

To the bit line BL0a, every fourth ROM cells 21e, 21i, 21m and 21q beginning with the ROM cell 21a at the lowest order are connected. To the bit line BL0b, every fourth ROM cells 21g, 21k and 21o beginning with the ROM cell 21c at the lowest order are connected. To the bit line BL0Xa, every fourth ROM cells 21f, 21j and 21n beginning with the ROM cell 21b at the lowest order are connected. To the bit line BL0Xb, every fourth ROM cells 21h, 21l and 21p beginning with the ROM cell 21d at the lowest order are connected.

Figure 20:
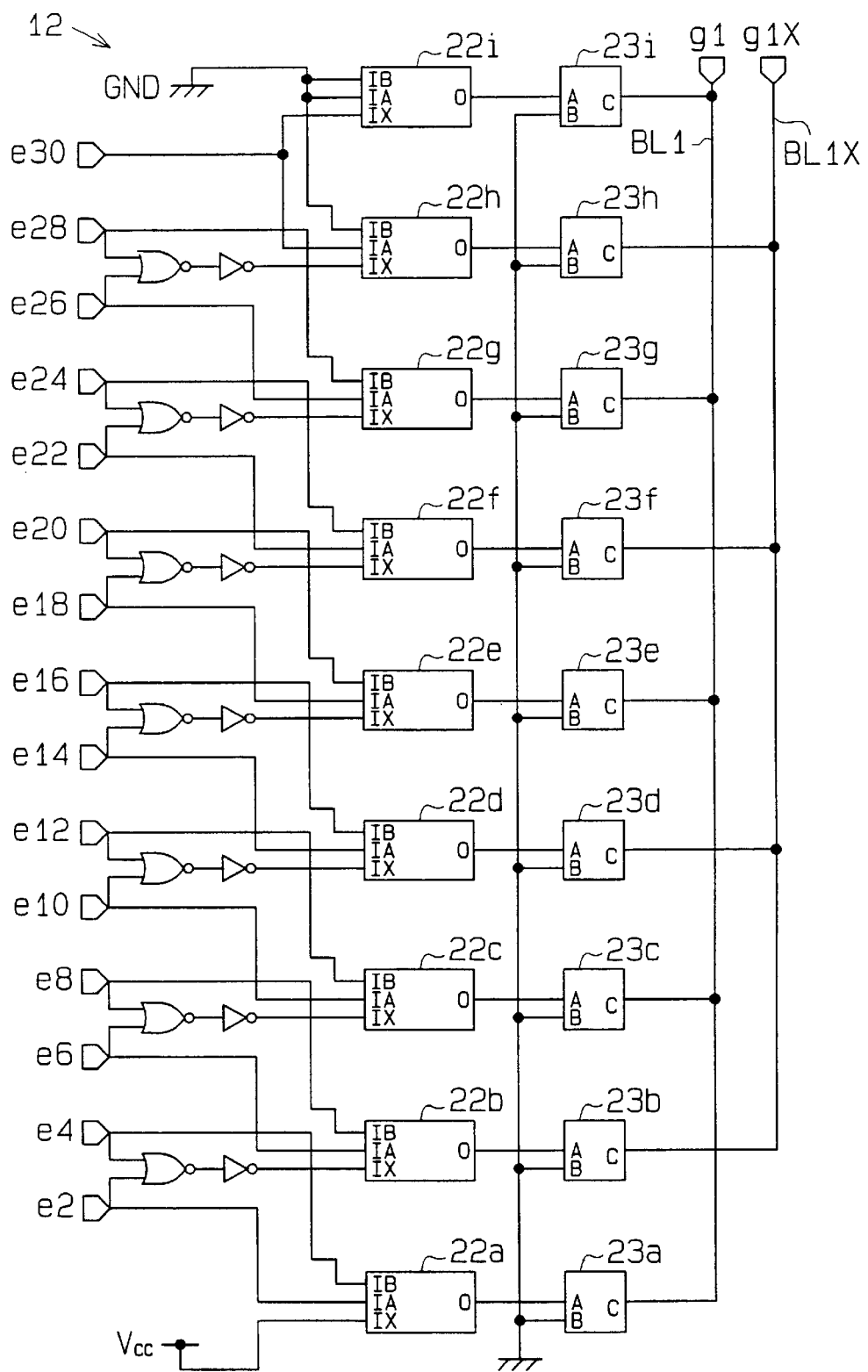
FIG. 20 is a circuit diagram showing a second encoding section of the first embodiment of the present invention.

A detailed construction of the second encoding section 12 is shown in FIG. 20. The second encoding section 12 has nine logical boundary detection circuits 22a to 22i which have the same construction as the logical boundary detection circuits 18a to 18q of the first encoding section 11. Input terminals IA of the logical boundary detection circuits 22a to 22h receive even-numbered thermometer code bits e2, e6, e10, e14, e18, e22, e26 and e30, respectively. The ground GND level is supplied to the input terminals IA and IB of the logical boundary detection circuit 22i. Input terminals IB of the logical boundary detection circuits 22a to 22g receive the even-numbered thermometer code bits e2, e6, e10, e14, e18, e22, e26 and e30, respectively. Input terminal IX of the logical boundary detection circuit 22b is connected to an inverted signal of logical NORing. That is, a logically ORed signal of the thermometer code bits e2 and e4, is input. Similarly, input terminals IX of the logical boundary detection circuits 22c to 22h receive logically ORed signals of the thermometer code bits e6, e8, e10, e12, e14, e16, e18, e20, e22, e24, e26 and e28, respectively.

A power supply signal $V_{CC}$ is input to an input terminal IX of the logical boundary detection circuit 22a, and the thermometer code bit e30 is input to an input terminal IX of the logical boundary detection circuit 22i.

Output signals O of the logical boundary detection circuits 22a to 22i are input to the terminals A of ROM cells 23a to 23i. Terminals C of the ROM cells 23a to 23i are each connected to one of bit lines BL1 to BL1x. Terminals B of the ROM cells 23a to 23i are connected to the ground GND. The ROM cells 23a to 23i are constructed similarly to the ROM cells 21a to 21q (FIG. 27).

If the output signal O of any of the logical boundary detection circuits 22a to 22i has an H level, then the N-channel MOS transistor CT of that one of the ROM cells 23a to 23i is turned on, and the Gray code signal g1 or g1x is output from the bit line BL1 or BL1x. At this time, the bit line BL1 or BL1x to which the one of the ROM cells 23a to 23i is connected has the ground GND level.

To the bit line BL1, every other ROM cells 23c, 23e, 23g and 23i beginning with the ROM cell 23a in the lowest order are connected. To the bit line BL1X, every other ROM cells 23d, 23f and 23h beginning with the ROM cell 23b in the lowest order are connected.

Figure 21:
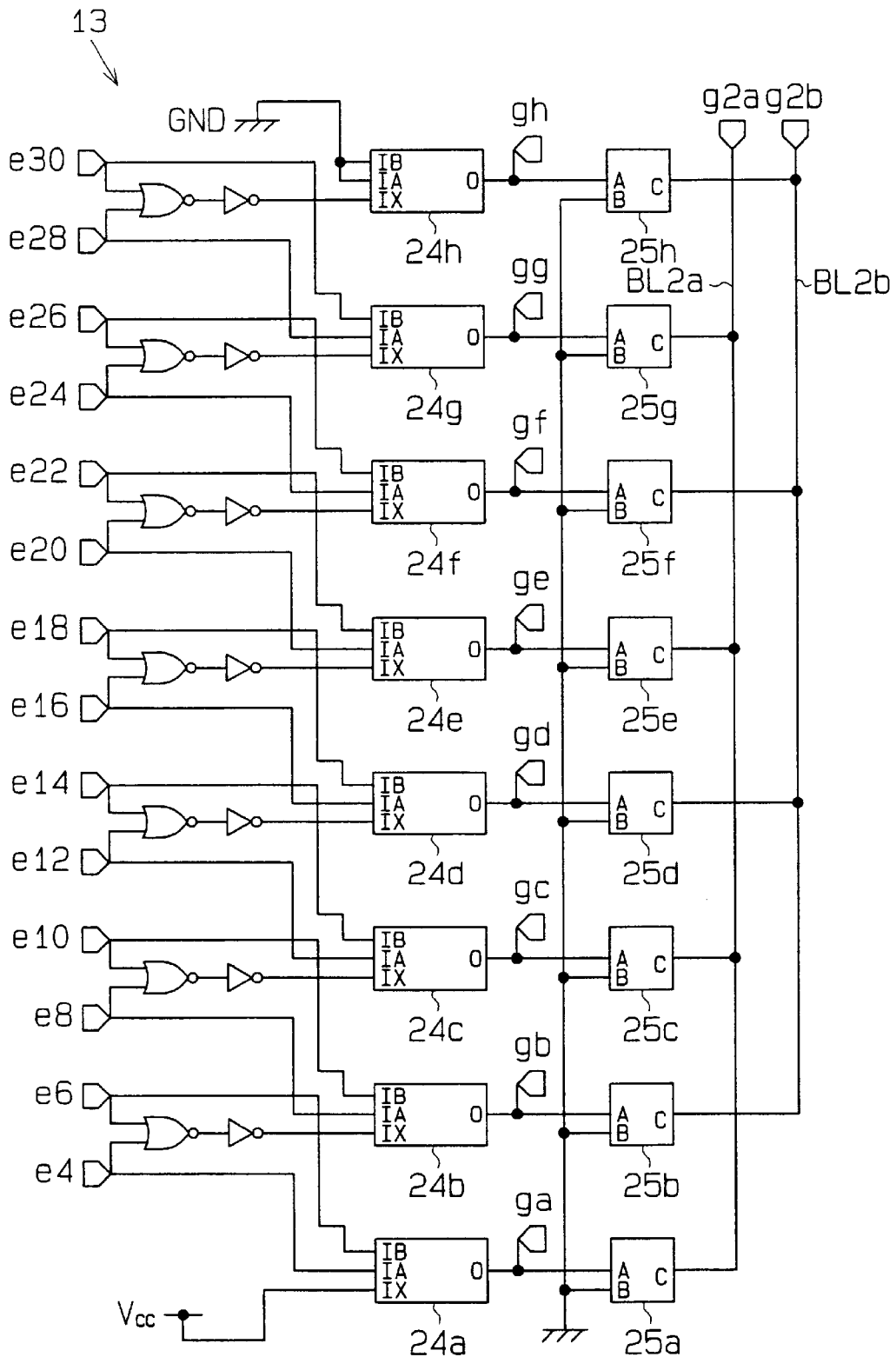
FIG. 21 is a circuit diagram showing a third encoding section of the first embodiment of the present invention.

A detailed construction of the third encoding section 13 is show in FIG. 21. The third encoding section 13 has eight logical boundary detection circuits 24a to 24h which have the same construction as the logical boundary detection circuits 18a to 18q of the first encoding section 11.

Input terminals IA of the logical boundary detection circuits 24a to 24g receive the even-numbered thermometer code bits e4, e8, e12, e1G, e20, e24 and e28, respectively. The ground GND level is supplied to the input terminals IA and IB of the logical boundary detection circuit 24h in the highest order. Input terminals IB of the logical boundary detection circuits 24a to 24g receive the even-numbered thermometer code bits e4, e8, e12, e16, e20, e24 and e28, respectively. Input terminal IX of the logical boundary detection circuit 24b receives an inverted signal of logical NORing. That is, a logically ORed signal of the thermometer code bits e4 and e6, is input thereto. Similarly, input terminals IX of the logical boundary detection circuits 24c to 24h receive logically ORed signals of the thermometer code bits e8, e10, e12, e14, e16, e18, e20, e22, e24, e26, e28 and e30, respectively. The power supply signal $V_{CC}$ is input to an input terminal IX of the logical boundary detection circuit 24a.

Output signals O of the logical boundary detection circuits 24a to 24h are output as signals ga to gh and substantially simultaneously input to terminals A of ROM cells 25a to 25h, respectively. Terminals C of the ROM cells 25a to 25h are each connected to one of bit lines BL2a and BL2b. Terminals B of the ROM cells 25a to 25h are connected to the ground GND. The ROM cells 25a to 25h are constructed similarly to the ROM cells 21a to 21q (FIG. 27).

If the level of the output signal O of any of the logical boundary detection circuits 24a to 24h has an H level, then the N-channel MOS transistor CT of that one of the ROM cells 25a to 25h is turned on, and the binary code signal g2a or g2b is output from the bit line BL2a or BL2b. At this time, the bit line BL2a or BL2b to which the one of the ROM cells 25a to 25h is connected has the ground GND level.

To the bit line BL2a, every other ROM cells 25c, 25e and 25g beginning with the ROM cell 25a in the lowest order are connected. To the bit line BL2b, every other ROM cells 25d, 25f and 25h beginning with the ROM cell 25b in the lowest order are connected.

Figure 22:
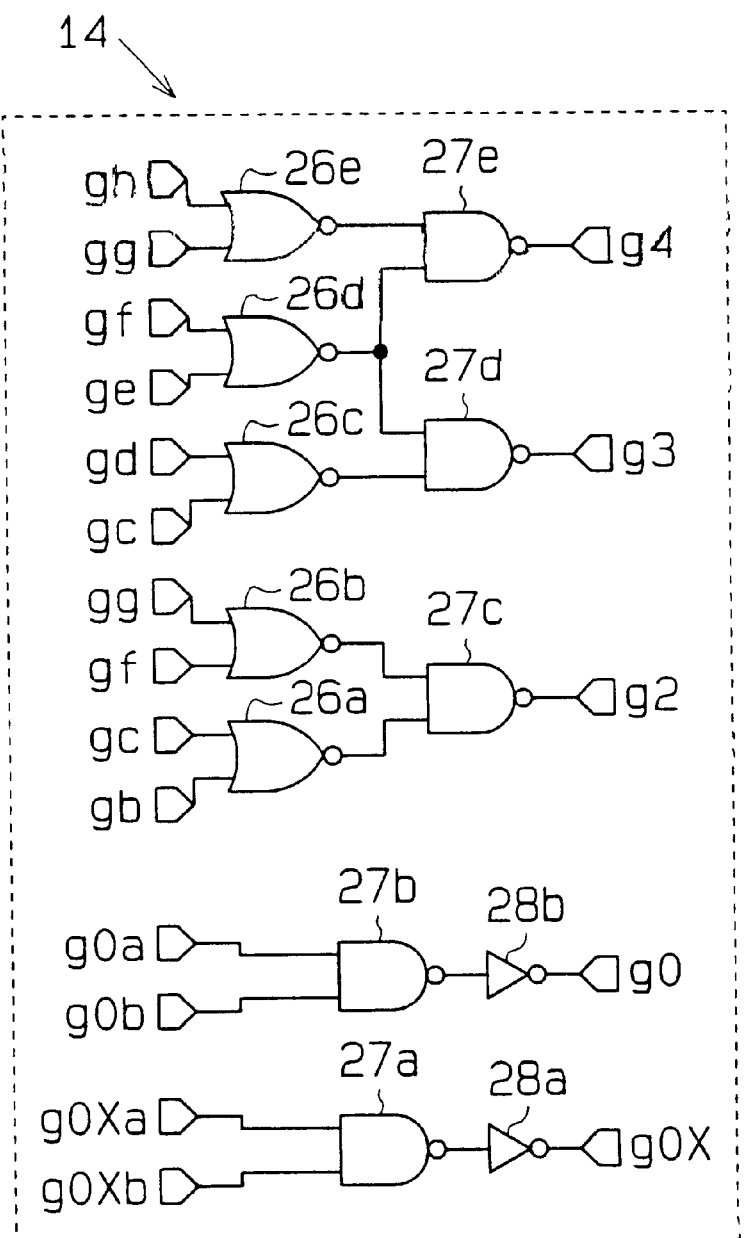
FIG. 22 is a circuit diagram showing a fourth encoding section of the first embodiment of the present invention.

The fourth encoding section 14 is described with reference to FIG. 22. Output signals g0Xa and g0Xb of the bit lines BL0Xa and BL0Xb are input to a NAND circuit 27a, and an output signal of the NAND circuit 27a is inverted by an inverter circuit 28a to produce a Gray code bit g0X. Output signals g0a and g0b of the bit lines BL0a and BL0b are input to a NAND circuit 27b, and an output signal of the NAND circuit 27b is inverted by an inverter circuit 28b to produce a Gray code bit g0.

Output signals gb and gc of the logical boundary detection circuits 24b and 24c are input to a NOR circuit 26a, and output signals gf and gg of the logical boundary detection circuits 24f and 24g are input to a NOR circuit 26b. Output signals of the NOR circuit 26a and 26b are input to a NAND circuit 27c, and a Gray code bit g2 is output from the NAND circuit 27c.

Output signals gc and gd of the logical boundary detection circuits 24c and 24d are input to a NOR circuit 26c; output signals ge and gf of the logical boundary detection circuits 24e and 24f are input to a NOR circuit 26d; and output signals gg and gh of the logical boundary detection circuits 24g and 24h are input to a NOR circuit 26e. An output signal of the NOR circuit 26c is input to a NAND circuit 27d; an output signal of the NOR circuit 26d is input to NAND circuits 27d and 27e; and an output signal of the NOR circuit 26e is input to the NAND circuit 27e. Then, a Gray code bit g3 is output from the NAND circuit 27d, and a Gray code bit g4 is output from the NAND circuit 27e.

Figure 23:
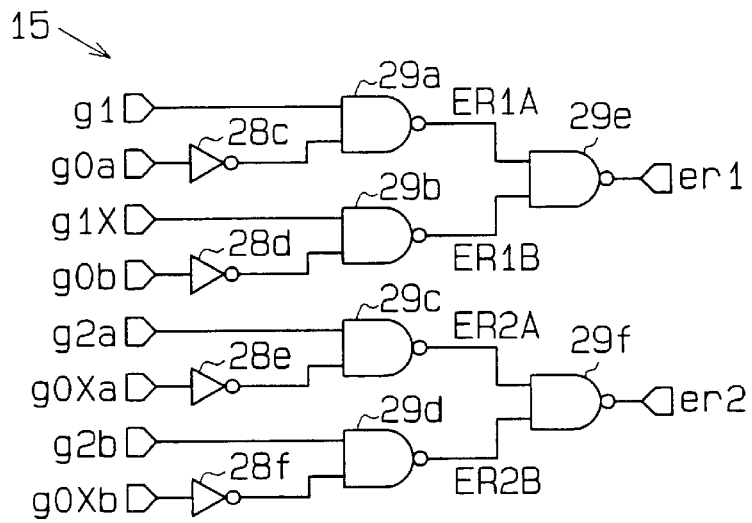
FIG. 23 is a circuit diagram showing an error signal production section of the first embodiment of the present invention.

A detailed construction of the error signal production section 15 is described with reference to FIG. 23. The output signal g1 of the bit line BL1 is input to a NAND circuit 29a. The output signal g0a of the bit line BL0a is inverted by an inverter circuit 28c and input to the NAND circuit 29a. The output signal g1X of the bit line BL1X is input to a NAND circuit 29b. The output signal g0b of the bit line BL0b is inverted by an inverter circuit 28d and input to the NAND circuit 29b. An output signal ER1A of the NAND circuit 29a and an output signal ER1B of the NAND circuit 29b are input to a NAND circuit 29e, and an error signal er1 is output from the NAND circuit 29e.

An output signal g2a of the bit line BL2a is input to a NAND circuit 29c, and an output signal g0Xa of the bit line BL0Xa is inverted by an inverter circuit 28e and input to the NAND circuit 29c. An output signal g2b of the bit line BL2a is input to a NAND circuit 29d, and an output signal g0Xb of the bit line BL0Xb is inverted by an inverter circuit 28f and input to the NAND circuit 29d. An output signal ER2A of the NAND circuit 29c and an output signal ER2B of the NAND circuit 29d are input to a NAND circuit 29f, and an error signal er2 is output from the NAND circuit 29f. The error signals er1 and er2 are provided to the error correction section 16 and, as shown in FIG. 18, and are output from output terminals of the error signal production section 15.

A detailed construction of the error correction section 16 is described with reference to FIG. 24. The error signal er2 and the signal g1X are input to a NAND circuit 30a, and the Gray code bit g2 is inverted by an inverter circuit 33a and input to the NAND circuit 30a. An output signal of the NAND circuit 30a and the Gray code bit g4 are input to an XOR circuit 32a, and an output signal of the XOR circuit 32a is inverted by an inverter circuit 33c and output as a correction Gray code bit g4Z. The error signal er2, the signal g1X and the Gray code bit g2 are input to a NAND circuit 30b. An output signal of the NAND circuit 30b and the Gray code bit g3 are input to an XOR circuit 32b, and an output signal of the XOR circuit 32b is inverted by an inverter circuit 33d and output as a correction Gray code bit g3Z. The error signal er2 and the Gray code bit g1 are input to a NAND circuit 30c. An output signal of the NAND circuit 30c and the Gray code bit g2 are input to an XOR circuit 32c, and an output signal of the XOR circuit 32 is inverted by an inverter circuit 33e and input as a correction Gray code bit g2Z.

The error signal er1 is inverted by an inverter circuit 33b and input to an XOR circuit 32d, and the Gray code signal g1 is input to the XOR circuit 32d. An output signal is of the XOR circuit 32d is inverted by an inverter circuit 33f and output as a correction Gray code bit g1Z.

The error signals er2 and er1 are input to a NOR circuit 31, and an output signal of the NOR circuit 31 and the Gray code signal g0 are input to an XOR circuit 32e. An output signal of the XOR circuit 32e is inverted by an inverter circuit 33g and output as a correction Gray code bit g0Z.

Figure 25:
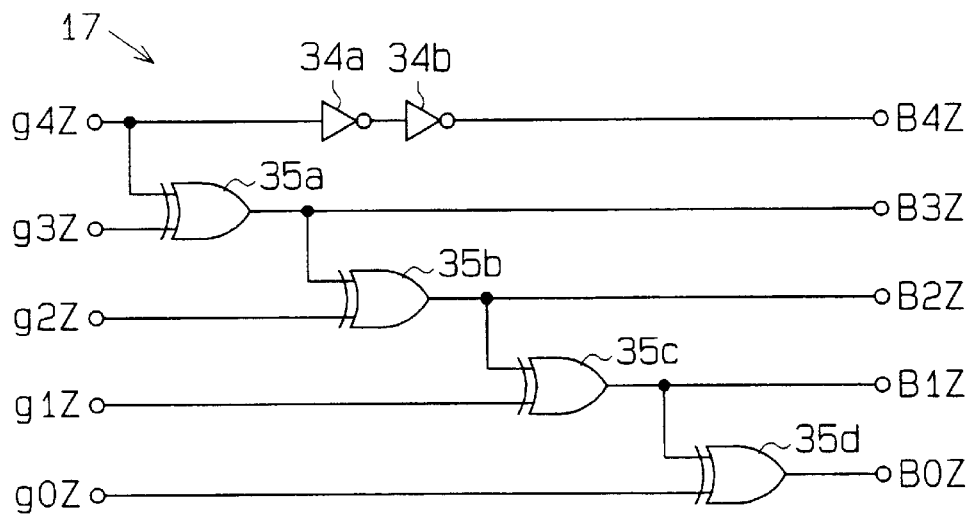
FIG. 25 is a circuit diagram showing a Gray to binary conversion section of the first embodiment of the present invention.

A detailed construction of the Gray to binary conversion section 17 is shown in FIG. 25. The Gray code bit g4Z is input to an XOR circuit 35a and output as a binary code bit B4Z through two stages of inverter circuits 34a and 34b. The correction Gray code bits g3Z and g4z are input to the XOR circuit 35a, and an output signal of the XOR circuit 35a is output as a binary code bit B3Z and input to an XOR circuit 35b. The correction Gray code bit g2Z is input to the XOR circuit 35b, and an output signal of the XOR circuit 35b is output as a binary code bit B2Z and input to an XOR circuit 35c. The correction Gray code bit g1Z is input to the XOR circuit 35c, and an output signal of the XOR circuit 35c is output as a binary code bit B1Z and is input to an XOR circuit 35d. The correction Gray code bit g0Z is input to the XOR circuit 35d, and an output signal of the XOR circuit 35d is output as a binary code bit B0Z.

Figure 28:
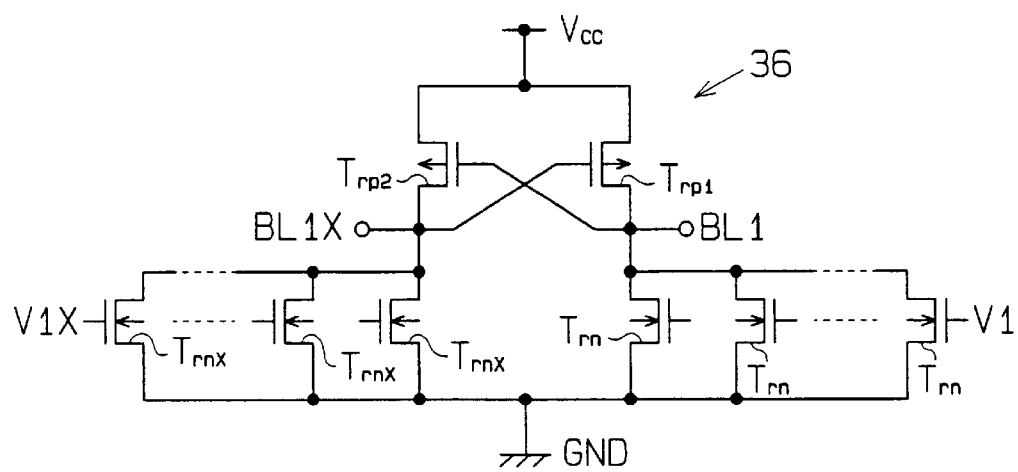
FIG. 28 is a circuit diagram showing a precharge circuit of the present invention.
Figure 30:
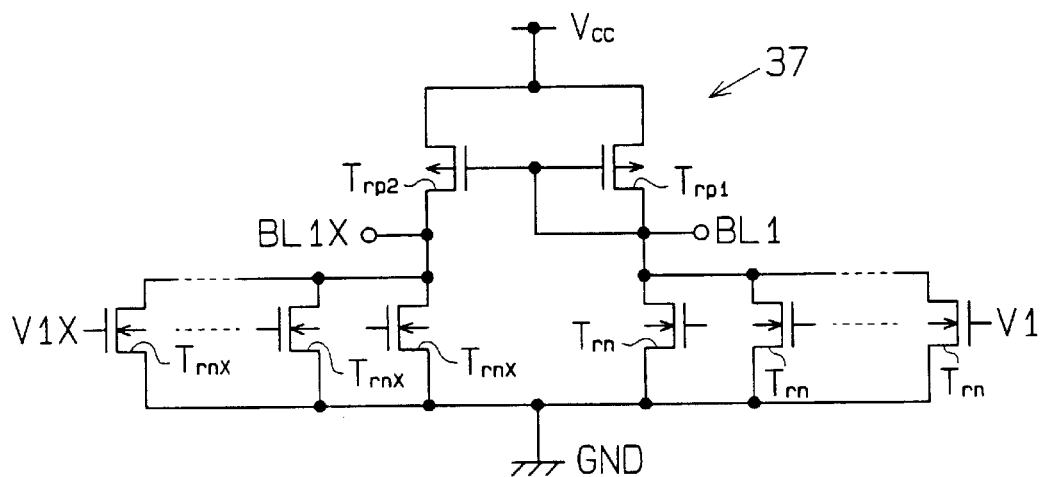
FIG. 30 is a circuit diagram showing another precharge circuit in accordance with the present invention.

One of precharge circuits 36 and 37, shown in FIGS. 28 and 30, is connected between the bit lines BL1 and BL1X. A similar precharge circuit is connected between the bit lines BL2a and BL2b. The precharge circuit 36 includes a pair of P-channel MOS transistors $T_{rp1}$ and $T_{rp2}$ whose sources are connected to the power supply $V_{CC}$ and whose gates are connected to the drains of the other transistors relative to each other. A plurality of N-channel MOS transistors $T_{rn}$ are connected in parallel between the drain of the transistor $T_{rp1}$ and a power supply Vss (GND), and output signals of the logical boundary detection circuits 22a, 22c, 22e, 22g and 22i which control the bit line BL1 through the ROM cells 23a, 23c, 23e, 23g and 23i are input as gate signals, V1 to the gates of the transistors $T_{rn}$.

A plurality of N-channel MOS transistors $T_{rnx}$ are connected in parallel between the drain of the transistor $T_{rp2}$ and the power supply Vss, and output signals of the logical boundary detection circuits 22b, 22d, 22f and 22h which control the bit line BL1X through the ROM cells 23b, 23d, 23f and 23h are input as gate signals V1X to the gates of the transistors $T_{rnx}$. The drain of the transistor $T_{rp1}$ is connected to the bit line BL1, and the drain of the P-channel MOS transistor $T_{rp2}$ is connected to the bit line BL1X.

Figure 29:
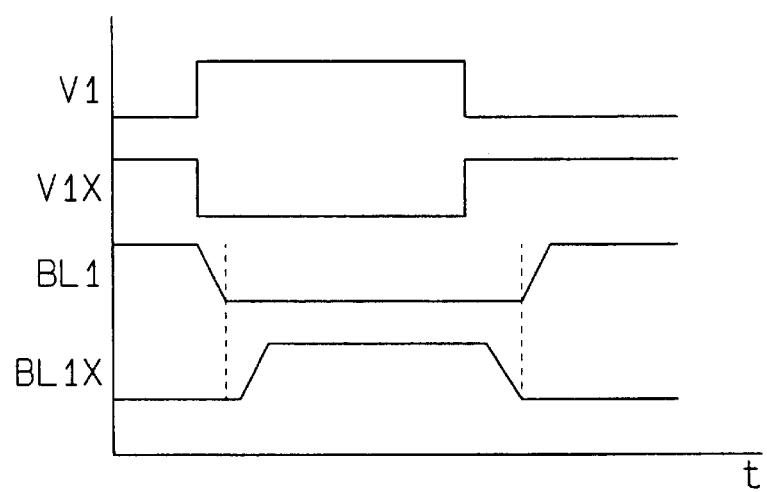
FIG. 29 is a waveform diagram illustrating operation of the precharge circuit of FIG. 28.

In the precharge circuit 36, as shown in FIG. 29, if, the level of one of the gate signals V1 goes high to turn on a corresponding one of the transistors $T_{rn}$ and all of the gate signals V1X go low, then the transistor $T_{rp1}$ is turned off and the transistor $T_{rp2}$ is turned on. Consequently, the level of the bit line BL1 is changed to an L level while the level of the bit line BL1X is changed to an H level, and the bit line BL1X is precharged to the power supply $V_{CC}$ level.

On the other hand, if the level of one of the gate signals V1X to the transistors $T_{rnx}$ goes high to turn on a corresponding one of the transistors $T_{rnx}$ and all of the gate signals V1 to the transistors $T_{rn}$ go low, then the transistor $T_{rp1}$ is turned on while the transistor $T_{rp2}$ is turned off. Consequently, the level of the bit line BL1 is changed to an H level while the level of the bit line BL1X is changed to an L level, and the bit lines BL1 is precharged to the power supply $V_{CC}$. In the precharge circuit 36, one of the bit lines BL1 and BL1X is precharged after the level of the other falls.

Figure 31:
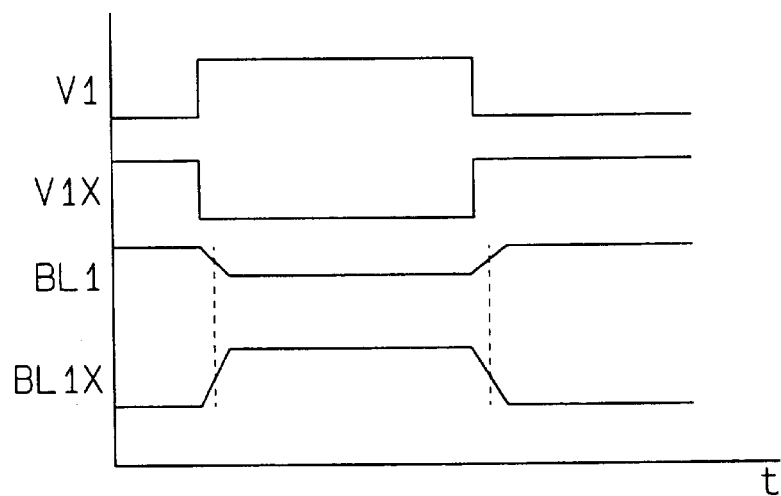
FIG. 31 is a waveform diagram illustrating operation of the precharge circuit of FIG. 30 in accordance with the present invention.

The precharge circuit 37 shown in FIG. 30 is different from the precharge circuit 36 in that the gates of the transistors $T_{rp1}$ and $T_{rp2}$ are connected to each other and connected also to the drain of the transistor $T_{rp1}$. In the precharge circuit 37, one of the bit lines BL1 and BL1X is precharged simultaneously as the level of the other falls, as shown in FIG. 31, and consequently, the speed in precharging operation is higher.

Figure 32:
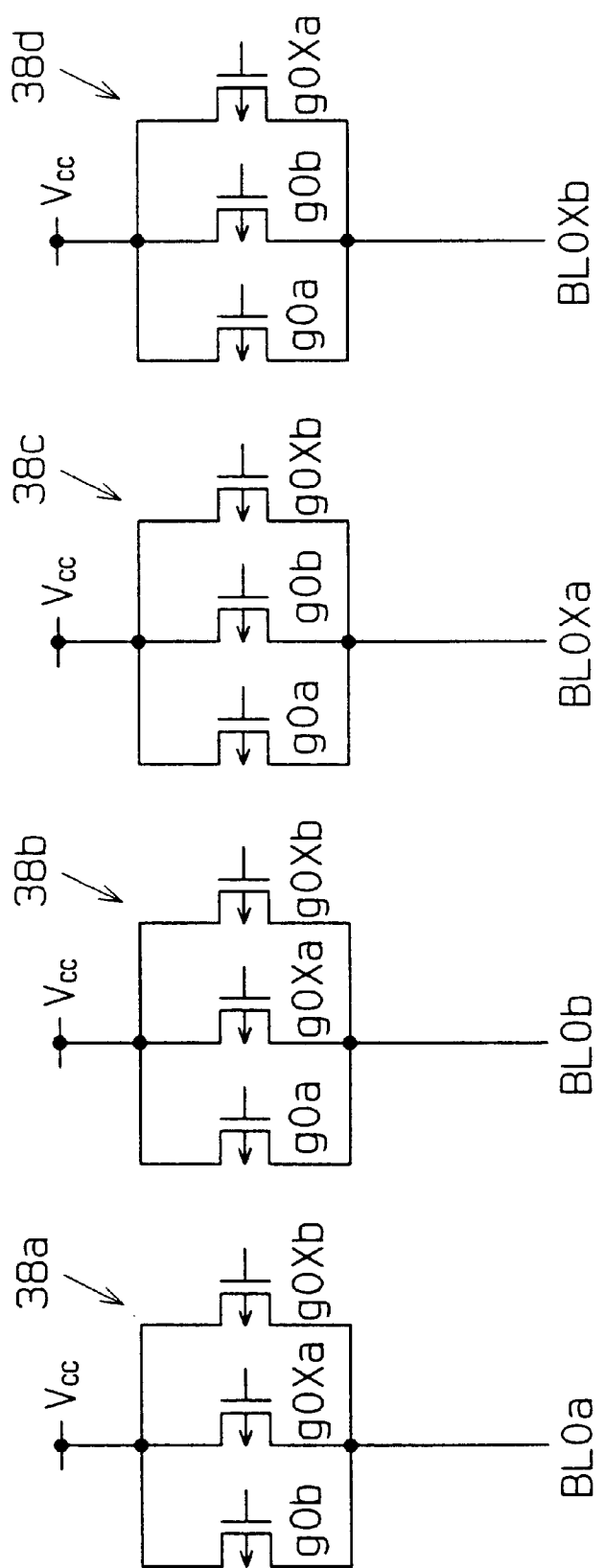
FIG. 32 is a circuit diagram showing a further precharge circuit in accordance with the present invention.

Precharge circuits 38a to 38d shown in FIG. 32 are connected to the bit lines BL0a, BL0b, BL0Xa and BL0Xb of the first encoding section 11, respectively. The precharge circuit 38a includes three P-channel MOS transistors connected in parallel between the bit line BL0a and the power supply $V_{CC}$. The Gray code bits g0b, g0Xa and g0Xb are provided to the gates of the transistors. When the Gray code bit g0a does not have an L level, one of the Gray code bits g0b, g0Xa and g0Xb has an L level, and consequently, the bit line BL0a is precharged to the power supply $V_{CC}$ level.

The precharge circuit 38b includes three P-channel MOS transistors connected in parallel between the bit line BL0b and the power supply $V_{CC}$. The Gray code bits g0a, g0Xa and g0Xb are provided to the gates of the transistors. When the Gray code bit g0b does not have an L level, one of the Gray code bits g0a, g0Xa and g0Xb has an L level, and consequently, the bit line BL0b is precharged to the power supply $V_{CC}$ level.

The precharge circuit 38c includes three P-channel MOS transistors connected in parallel between the bit line BL0Xa and the power supply $V_{CC}$. The Gray code bits g0a, g0b and g0Xb are provided to the gates of the transistors. When the Gray code bit g0Xa does not have an L level, one of the Gray code bits g0a, g0b and g0Xb has an L level, and consequently, the bit line BL0Xa is precharged to the power supply $V_{CC}$ level.

The precharge circuit 38d includes three P-channel MOS transistors connected in parallel between the bit line BL0Xb and the power supply $V_{CC}$. The Gray code bits g0a, g0b and g0Xa are provided to the gates of the transistors. When the Gray code bit g0Xb does not have an L level, one of the Gray code bits g0a, g0b and g0Xa has an L level, and consequently, the bit line BL0Xb is precharged to the power supply $V_{CC}$ level.

Operation of the encoder of the first embodiment is described below. When a 5-bit Gray code g0 to g4 is produced from a thermometer code e1 to e31, the first encoding section 11 produces Gray code bits g0a, g0b, g0Xa and g0Xb for production of the Gray code bit go of the lowest order, in accordance with a bit independent decoding system. The Gray code bit g0Xa is a back code of the Gray code bit g0a, and the Gray code bit g0Xb is a back code of the Gray code bit g0b.

Figure 33:
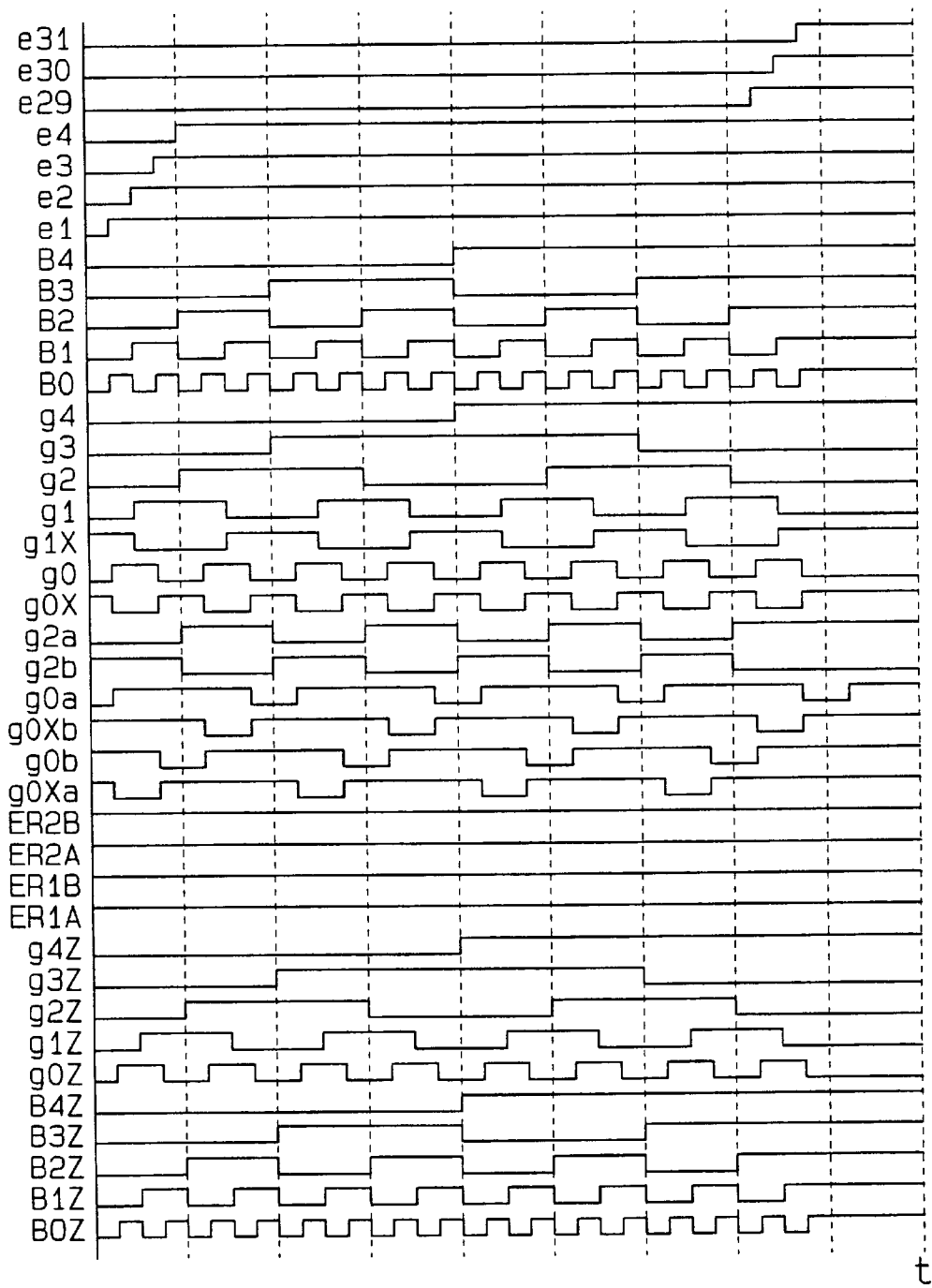
FIG. 33 is a waveform diagram illustrating operation (when no babble error is present) of the first embodiment of the present invention.

Three successive ones of the odd-numbered bits of the thermometer code e1 to e31 from the lower order side are input to each of the logical boundary detection circuits 18a to 18q. When a regular thermometer code e1 to e31 is input to the logical boundary detection circuits 18a to 18q, such Gray code bits g0a, g0b, g0Xa and g0Xb as illustrated in FIG. 33 are output from the bit lines BL0a, BL0b, BL0Xa and BL0Xb of the first encoding section 11, respectively.

The Gray code bit g0Xa corresponds to a signal obtained by logically ORing the signals Z1, Z3, Z5 and Z7 illustrated in FIG. 9 while the Gray code bit g0Xb corresponds to another signal obtained by logically ORing the signals Z2, Z4, Z6 and Z8 illustrated in FIG. 9. One of the Gray code bits g0a, g0b, g0Xa and g0Xb exhibits an L level based on the thermometer code e1 to e31.

The ROM cells 21a to 21q, which are driven by the logical boundary detection circuits 18a to 18q, respectively are successively connected to the bit lines BL0a, BL0Xa, BL0b and BL0Xb. In particular, every fourth logical boundary detection circuit is connected to each of the bit lines BL0a, BL0Xa, BL0b and BL0Xb through a ROM cell, and where four logical boundary detection circuits connected successively to the bit lines BL0a, BL0Xa, BL0b and BL0Xb make one cycle, the logical boundary detection circuits 18a to 19b are connected at one-cycle intervals to the bit lines BL0a, BL0Xa, BL0b and BL0Xb.

Figure 34:
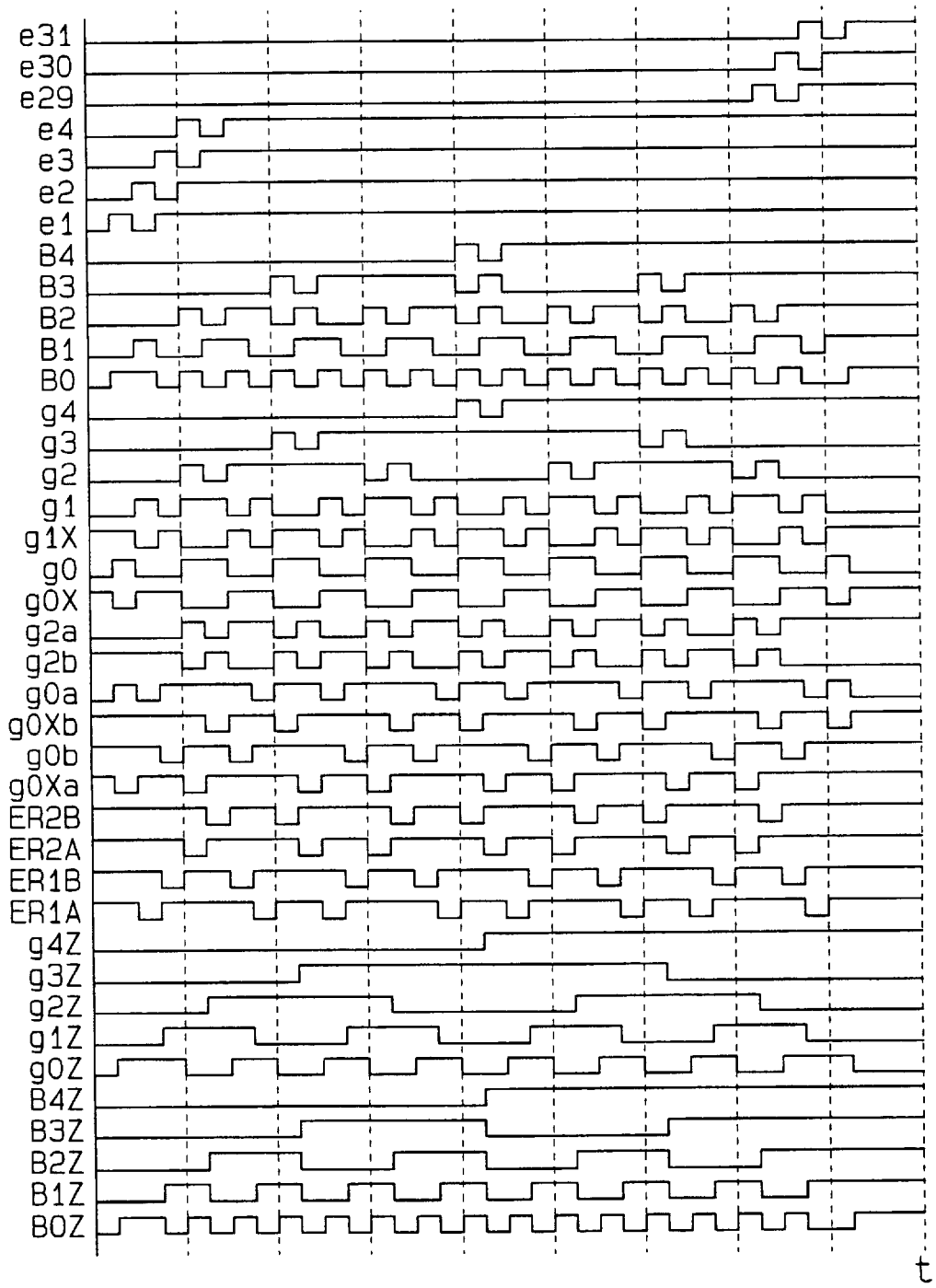
FIG. 34 is a waveform diagram illustrating operation of the present invention when a babble error of the b1 type is input.

If "... 110100...", that is, a thermometer code e1 to e31 which includes a babble error of the b1 type, is input to the first encoding section 11, then an error originating from the babble error is included in the Gray code bits g0a, g0b, g0Xa and g0Xb as shown in FIG. 34.

Figure 35:
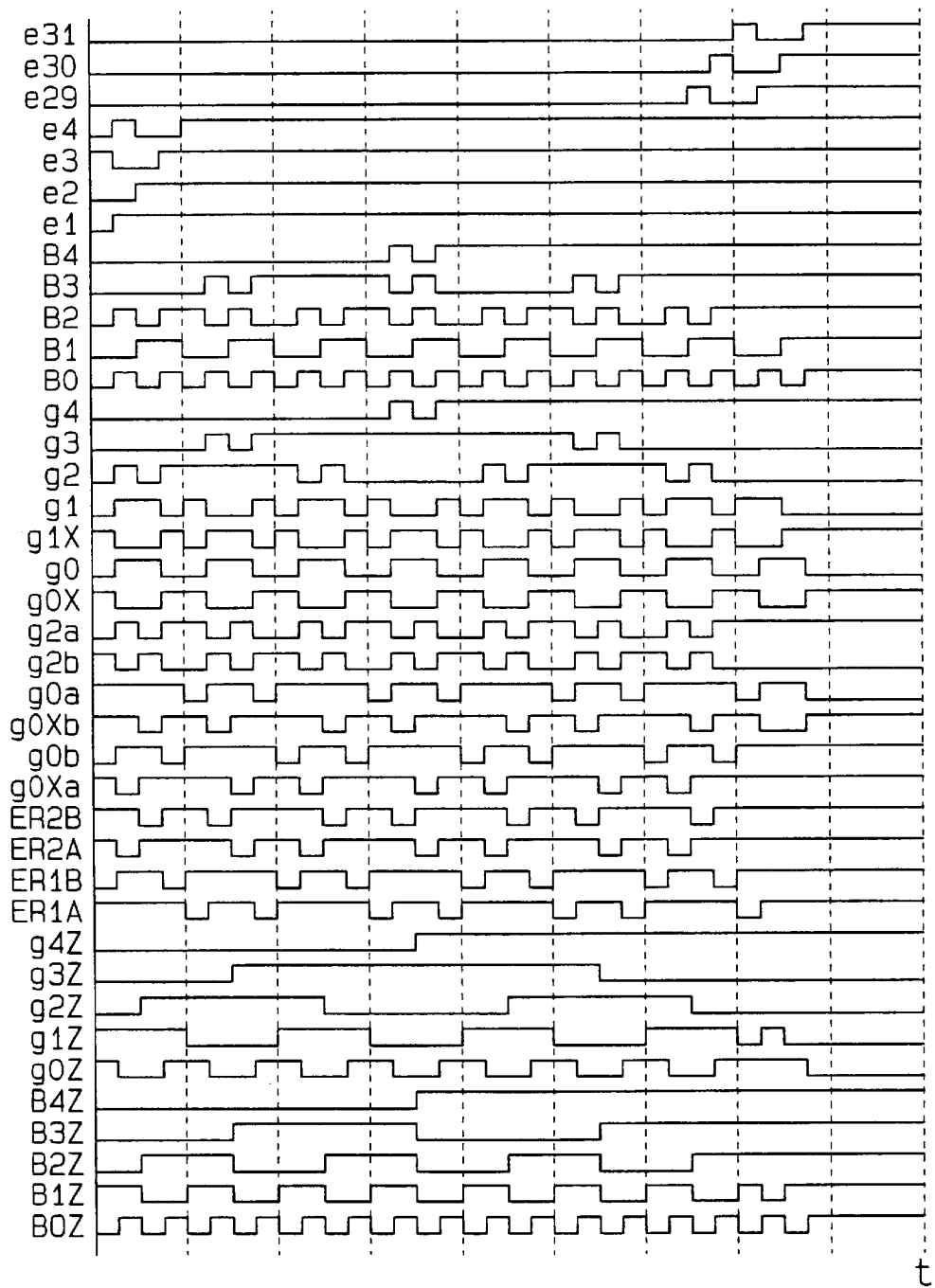
FIG. 35 is a waveform diagram illustrating operation of the present invention when a babble error of the b2H type is input.

If "... 1100100...", that is, a thermometer code e1 to e31 including a babble error of the b2H type, is input to the first encoding section 11, then the Gray code bits g0a, g0b, g0Xa and g0Xb are corrected to a signal which includes an error similar to that originating from a babble error of the b1 type as shown in FIG. 35 because three successive ones of the odd-numbered bits of the thermometer code e1 to e31 from the lowest order side are input to each of the logical boundary detection circuits 18a to 18q.

Figure 36:
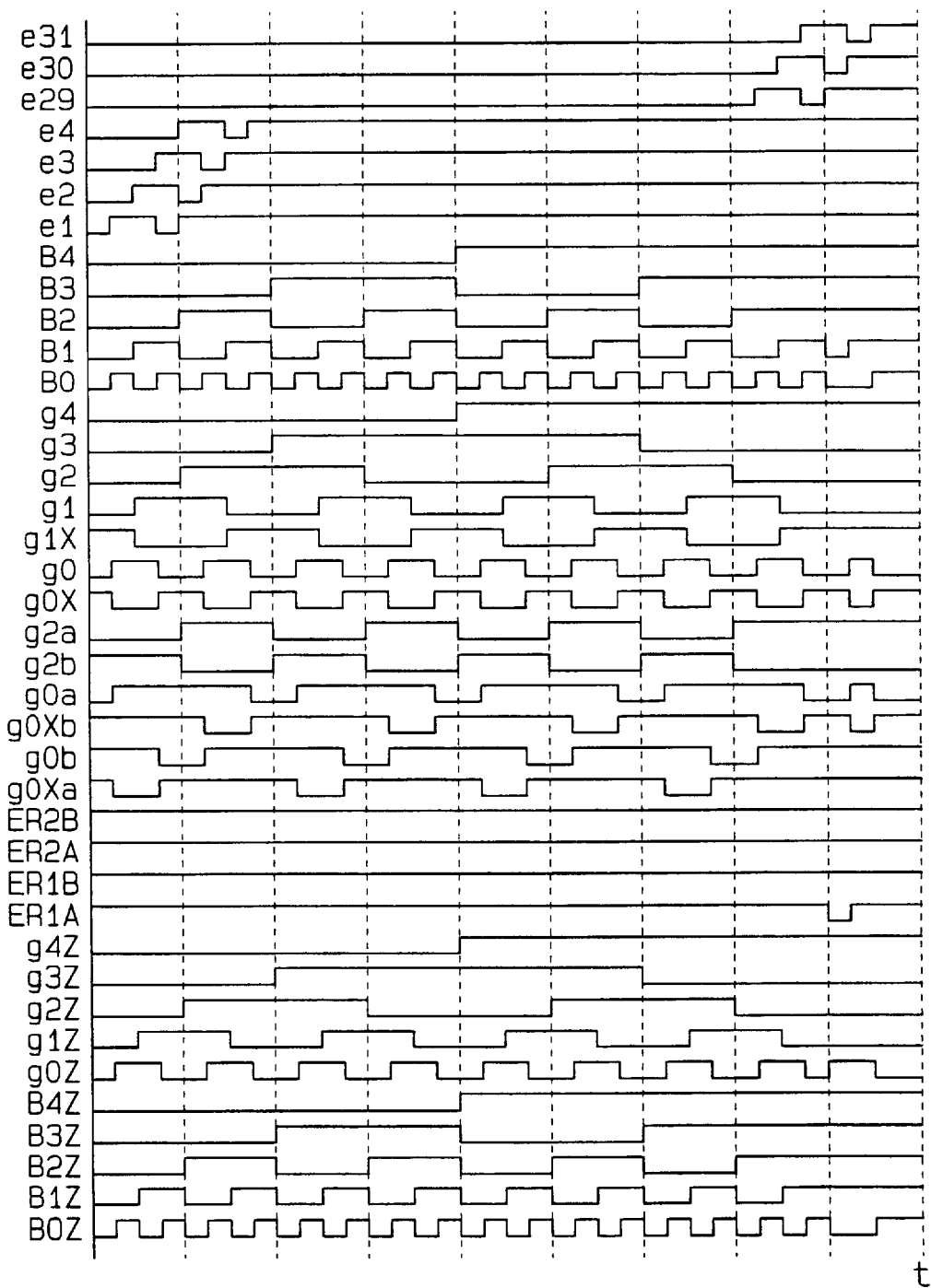
FIG. 36 is a waveform diagram illustrating operation of the present invention when a babble error of the b2L type is input.

If "... 11011000...", that is, a thermometer code e1 to e31 including a babble error of the b2L type, is input to the first encoding section 11, then the Gray code bits g0a, g0b, g0Xa and g0Xb are corrected as shown in FIG. 36 so that they may be equal to the Gray code bits g0a, g0b, g0Xa and g0Xb which originate from the thermometer code e1 to e31 which includes no babble error illustrated in FIG. 33.

In any of the cases, one of the Gray code bits g0a, g0b, g0Xa and g0Xb has an L level while the others have an H level. Accordingly, that one of the bit lines BL0a, BL0Xa, BL0b and BL0Xb which does not output a Gray code bit having an L level is precharged to the power supply $V_{CC}$ by the operation of the precharge circuit 38a to 38d in parallel to the encoding operation.

The second encoding section 12 produces, when the 5-bit Gray code g0 to g4 is produced from the thermometer code e1 to e31, the second Gray code bit g1 from the lowest order side and the code bit g1X which is complementary signal to the Gray code bit g1 in accordance with a bit independent decoding system.

To each of the logical boundary detection circuits 22a to 22i, three signals based on even-numbered ones of the thermometer codes e2 to e30 from the lowest order side are successively input. When regular thermometer code bits e2 to e30 are input to the logical boundary detection circuits 22a to 22i, such Gray code bits g1 and g1X as illustrated in FIG. 33 are output from the bit lines BL1 and BL1X of the second encoding section 12, respectively.

The Gray code bit g1 corresponds to the Gray code bit G1 illustrated in FIG. 9. The Gray code bit g1X is a back code to the Gray code bit g1. The Gray code bits G1 and g1X have a mutually complementary relationship.

Such logic as just described is produced by connecting the ROM cells 23a to 23i, which are driven by the logical boundary detection circuits 22a to 22i, respectively, alternately to the bit lines BL1 and BL1X. In particular, every other logical boundary detection circuit is connected to each of the bit lines BL1 and BL1X through a ROM cell, and where two logical boundary detection circuits connected successively to the bit lines BL1 and BL1X make one cycle, the logical boundary detection circuits 22a to 22i are connected at one-cycle intervals to the bit lines BL1 and BL1X.

If "... 110100...", that is, the b1 type babble error is input to the second encoding section 12, then an error originating from the babble error is included in the Gray code bits g1 and g1X, as shown in FIG. 34.

If "... 1100100...", that is, the b2H type babble error is input to the second encoding section 12, then the Gray code bits g1 and g1X are corrected to a signal which includes an error similar to that originating from a babble error of the b1 type as illustrated in FIG. 35 because three signals based on even-numbered ones of the thermometer code bits e2 to e30 from the lowest order side are successively input to each of the logical boundary detection circuits 22a to 22i.

If "... 1101100...", that is, the b2L type babble error is input to the second encoding section 12, then the Gray code bits g1 and g1X are corrected, as shown in FIG. 33, so that they may be equal to the Gray code bits g1 and g1X originating from the thermometer code bits e2 to e30 which include no babble error shown in FIG. 33.

In all cases, the Gray code bits g1 and g1X are complementary signals. Accordingly, that one of the bit lines BL1 and BL1X which does not output a Gray code bit having an L level is precharged to the power supply $V_{CC}$ level in parallel to the encoding operation.

The third encoding section 13 produces, when the 5-bit Gray code g0 to g4 is produced from the thermometer code bits e1 to e31, logical boundary detection signals ga to gh for production of the third to fifth Gray code bits g2 to g4 from the lowest order side and the binary code bits g2a and g2b in accordance with a bit independent decoding system.

To each of the logical boundary detection circuits 24a to 24h, three signals based on even-numbered ones of the thermometer code bits e4 to e30 from the lowest order side are successively input. When normal thermometer code bits e4 to e30 are input to the logical boundary detection circuits 24a to 24h, such binary code bits g2a and g2b as illustrated in FIG. 33 are output from the bit lines BL2a and BL2b of the third encoding section 13.

The binary code bits g2a and g2b have a mutually complementary relationship to each other and are equal to values obtained by shifting the Gray code bits g1 and g1X in a decimal value in FIG. 9 to the upper order side by a two-digit distance.

Such logic is produced by connecting the ROM cells 25a to 25h, which are driven by the logical boundary detection circuits 24a to 24h, respectively, alternately to the bit lines BL2a and BL2b. In other words, every other logical boundary detection circuit is connected to each of the bit lines BL2a and BL2b through a ROM cell, and if the two logical boundary detection circuits connected alternately to the bit lines BL2a and BL2b make one cycle, then the logical boundary detection circuits 24a to 24h are connected at one-cycle intervals to the bit lines BL2a and BL2b. The logical boundary detection signals ga to gh are output from the logical boundary detection circuits 24a to 24h, respectively.

If ". . . 110100. . . ", that is, the b1 type babble error is input to the third encoding section 13, then an error originating from the babble error is included in the binary code bits g2a and g2b, as shown in FIG. 34.

If ". . . 1100100. . . ", that is, the b2H type babble error is input to the third encoding section 13, then the binary code bits g2a and g2b are corrected to a signal which includes an error similar to that originating from the babble error of the b1 type as illustrated in FIG. 35 because three signals based on even-numbered ones of the thermometer code bits e4 to e30 from the lowest order side are successively input to each of the logical boundary detection circuits 24a to 24h.

If ". . . 1101100. . . ", that is, the b2L type babble error is input to the third encoding section 13, then the binary code bits g2a and g2b are corrected, as shown in FIG. 36, so that they may be equal to the binary code bits g2a and g2b originating from the thermometer code bits e4 to e30 which include no babble error shown in FIG. 33.

In all cases, the binary code bits g2a and g2b are complementary signals. Accordingly, that one of the bit lines BL2a and BL2b which does not output a Gray code bit having an L level is precharged to the power supply $V_{CC}$ level in parallel with the encoding-operation.

The fourth encoding section 14 produces the Gray code bits g0 and g0X of the lowest order by logical processing of the Gray code signals g0a, g0b, g0Xa and g0Xb and produces the third to fifth Gray code bits g2 to g4 from the lowest order side by logical processing of the logical boundary detection signals gb to gh.

If regular Gray code signals g0a, g0b, g0Xa and g0Xb and logical boundary detection signals gb to gh originating from a regular thermometer code e1 to e32 are input to the fourth encoding section 14, then Gray code bits g0 and g2 to g4 which do not include an error are produced as shown in FIG. 33. The second Gray code bit g1 from the lowest order side is produced by the second encoding section 12.

If Gray code signals g0a, g0b, g0Xa and g0Xb and logical boundary detection signals gb to gh originating from ". . . 110100. . . ", that is, the b1 type babble error are input, then an error originating from the babble error is included in the Gray code g0 to g4 as shown in FIG. 34.

If the Gray code signals g0a, g0b, g0Xa and g0Xb and the logical boundary detection signals gb to gh originating from ". . . 1100100. . . ", that is, the b2H type babble error are input, then the Gray code g0 to g4 makes a signal which includes an error similar to that originating from the babble error of the b1 type.

If the Gray code signals g0a, g0b, g0Xa and g0Xb and the logical boundary detection signals gb to gh originating from ". . . 1101100. . . ", that is, the b2L type babble error, then the Gray code g0 to g4 makes, as shown in FIG. 36, a signal which includes no error similarly as in FIG. 33.

The error signal production section 15 is a circuit which detects whether or not the Gray code signals g0a, g0b, g0Xa, g0Xb, g1 and g1X and the binary code bits g2a and g2b satisfy the relationship of the Gray code illustrated in FIG. 9, and outputs, if the relationship is not satisfied, error signals er1 and er2 having an H level.

In particular, when regular Gray code bits g1 and g0a are input to the NAND circuit 29a, the Gray code bit g0a has an L level, and the Gray code bit g1 has an L level, so that the output signal ER1A having an H level is output. When regular Gray code bits g1X and g0b are input to the NAND circuit 29b, the Gray code bit g0b has an L level, and the Gray code bit g1X has an L level, so that the output signal ER1B having an H level is output. Accordingly, when normal Gray code bits g1, g1X, g0a and g0b are input, the output signals ER1A and ER1B both have an H level, and the error signal er1 output from the NAND circuit 29e has an L level.

Similarly, when a normal binary code bit g2a and a normal Gray code bit g0Xa are input to the NAND circuit 29c, the Gray code bit g0Xa has an L level, and the binary code bit g2a has an L level, so that the output signal ER2A having an H level is output. When a normal binary code bit g2b and a normal Gray code bit g0Xb are input to the NAND circuit 29d, the Gray code bit g0Xb has an L level, the binary code bit g2b has an L level, so that the output signal ER2b having an H level is output. Accordingly, when normal Gray code bits g2a, g2b, g0Xa and g0Xb are input, the output signals ER2A and ER2B both have an H level, and the error signal er2 output from the NAND circuit 29f has an L level.

When the Gray code signals g0a, g0b, g0Xa, g0Xb, g1 and g1X and the binary code bits g2a and g2b include an error as shown in FIGS. 34 and 35, it sometimes occurs that the condition in a regular case becomes not satisfied and the output signals ER1A to ER2B having an L level is output. In this instance, the error signals er1 and er2 have H levels.

Figure 24:
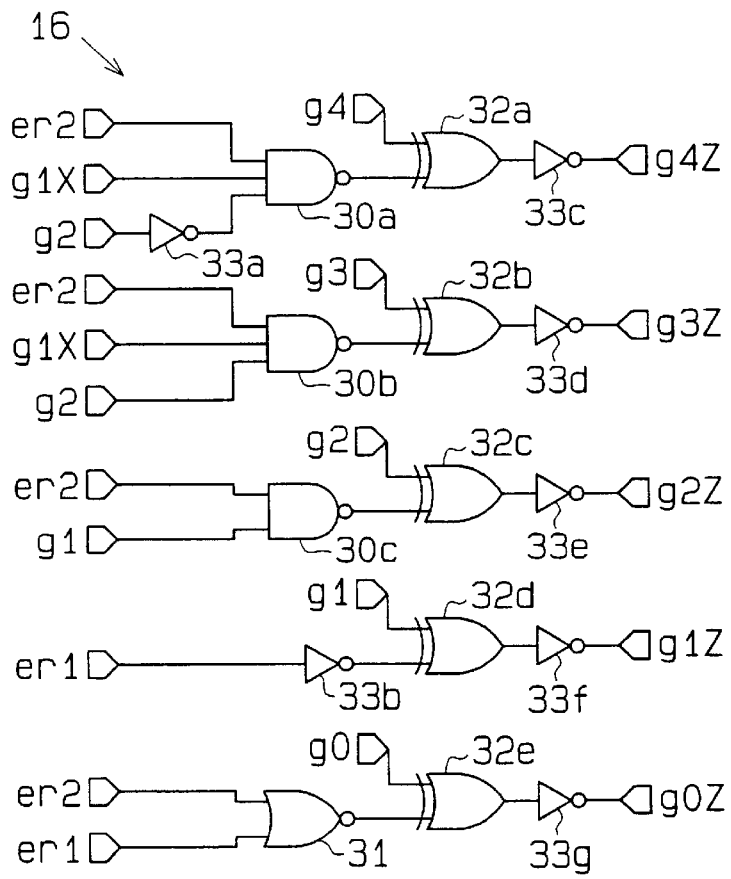
FIG. 24 is a circuit diagram showing an error correction section of the first embodiment of the present invention.

The error correction section 16 shown in FIG. 24 corrects the Gray code bits g0 to g4, which include an error, to likely values based on the error signals er1 and er2. The correcting operation inverts that one of the Gray code bits g0 to g4 from which the error has been detected in connection with the correction principle. In particular, as shown in FIGS. 34 and 35, when the Gray code bit g4 exhibits an error, the error signal er2 and the Gray code signal g1X have an H level and the Gray code signal g2 has an L level, and the output signal of the NAND circuit 30a has an L level. Consequently, by operation of the XOR circuit 32a and the inverter circuit 33c, a correction Gray code bit g4Z inverted from the Gray code bit g4 is output. On the other hand, when the error signal er2 and the Gray code bits g1X and g2 have the other values than those described above, the Gray code bit g4 is normal and the output signal of the NAND circuit 30a has an H level, and consequently, the correction Gray code bit g4Z has the same phase as that of the Gray code bit g4.

When the Gray code bit g3 exhibits an error, the error signal er2 and the Gray code signals g1X and g2 have an H level and the output signal of the NAND circuit 30a has an L level. Consequently, the correction Gray code bit g3Z inverted from the Gray code bit g3 is output by operation of the XOR circuit 32b and the inverter circuit 33d. On the other hand, when the error signal er2 and the Gray code signals g1X and g2 have any other values than those described above, the Gray code bit g3 is normal, and the output signal of the NAND circuit 30b has an H level. Consequently, the correction Gray code bit g3Z has a phase same as that of the Gray code bit g3.

When the Gray code bit g2 exhibits an error, the error signal er2 and the Gray code signal g1 have an H level, and the output of the NAND circuit 30c has an L level. Consequently, the correction Gray code bit g2Z inverted from the Gray code bit g2 is output by operation of the XOR circuit 32c and the inverter circuit 33e. On the other hand, when the error signal er2 and the Gray code signal g1 have values other than those described above, the Gray code bit g2 is normal, and the output signal of the NAND circuit 30c has an H level. Consequently, the correction Gray code bit g2Z has a phase same as that of the Gray code bit g2.

When the Gray code bit g1 exhibits an error, the error signal er1 has an H level, and the output signal of the inverter circuit 33b has an L level. Consequently, the correction Gray code bit g1Z inverted from the Gray code bit g1 is output by operation of the XOR circuit 32d and the inverter circuit 33f. On the other hand, when the error signal er2 has an L level, the Gray code bit g1 is normal, and the output signal of the inverter circuit 33b has an H level. Consequently, the phase of the correction Gray code bit g1Z becomes same as that of the Gray code bit g1.

When the Gray code bit g0 exhibits an error, at least one of the error signals er1 and er2 has an H level, and the output signal of the NOR circuit 31 has an L level. Consequently, the correction Gray code bit g0Z inverted from the Gray code bit g0 is output by operation of the XOR circuit 32e and the inverter circuit 33g. On the other hand, when both of the error signals er1 and er2 have L levels, the output signal of the NOR circuit 31 has an H level, and consequently, the correction Gray code bit g0Z has a phase same as that of the Gray code bit g0.

The Gray to binary conversion section 17 shown in FIG. outputs the correction Gray code bit g4Z as a binary code bit B4Z, outputs a value obtained by logically ORing the correction Gray code bits g4Z and g3Z as a binary code bit B3Z, outputs a value obtained by logically ORing the binary code bit B3Z and the correction Gray code bit g2Z as a binary code bit B2Z, outputs a value obtained by logically ORing the binary code bit B2Z and the correction Gray code bit g1Z as a binary code bit B1Z, and outputs a value obtained by logically ORing the binary code bit B1Z and the correction Gray code bit g0Z as a binary code bit B0Z. By such operation, the correction Gray code bits g0Z to g4Z is converted into binary code bits B0Z to B4Z.

Figure 1:
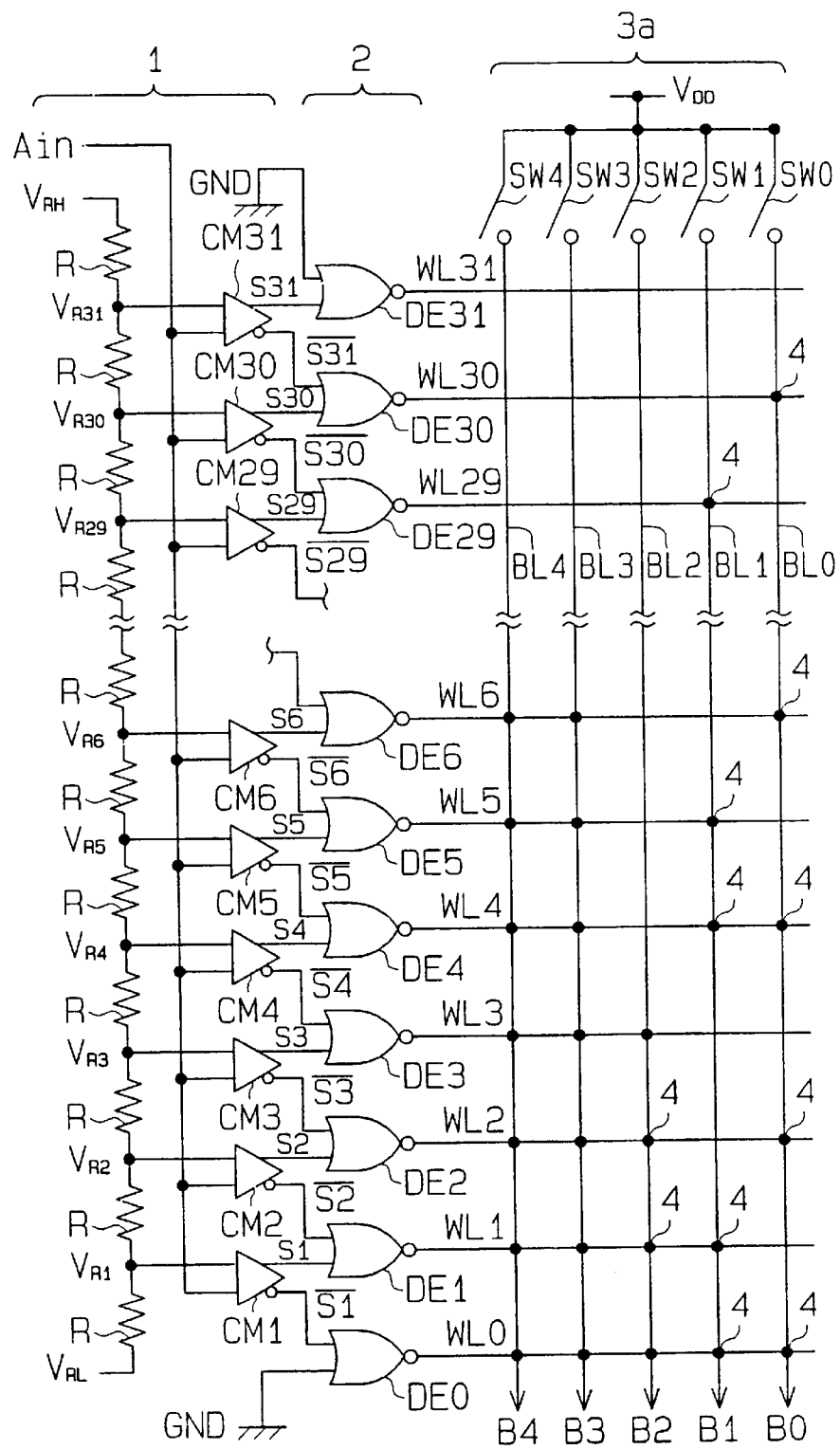
FIG. 1 is a circuit diagram of a first conventional A/D converter.
Figure 2:
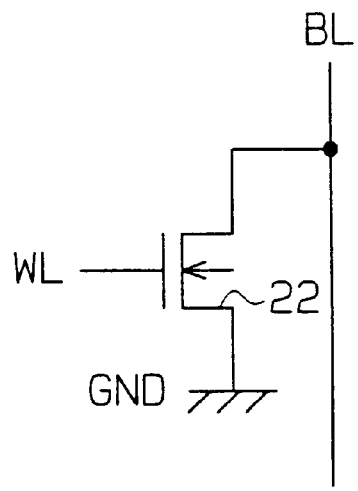
FIG. 2 is a circuit diagram showing a ROM cell of the A/D converter of FIG. 1.
Figure 3:
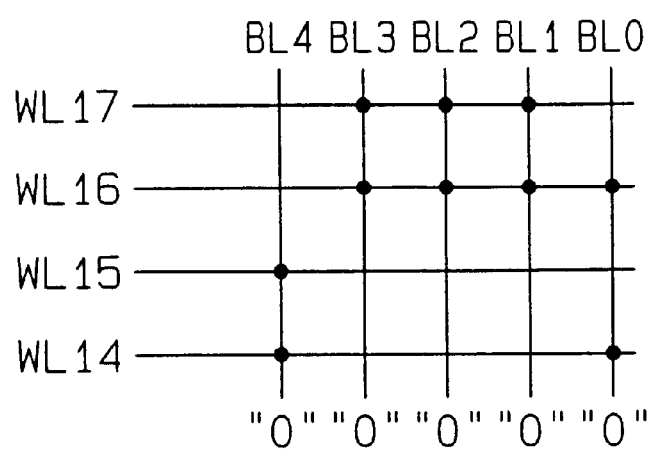
FIG. 3 is a diagrammatic view illustrating a connection of ROM cells in an encoding section of the A/D converter of FIG. 1.
Figure 4:
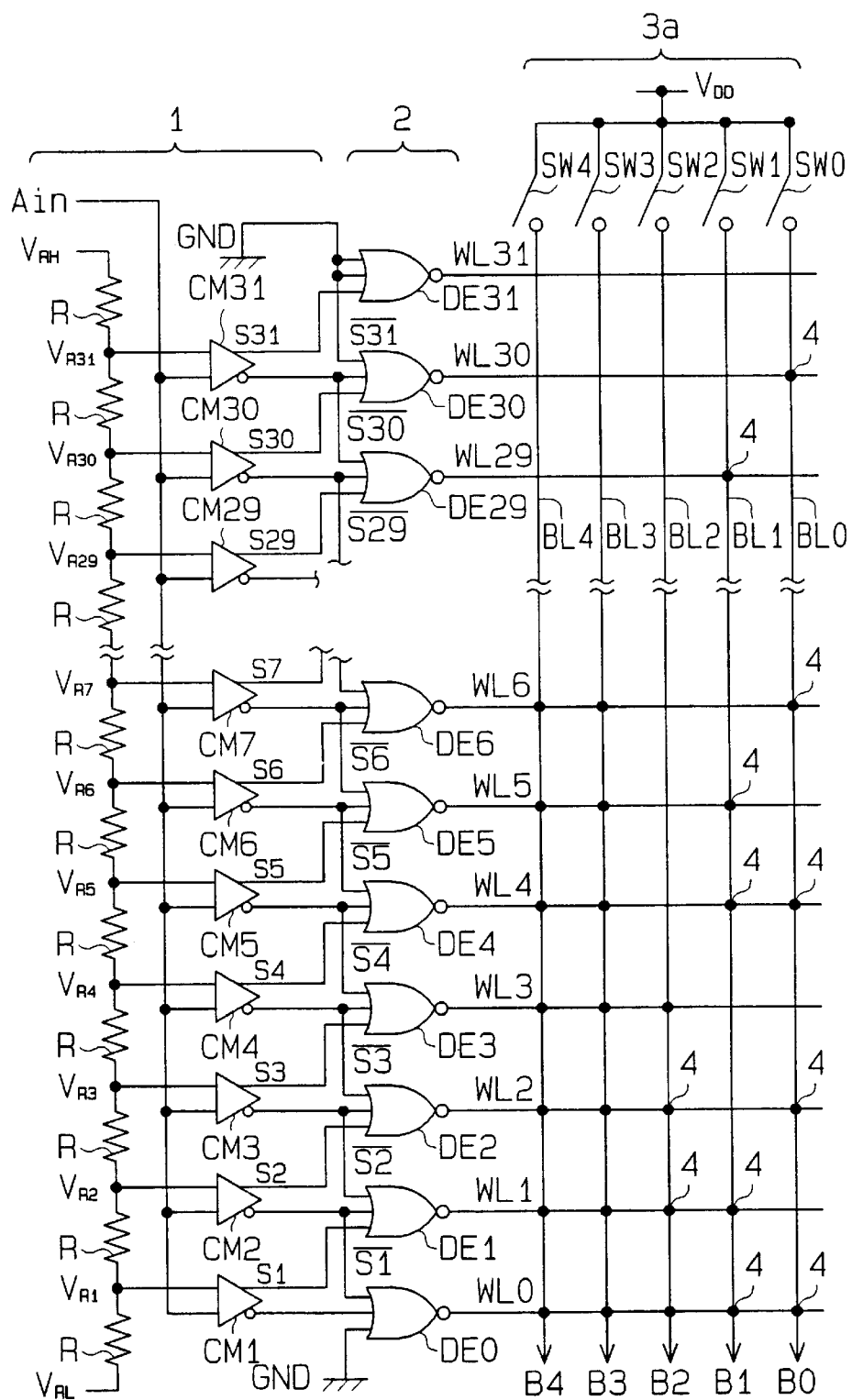
FIG. 4 is a circuit diagram of a second conventional A/D converter.
Figure 5:
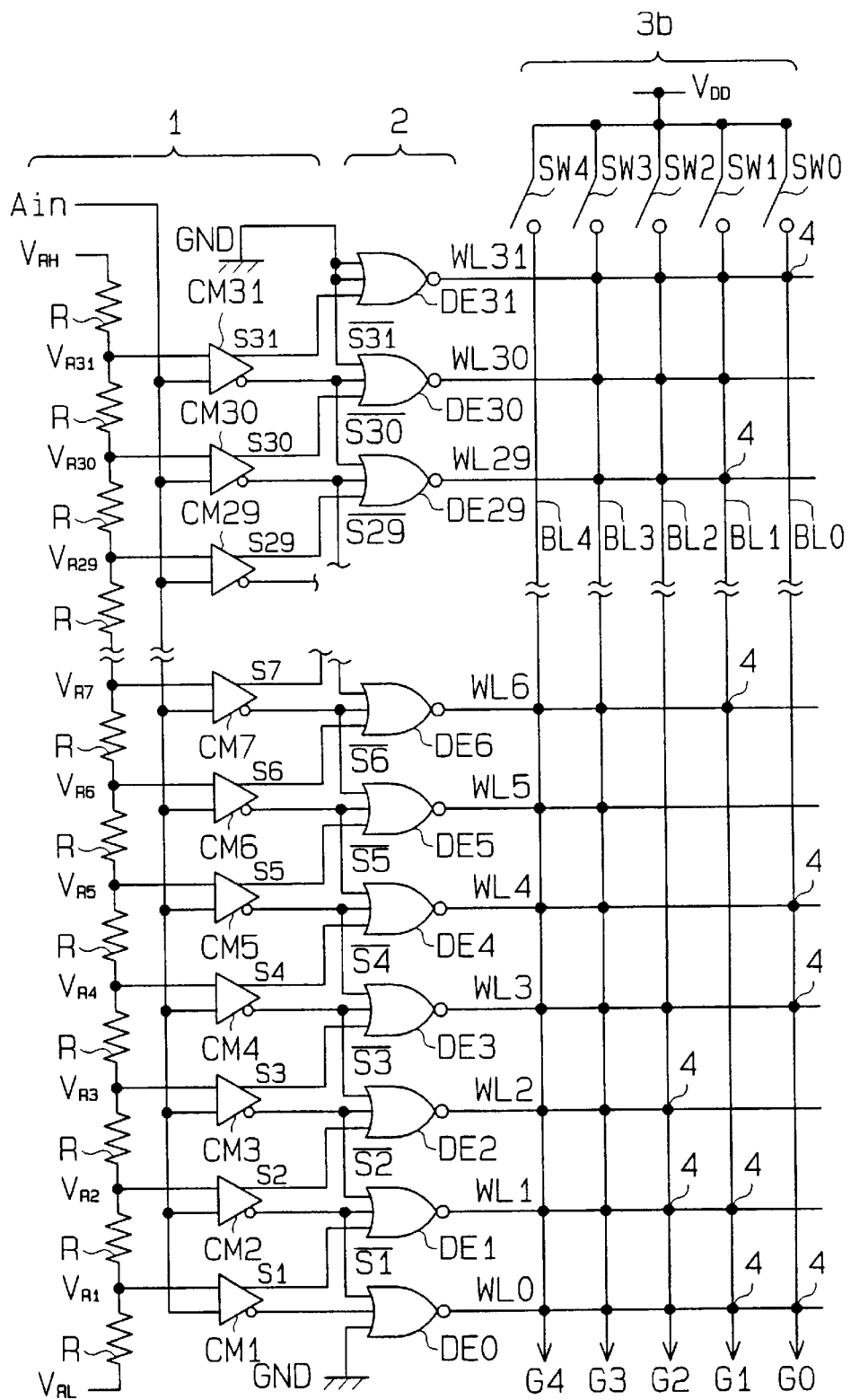
FIG. 5 is a circuit diagram showing another conventional A/D converter.
Figure 6:
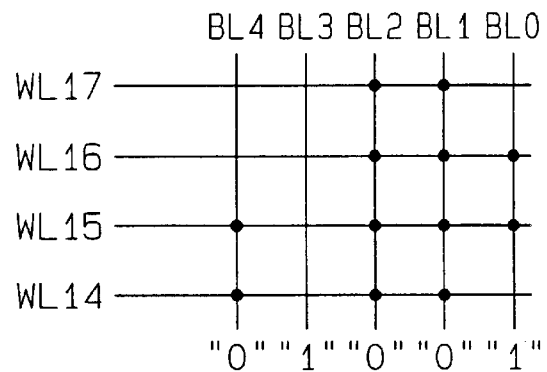
FIG. 6 is a circuit diagram showing a connection of ROM cells in an encoding section of the A/D converter of FIG. 5.

The encoder 100 of the present invention provides the following advantages:

(1) Even if the B1 type, the b2H type or the b2L type babble error is included in a thermometer code e1 to e31, the encoder produces a binary code B0Z to B4Z in which the babble error has been corrected;
(2) Since each of the logical boundary detection circuits of the first encoding section 11 is a 3-input circuit receiving odd-numbered ones of thermometer codes, the b1 type babble error is not corrected, but the b2H type babble error is corrected so as to become an error equivalent to that when the b1 type babble error is input, and the b2L type babble error is corrected to a likely value;
(3) Since each of the logical boundary detection circuits of the second and third encoding sections 12 and 13 is a 3-input circuit receiving the odd-numbered thermometer code bits of the thermometer code e1 to e31 and logically ORed values of the thermometer code, the b1 type babble error is not corrected, but the b2H type babble error is corrected so as to become equivalent to that when the b1 type babble error is input whereas the b2L type babble error is corrected to a likely value;
(4) Since the first encoding section 11 successively connects the ROM cells 21a to 21q, which operate in response to the output signals of the logical boundary detection circuits 18a to 18q, respectively, to the bit lines BL0a, BL0b, BL0Xa and BL0Xb, the front code bits g0a and g0b and the back code bits g0Xa and g0Xb decomposed from the Gray code bit g0 of the lowest order are produced;
(5) Since the second encoding section 12 successively connects the ROM cells 23a to 23i, which operate in response to the output signals of the logical boundary detection circuits 22a to 22i, respectively, to the bit lines BL1 and BL1X, the second Gray code bit g1 from the lowest order side and the back code bit g1X to the Gray code bit g1 are produced;
(6) Since the third encoding section 13 successively connects the ROM cells 23a to 23i, which operate in response to the output signals of the logical boundary detection circuits 24a to 24h, respectively, to the bit lines BL1 and BL1X, a signal equivalent to the binary code bit B2 obtained by shifting the second Gray code bit g1 and the back code g1X to the upper order side by a two-position distance in decimal value. Further, the logical boundary detection signals ga to gh are output from the logical boundary detection circuits 24a to 24h, respectively;
(7) The fourth encoding section 14 logically processes the logical boundary detection signals gb to gh produced by the third encoding section 13 to produce the third to fifth Gray code bits g2 to g4 from the lowest order side. Further, the fourth encoding section 14 produces the Gray code bit g0 of the lowest order by logically processing the Gray code bits g0a, g0b, g0Xa and g0Xb produced by the first encoding section 11;
(8) By logically processing the output signals of the first to third encoding sections 11, 12 and 13, the error signal production section 15 performs error detection based on the error detection principle illustrated in FIG. 9, and when an error is present, the error signal production section 15 produces the error signals er1 and er2 having an H level;
(9) The error correction section 16 performs correction for the Gray code go to g4 which includes the b1 type error based on the error signals er1 and er2 and the Gray code bits g1, g1X and g2 to produce a correction Gray code bit g0Z to g4Z;
(10) The Gray to binary conversion section 17 converts the correction Gray code g0Z to g4Z into a binary code B0Z to B4Z;
(11) The precharge circuits 38a to 38d are connected to the four bit lines BL0a, BL0b, BL0Xa and BL0Xb of the first encoding section 11, and by a Gray code bit having an L level output from one of the bit lines, the other three bit lines are precharged to the power supply $V_{CC}$ level. Accordingly, a precharging operation of the bit lines is performed in parallel to the encoding operation of the thermometer code bits e1 to e31 into the Gray code bits g0a, g0b, g0Xa and g0Xb;
(12) One of the precharge circuits 36 and 37 is connected to each of the bit lines BL1, BL1X, BL2a and BL2b of the second and third encoding sections 12 and 13, and the other bit lines are precharged based on a signal having an L level output from the one bit line. Accordingly, a precharging operation of the bit lines is performed in parallel to the encoding operation of the thermometer code bits e2 to e30 into the Gray code bits g1 and g1X and the binary cod bits g2a and g2b;

(13) Since the encoding operation of a thermometer code and the precharging operation of the bit lines are performed in parallel, there is no need of performing precharging in one cycle of the encoding operation. Accordingly, an increased encoding speed is achieved;

(14) Since, in the first encoding section 11, a bit line is divided into four lines and numbers of ROM cells equal to each other are connected to the individual bit lines, the number of ROM cells connected to each bit line is reduced. Accordingly, since the load to each ROM cell is reduced, the speed of the encoding operation is increased. Further, since, different from the encoding section shown in FIGS. 4 and 5, in the first embodiment of the present invention, ROM cells are connected one by one to the individual logical boundary detection circuits, the loads to the logical boundary detection circuits are equal to each other. Accordingly, occurrence of an error which arises from a difference in load condition among the logical boundary detection circuits is prevented;

(15) Comparing with the conventional encoder of the Gray code system shown in FIG. 7, the encoder of the first embodiment does not increase the number of elements and the circuit area because the numbers of logical boundary detection circuits and ROM cells are decreased comparing with the conventional encoder; and

(16) The error signals er1 and er2 produced by the error signal production section 15 are output from the error signal output terminals to the outside. Then, when a performance test of the A/D converter is performed, whether or not an error is included in thermometer code bits e1 to e31 is detected readily by detecting the error signals er1 and er2 using a testing apparatus. In a conventional performance test for an A/D converter, presence or absence of an error in a thermometer code is detected based on a digital output signal of a binary code. In other words, an error of a thermometer code is detected from a digital output signal by detecting a deterioration in linearity or S/N ratio of the digital output signal caused by an error of the thermometer code by performing fast Fourier transform processing for calculating a spectrum of frequency components or the like. Accordingly, in the present embodiment, the cost for a test is decreased because a performance test for an A/D converter is performed without performing complicated processing such as fast Fourier transform processing.

(Second Embodiment)

Figure 37:
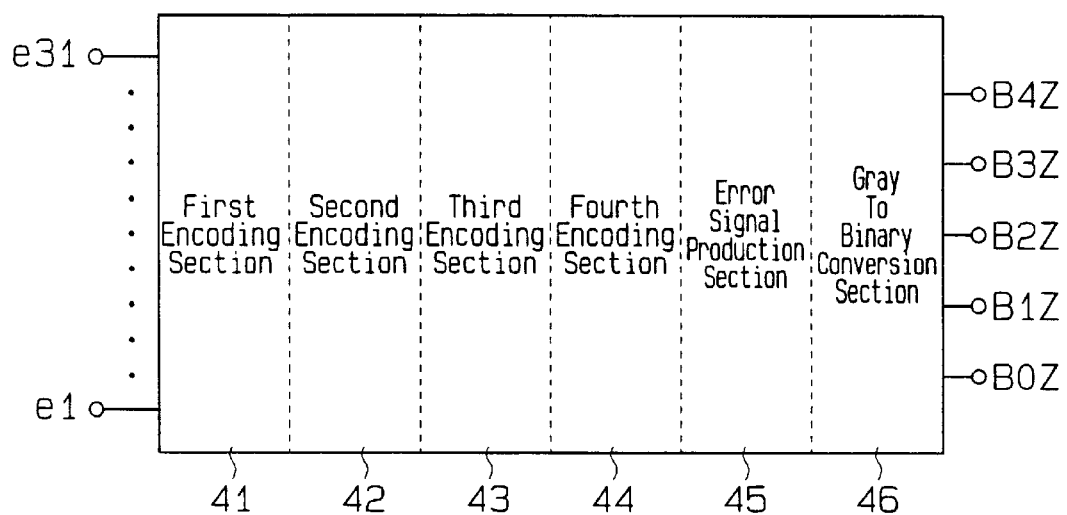
FIG. 37 is a block diagram showing a second embodiment of an A/D converter in accordance with the present invention.

FIG. 37 shows a second embodiment of an encoder embodying the present invention. The encoder of the second embodiment includes first to fourth encoding sections 41 to 44, an error signal production section 45, and a Gray to binary conversion section 46.

Figure 39:
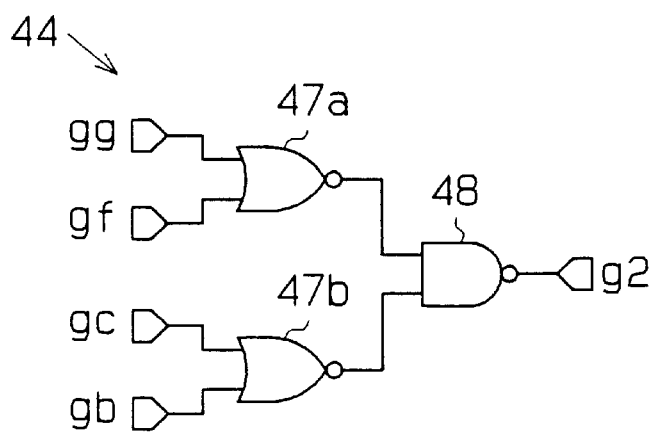
FIG. 39 is a circuit diagram showing a fourth encoding section of the A/D converter of FIG. 37.

The first to third encoding sections 41 to 43 and the error signal production section 45 have similar constructions to those of the first embodiment, and accordingly, description of them is omitted here. The fourth encoding section 44 shown in FIG. 39 logically processes logical boundary detection signals gb, gc, gf and gg output from the third encoding operation 43 by means of NOR circuits 47a and 47b and a NAND circuit 48 to produce a Gray code bit g2.

The Gray to binary conversion section 46 has functions of the error correction section 16 and the Gray to binary conversion section 17 of the first embodiment and produces binary code bits B0Z to B4Z based on signals produced by the first to fourth encoding sections 41 to 44 and the error signal production section 45.

Figure 38:
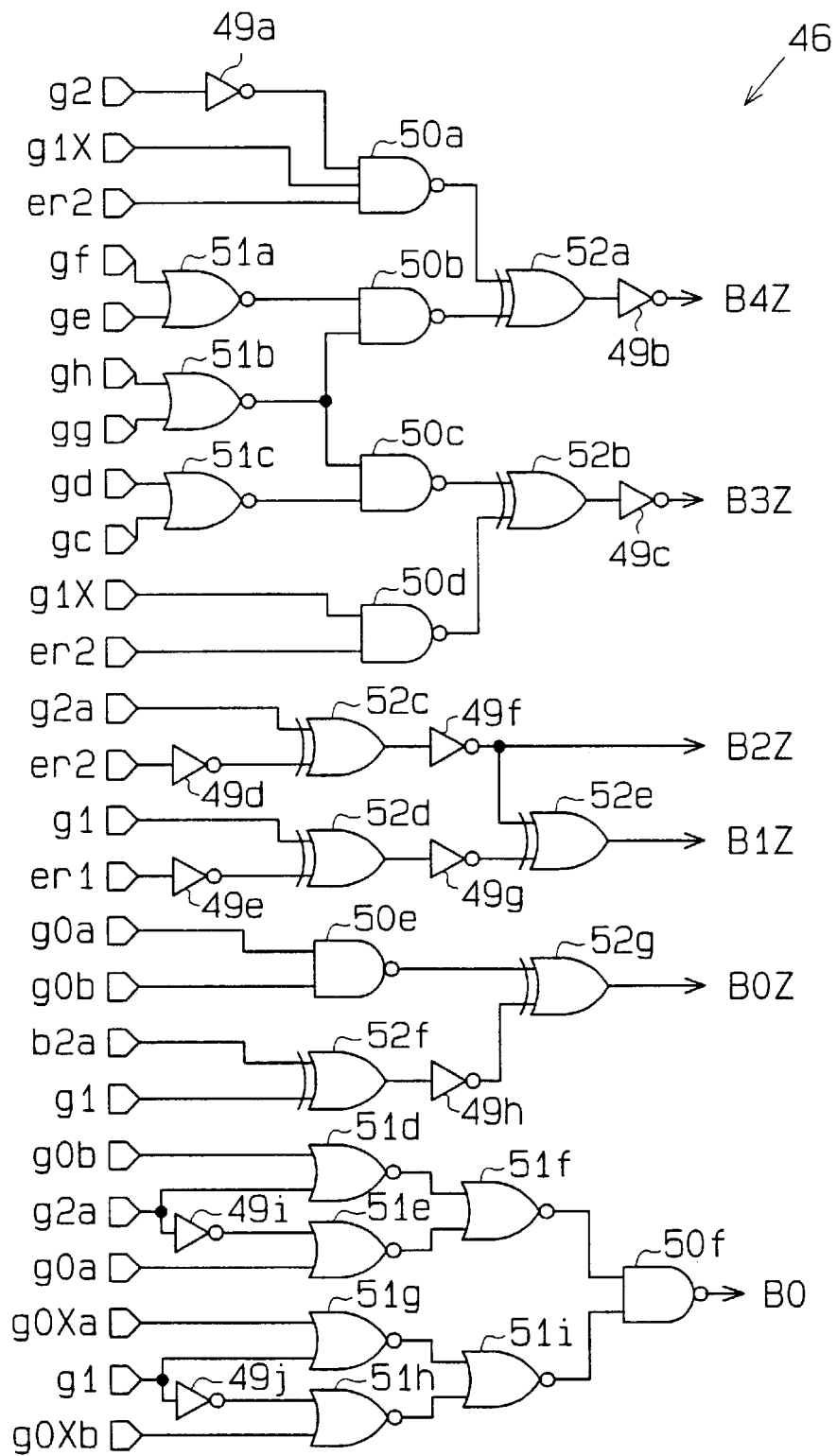
FIG. 38 is a circuit diagram showing a Gray to binary conversion section of the A/D converter of FIG. 37.

As shown in FIG. 38, the Gray code bit g2 is inverted by an inverter circuit 49a and input to a NAND circuit 50a, and a Gray code bit g1X and an error signal er2 are input to the NAND circuit 50a. An output signal of the NAND circuit 50a is input to an XOR circuit 52a.

The logical boundary detection signals gf and ge are input to a NOR circuit 51a while the logical boundary detection signals gh and gg are input to a NOR circuit 51b, and the logical boundary detection signals gd and gc are input to a NOR circuit 51c. Output signals of the NOR circuits 51a and 51b are input to a NAND circuit 50b, and an output signal of the NAND circuit 50b is input to the XOR circuit 52a. An output signal of the XOR circuit 52a is inverted by an inverter circuit 49b and output as a binary code bit B4Z. The NAND circuits 50a and 50b output binary code bits for production of the binary code bit B4Z whose error is corrected.

Output signals of the NOR circuits 51b and 51c are input to a NAND circuit 50c, and an output signal of the NAND circuit 50c is input to an XOR circuit 52b. The Gray code bit g1X and the error signal er2 are input to a NAND circuit 50d, and an output signal of the NAND circuit 50d is input to the XOR circuit 52b. An output signal of the XOR circuit 52b is inverted by an inverter circuit 49c and output as a binary code bit B3Z. The NAND circuits 50c and 50d output binary code bits for production of the binary code bit B3Z whose error is corrected.

The binary code bit g2a produced by the third encoding operation 43 is input to an XOR circuit 52c, and the error signal er2 is inverted by an inverter circuit 49d and input to the XOR circuit 52c. An output signal of the XOR circuit 52c is inverted by an inverter circuit 49f and is output as a binary code bit B2Z and also input to an XOR circuit 52e. The Gray code bit g1 is input to an XOR circuit 52d while the error signal er1 is inverted by an inverter circuit 49e and input to the XOR circuit 52d. An output signal of the XOR circuit 52d is inverted by an inverter circuit 49g and input to the XOR circuit 52e. A binary code bit B1Z is output from the XOR circuit 52e. Output signals of the inverter circuits 49f and 49g output binary code bits for production of the binary code bit B1Z.

The Gray code bits g0a and g0b produced by the first encoding section 41 are input to a NAND circuit 50e, and an output signal of the NAND circuit 50e is input to an XOR circuit 52g. The binary code bit g2a and the Gray code bit g1 are input to an XOR circuit 52f, and an output signal of the XOR circuit 52f is inverted by an inverter circuit 49h and input to the XOR circuit 52g. A binary code bit B0Z is output from the XOR circuit 52g. The NAND circuit 50e and the inverter circuit 49h output binary code bits for production of the binary code bit B0Z.

A binary code bit B0 is output based on the Gray code bits g0b, g0a, g0Xa, g0Xb and g1 and the binary code bit g2a by logical processing of inverter circuits 49i and 49j using NOR circuits 51d to 51i and a NAND circuit 50f. Even if signals produced by the first to third encoding sections 41 to 43 include an error originating from a babble error, the error is not corrected with the binary code bit B0.

Figure 41:
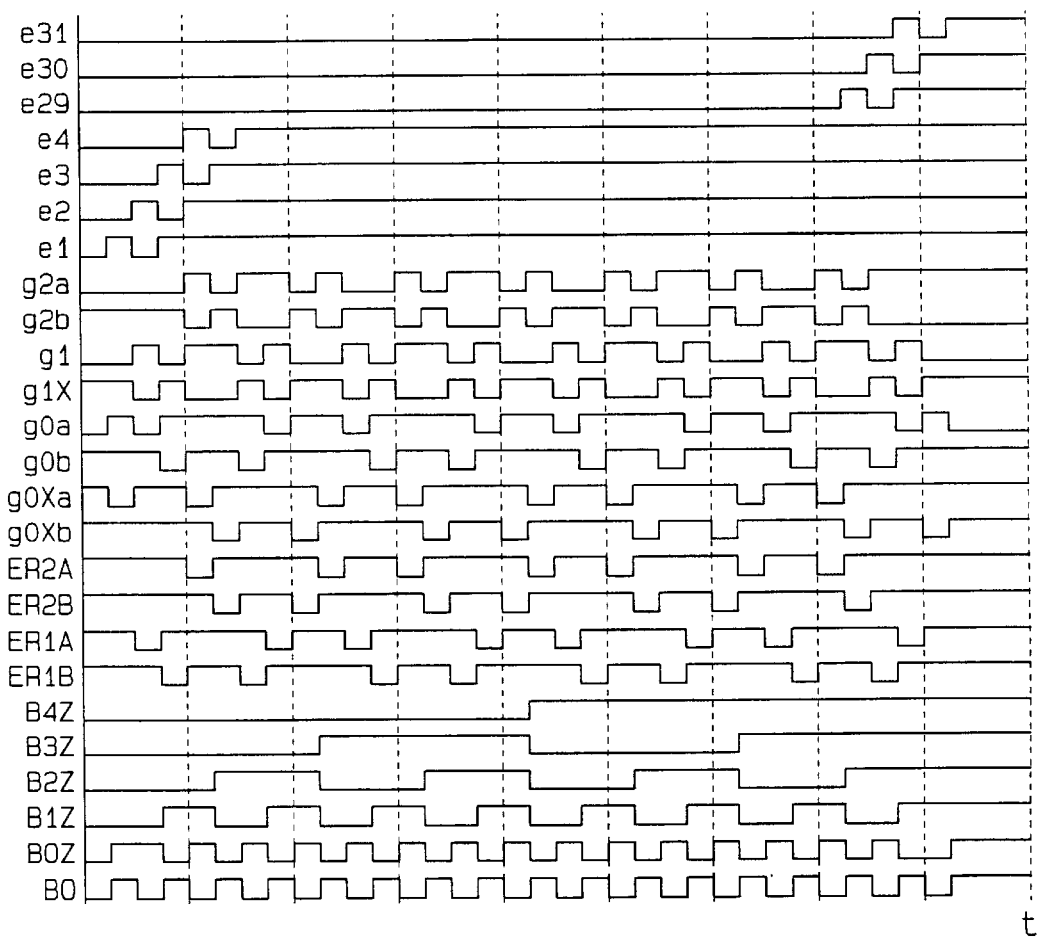
FIG. 41 is a waveform diagram illustrating operation of the present invention when a babble error of the b1 type is input.
Figure 42:
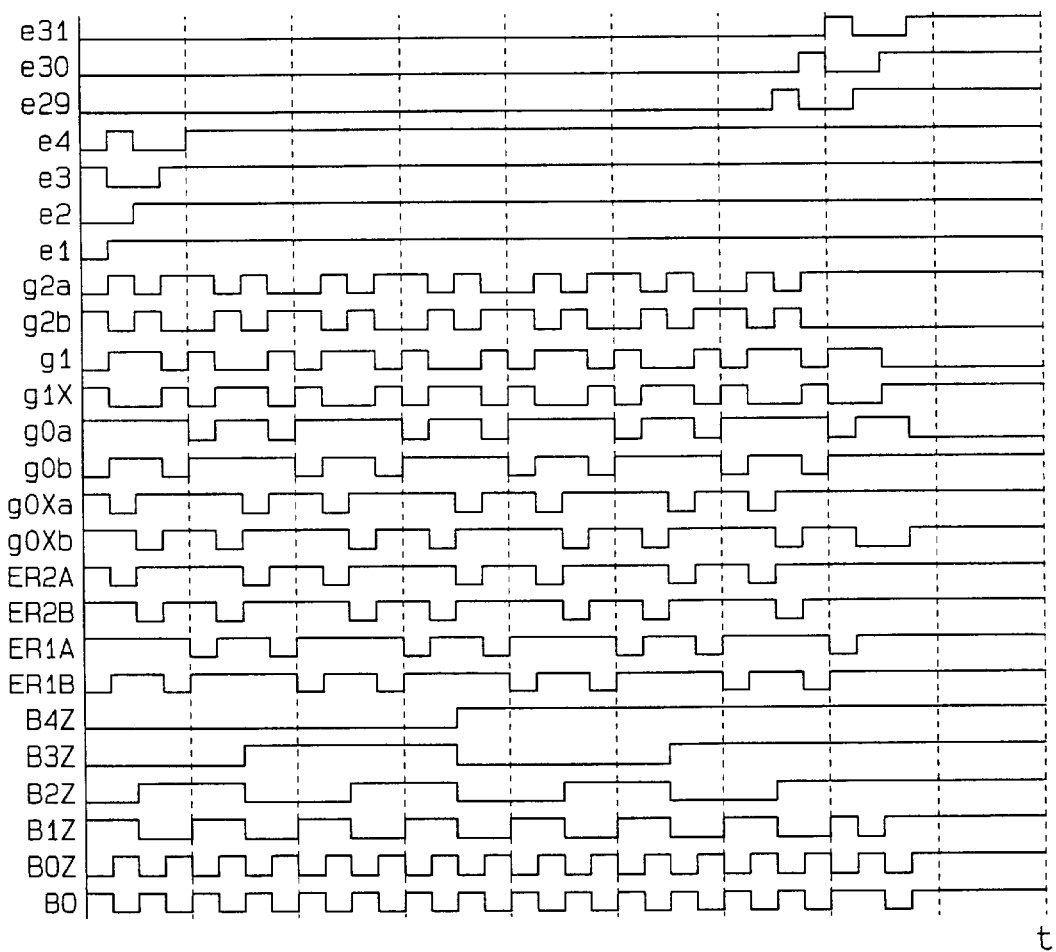
FIG. 42 is a waveform diagram illustrating operation of the present invention when a babble error of the b2H type is input.
Figure 43:
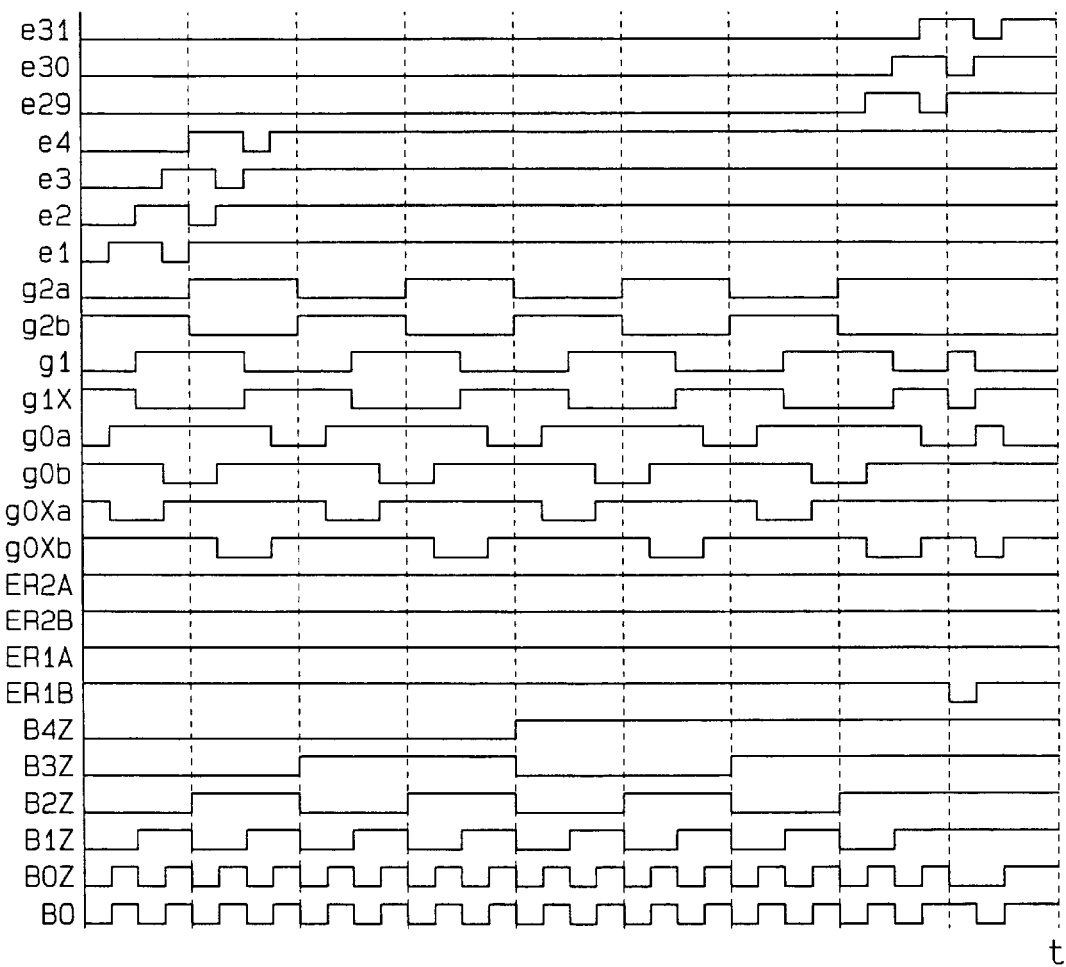
FIG. 43 is a waveform diagram illustrating operation of the present invention when a babble error of the b2L type is input.

Operation of the encoder according to the second embodiment will now be described. Similar to in the operation of the first to fourth encoding sections 11 to 14 of the first embodiment, if a thermometer code e1 to e31 which includes a babble error of the type b2H, as shown in FIG. 42, is input, then the first to fourth encoder sections 41 to 44 output signals the same as those when a thermometer code including a babble error of the type b1 shown in FIG. 41 is input. However, if a thermometer code e1 to e31 which includes a babble error of the b2L type as shown in FIG. 43, then the first to fourth encoder sections 41 to 44 output signals whose error has been corrected completely. On the other hand, if a thermometer code e1 to e31 which includes a babble error of the type b1 as shown in FIG. 41, then the first to fourth encoder sections 41 to 44 output signals which include the error.

The error signal production section 45 produces error signals er1 and er2 similar to those produced by the error signal production section 15 of the first embodiment.

Figure 40:
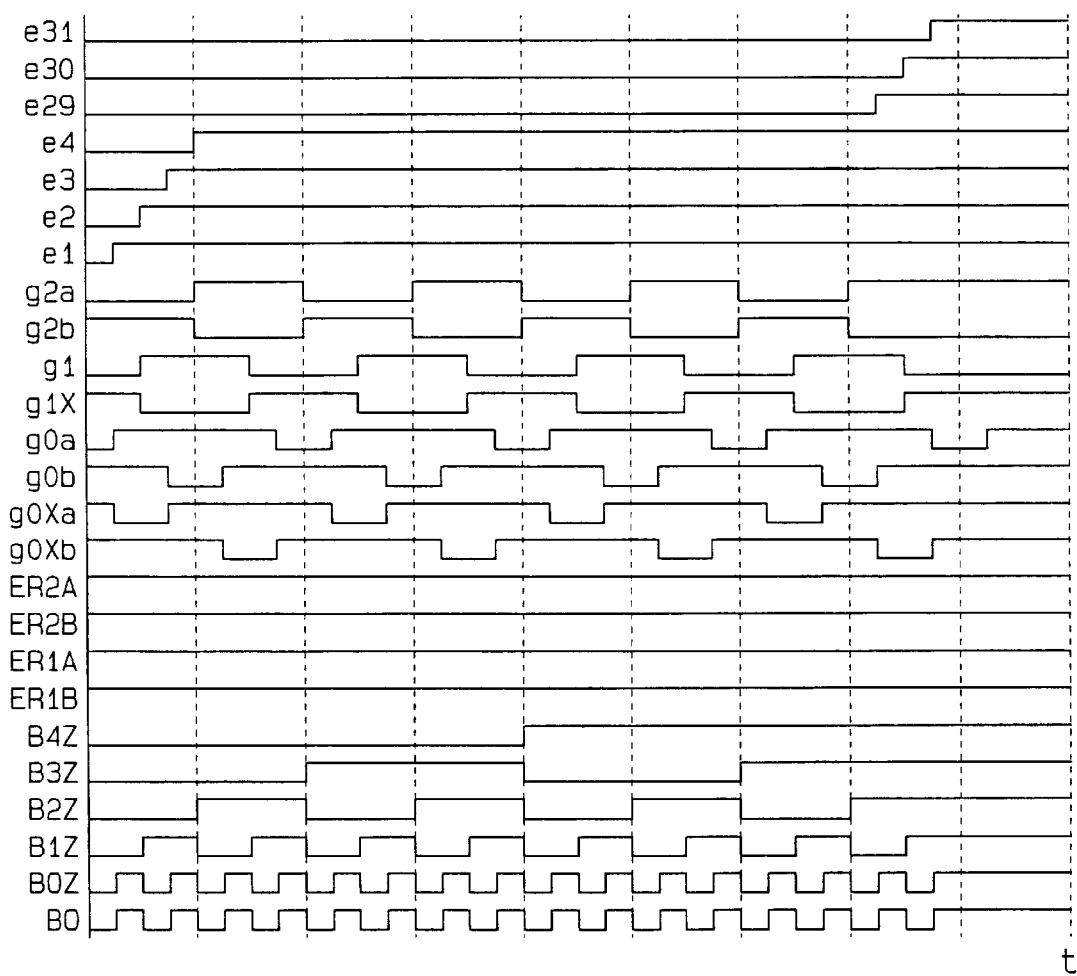
FIG. 40 is a waveform diagram illustrating operation (when no babble error is present) of the second embodiment of the present invention.

The Gray to binary conversion section 46 produces a binary code by logical processing of the NOR circuits 51a and 51b and the NAND circuit 50b based on logical boundary detection signals gf, ge, gh and gg. As shown in FIG. 40, since the error signal er2 exhibits an L level if the thermometer code e1 to e31 input includes no babble error, the output signal of the NAND circuit 50a exhibits an H level. Consequently, a signal having a same phase as that of an output signal of the NAND circuit 50b is output as the binary code bit B4Z.

However, as shown in FIGS. 38 and 41, if the error signal er2 exhibits an H level and the Gray code bit g2 exhibits an L level while the Gray code bit g1X exhibits an H level, then the output signal of the NAND circuit 50b is inverted and output as the binary code bit B4Z. When the Gray code bits g2 and g1X and the error signal er2 have any other conditions than those described above, a signal having a phase same as that of the output signal of the NAND circuit 50b is output as the binary code bit B4Z.

A binary code is produced by logical processing of the NOR circuits 51b and 51c and the NAND circuit 50c based on the logical boundary detection signals gh, gg, gd and gc, and if the error signal er2 has an L level, then a signal having a phase same as that of the output signal of the NAND circuit 50c is output as the binary code bit B3Z.

However, as shown in FIGS. 38 and 41, if the error signal er2 and the Gray code bit g1X both exhibit H levels, then the output signal of the NAND circuit 50c is inverted and output as the binary code bit B3Z.

The binary code bit B2Z is output as a signal having a same phase as that of the binary code bit g2a when the error signal er2 has an L level, but when the error signal er2 has an H level, an inverted signal of the binary code bit g2a is output.

The binary code bit B1Z is an inverted signal of the Gray code bit b1 when the binary code bit B2Z has an H level and the error signal er1 has an L level, but when the error signal er1 has an L level, the binary code bit B1Z is a signal having a phase same as that of the Gray code bit g1. On the other hand, when the binary code bit B2Z has an L level and the error signal er1 has an L level, the binary code bit B1Z is a signal having a phase same as that of the Gray code bit g1, but when the error signal er1 has an H level, the binary code bit B1Z is an inverted signal of the Gray code bit g1.

The binary code bit B0Z has an H level if the Gray code bits g0a and g0b both have H levels while both of the Gray code bit g1 and the binary code bit g2a have H levels or L levels but has an L level if at least one of the Gray code bits g0a and g0b has an L level.

When one of the Gray code bit g1 and the binary code bit g2a has an H level and the other has an L level, if the Gray code bits g0a and g0b both have H levels, then the binary code bit B0Z has an L level, but if at least one of the Gray code bits g0a and g0b has an L level, then the binary code bit B0Z has an H level.

By such operation, even if the thermometer code e1 to e31 includes a babble error, binary code bits B0Z to B4Z in which the error has been corrected are output as shown in FIGS. 40 to 43.

Figure 44:
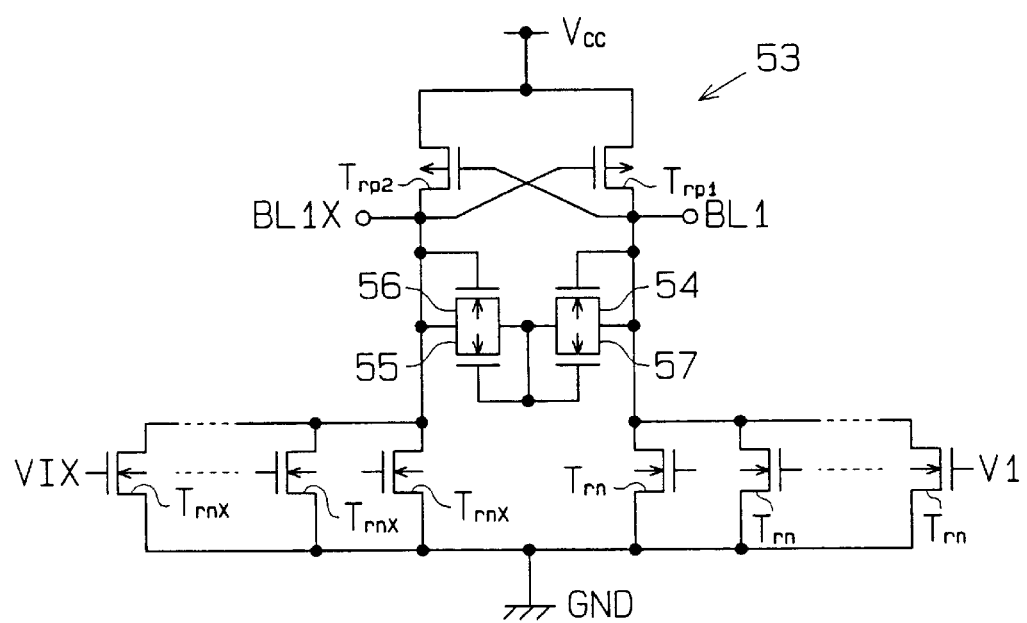
FIG. 44 is a circuit diagram showing a precharge circuit of the A/D converter of FIG. 37.

A precharge circuit 53 shown in FIG. 44 is connected to bit lines BL1 and BL1X and bit lines BL2a and BL2b of the second and third encoding sections 42 and 43. The precharge circuit 53 includes N-channel MOS transistors 54 to 57 in addition to the precharge circuit 36. The drain and the gate of the transistor 54 are connected to the bit line BL1 while the drain and the gate of the transistor 56 are connected to the bit line BL1X. The source of the transistor 57 is connected to the bit line BL1 while the source of the transistor 55 is connected to the bit line BL1X. The sources of the transistors 54 and 56 and the drains of the transistors 55 and 57 are connected to each other and connected also to the gates of the transistors 55 and 57.

In the precharge circuit 53, when an H level is provided to the bit line BL1 and an L level is provided to the bit line BL1X, then the transistors 54 and 55 are turned on while the transistor 56 and 57 are turned off. In this instance, since the drains and the gates of the transistors 54 and 55 are connected to each other, the transistors 54 and 55 operate as diodes, and the potential difference between the bit lines BL1 and BL1X is clamped to a threshold value of the transistors 54 and 55.

On the other hand, if the bit line BL1 has an L level and the bit line BL1X has an H level, then the transistors 54 and 55 are turned off while the transistors 56 and 57 are turned on. In this instance, since the drains and the gates of the transistor 56 and 57 are connected to each other, the transistor 56 and 57 operate as diodes, and the potential difference between the bit lines BL1 and BL1X is clamped to the threshold value of the transistor 56 and 57. The precharge circuit 53 may be used also as a precharge circuit for the bit lines of the second and third encoding sections 12 and 13 of the first embodiment of the present invention.

The second embodiment of the encoder achieves, in addition to the effects achieved by the encoder of the first embodiment, the following effects:

(1) Binary code bits B0Z to B4Z are produced in parallel to error correction based on signals produced by the first to fourth encoding sections 41 to 44 without producing correction Gray code bits G0Z to G4Z which are produced in the first embodiment. Accordingly, since the binary code bits B0Z to B4Z are produced without the necessity for such a Gray to binary conversion section 17, as shown in FIG. 25, the circuit scale is reduced;

(2) While, in the Gray to binary conversion section 17 shown in FIG. 25, the number of stages of logic circuits increases toward the lower bit side of the binary code bits B0Z to B4Z to decrease the outputting speed and the operation speed of the encoder is determined by the outputting speed of the least significant bit, in the second embodiment, since the binary code bits B0Z to B4Z are produced without using the Gray to binary conversion section 17, the operation speed of the encoder is increased;

(3) The Gray to binary conversion section 46 produces binary code bits B0Z to B4Z based on three or less decomposed Gray code bits and decomposed binary code bits from a decomposed Gray code and a decomposed binary code produced by the first to fourth encoding sections 41 to 44. Accordingly, since lower order binary code bits are produced in parallel to production of upper order binary code bits, the operation speed of the encoder is increased; and (4) Since the amplitude of a bit line precharged by the precharge circuit 53 is clamped to a value equal to or lower than a threshold value of two N-channel MOS transistors, the lowering speed of the bit line potential by a ROM cell is improved. Accordingly, the operation speed of the encoder is improved.

The clamp level of each bit line is adjusted by varying the number of stages of N-channel MOS transistors to be connected in diode connection. Further, PN junction diodes may be used in place of the N-channel MOS transistors.

(Third Embodiment)

The third embodiment is constructed such that the error correction operation of the first embodiment is performed using a computer which operates in accordance with a program, and is described as an encoder which produces digital signals bit B0Z to B3Z of a binary code of 3 bits for convenience of description.

Figure 45:
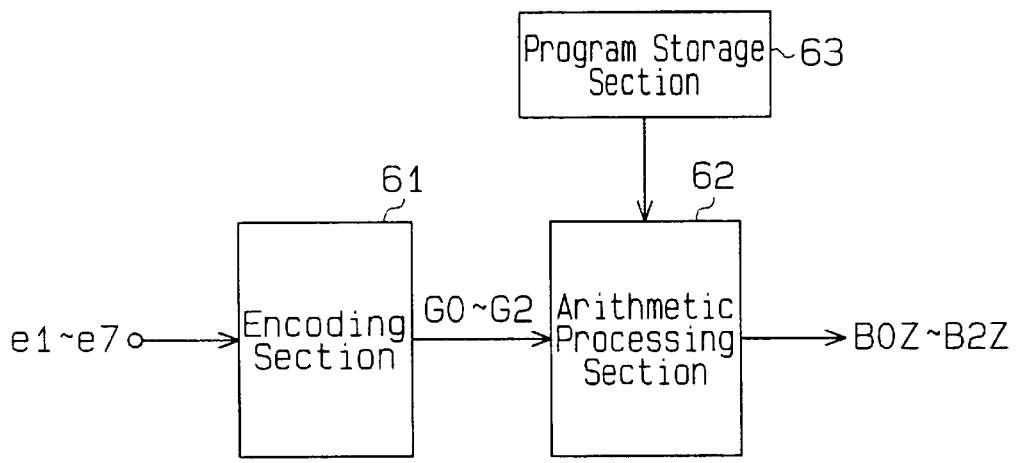
FIG. 45 is a block diagram showing an encoder of a third embodiment of the present invention.

FIG. 45 shows an outline of the encoder of the third embodiment. A thermometer code e1 to e7 is input to an encoding section 61. The encoding section 61 produces and outputs digital signals G0 to G2 of a Gray code of 3 bits based on the thermometer code e1 to e7. The encoding section 61 is a modification, for example, to the encoder shown in FIGS. 5 or 7 such that it has a 3-bit construction, and does not have the function of correcting a babble error included in the thermometer code e1 to e7.

The Gray code bits G0 to G3 output from the encoding section 61 is input to an arithmetic processing section 62 in the form of a computer. A program storage section 63 in which a processing program is stored is connected to the arithmetic processing section 62.

The arithmetic processing section 62 operates in accordance with the processing program and operates to: decompose lower order bits of the Gray code bits G0 to G2; determine whether or not the decomposed lower order bits and the upper order bits have a particular relationship to detect whether or not the Gray code bits produced have some error; correct the detected error; and convert the corrected Gray code to digital signals B0 to B2 of a binary code.

The arithmetic processing section 62 performs error correction operation by one of the following first to third operations in accordance with the program stored in the program storage section 63.

<First Operation>

Figures 46, 47:
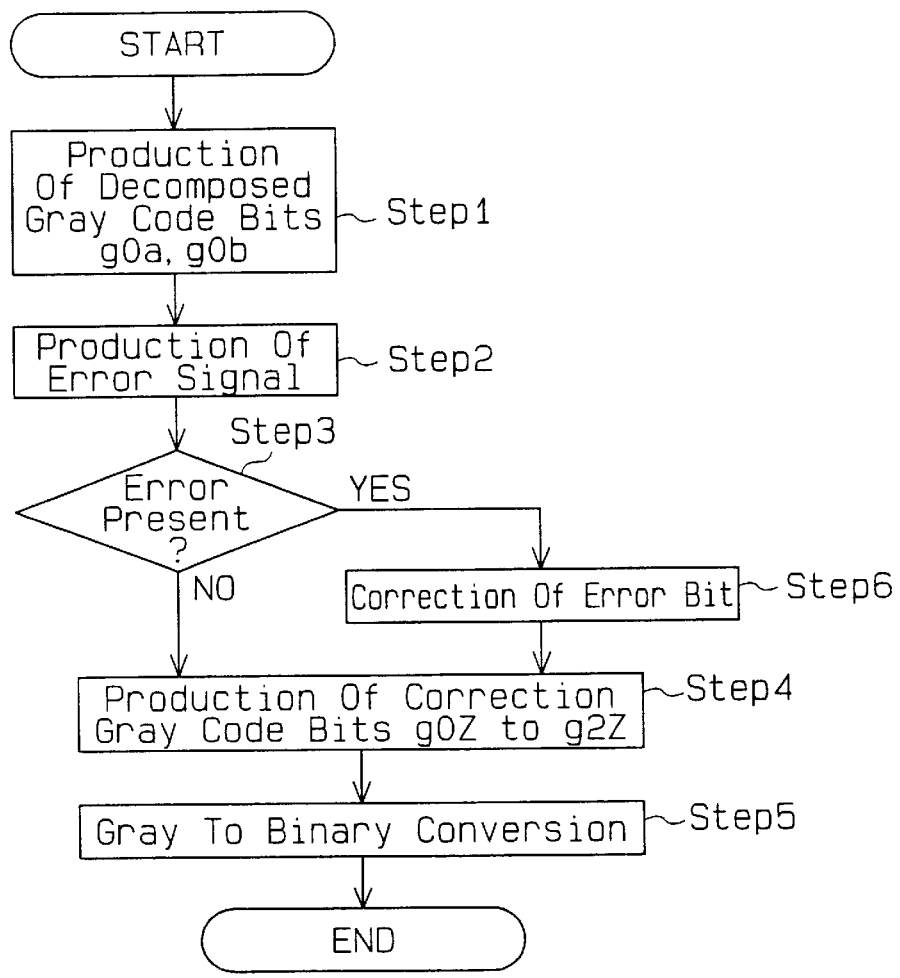
FIG. 46 is a flow chart illustrating a first operation of the third embodiment.
FIG. 47 is a diagrammatic view illustrating a decomposition Gray code of the first operation.

FIGS. 46 to 48 illustrate a first operation of the arithmetic processing section 62. When a Gray code G0 to G2 is input from the encoding section 61 to the arithmetic processing section 62, the arithmetic processing section 62 decomposes the Gray code bit G0 of the lowest order into decomposed Gray codes g0a and g0b of a front code similar to that in the first embodiment (step 1).

In the program storage section 63, codes when the Gray code bit G0 of the lowest order of a normal Gray code bit G0 to G2 is decomposed into decomposed Gray code bits g0a and g0b and binary codes corresponding to the Gray codes are stored in advance as shown in FIG. 47.

When the decomposed Gray code bit g0b is "1" in FIG. 47, the Gray code bit G2 is "0" without fail, but when the decomposed Gray code bit g0a is "1", the Gray code bit G2 is "1" without fail. Consequently, presence or absence of an error is detected depending upon whether or not the conditions are satisfied.

If a normal Gray code G0 to G2 is input, decomposed Gray code bits g0a and g0b and Gray code bits G1 and G2 in a normal case illustrated in FIG. 48 are obtained. Then, the arithmetic processing section 62 produces error signals based on the decomposed Gray code bits g0a and g0b and the Gray code bit G2 (step 2). In the error signal production processing, error signals Ea and Eb are calculated in accordance with the following expressions:

$Ea = g0a \times /G2$ $Eb = G0b \times G2$ where x denotes logical ANDing.

In particular, the error signal Ea "1" is generated by logically ANDing the decomposed Gray code bit g0a "1" and the Gray code bit /G2 "1", and the error signal Eb "1" is generated by logically ANDing the decomposed Gray code bit g0b "1" and the Gray code bit G2 "0". Then, if the Gray code bits obtained are normal, then the error signals Ea and Eb are both "0", but if an error is present, then one of the error signals Ea and Eb exhibits "1".

Thereafter, the arithmetic processing section 62 discriminates whether or not at least one of the error signals Ea and Eb is "1" to discriminate presence or absence of an error (step 3).

If both of the error signals Ea and Eb are "0" and it is discriminated that there is no error, then the arithmetic processing section 62 determines the input Gray code G0 to G2 as a correction Gray code g0Z to g2Z (step 4).

Then, the arithmetic processing section 62 performs Gray to binary conversion of the correction Gray code g0Z to g2Z to produce a correction binary code B0Z to B2Z (step 5) and ends its error correction processing. This Gray to binary conversion is performed by the arithmetic processing section 62 performing the logical processing which is performed by the logic circuit shown in FIG. 25 in the first embodiment of the present invention.

On the other hand, if it is discriminated in step 3 that at least one of the error signals Ea and Eb is "1" and there is an error, then the arithmetic processing section 62 performs correction of the error bit (step 6).

In this correction operation, processing represented by the following expressions is performed for the decomposed Gray code bits g0a, g0b and G2 with which the error signal Ea or Eb is "1" as shown in FIG. 48 to produce correction Gray code bits g0Z and g2Z:

$g2Z = (Ea+Eb)@G2$ $g0Z = (Ea+Eb)@(g0a+g0b)$ where + represents logical ORing and @ represents logical exclusive ORing.

In particular, if at least one of the error signals Ea and Eb is "1", then Gray code bit G2 is inverted to produce the correction Gray code bit g2Z, and the decomposed Gray code g0a or g0b which exhibits "1" is inverted to produce the correction Gray code bit g0Z. In other words, any bit which is discriminated to be an error is inverted to produce correction Gray code bits g0Z and g2Z.

Then, the Gray code bit G1 is determined as it is as the correction Gray code bit g1Z, thereby completing production of the correction Gray code g0Z to g2Z, and then Gray to binary conversion is performed to produce a binary code B0Z to B2Z (steps 4 and 5).

By such operations, the binary code bits B0Z to B2Z have values more likely than those of the non-corrected binary code bits B0 to B2 which are produced based on the non-corrected Gray code bits G0 to G2.

<Second Operation>

FIGS. 49 to 51 illustrate second operation of the arithmetic processing section 62. When a Gray code G0 to G2 is input from the encoding section 61 to the arithmetic processing section 62, the arithmetic processing section 62 decomposes the Gray code bit G0 of the lowest order into decomposed Gray code bits g0Xa and g0Xb of a back code similar to that in the first embodiment (step 11).

In the program storage section 63, codes when the Gray code bit G0 of the lowest order of each of normal Gray code bits G0 to G2 is decomposed into decomposed Gray codes g0Xa and g0Xb and binary codes corresponding to the Gray codes are stored in advance as shown in FIG. 50.

When the decomposed Gray code bit g0Xa is "1" in FIG. 50, the Gray code bit G1 is "0" without fail, and when the decomposed Gray code bit g0Xb is "1", the Gray code bit G1 is "1" without fail. Consequently, presence or absence of an error is detected depending upon whether or not the conditions thus described are satisfied.

If the Gray code G0 to G2 input is normal, then decomposed Gray code bits g0Xa and g0Xb and Gray code bits G1 and G2 in an ordinary case illustrated in FIG. 51 are obtained.

Then, the arithmetic processing section 62 performs production processing for an error signal based on the decomposed Gray code bits g0Xa and g0Xb and the Gray code bit G1 (step 12). In this error signal production processing, error signals EXa and EXb are calculated in accordance with the following expressions:

$$EXa = g0Xa \times G1$$

$$EXb = g0Xb \times /G1$$

where x represents logical ANDing.

In particular, the error signal EXa "1" is generated by logically ANDing the decomposed Gray code bit g0Xa "1" and the Gray code bit G1 "1" while the error signal EXb "1" is generated by logically ANDing the decomposed Gray code bit g0Xb "1" and the Gray code bit /G1 "1". If both of the Gray code bits are normal, then the error signals EXa and EXb both exhibit "0", but if an error is present, then one of the error signal EXa and EXb exhibits "1".

Then, the arithmetic processing section 62 discriminates whether or not at least one of the error signals EXa and EXb is "1" to discriminate presence or absence of an error (step 13).

If both of the error signals EXa and EXb are "0" and it is discriminated that there is no error, then the arithmetic processing section 62 determines the Gray code bits G0 to G2 as correction Gray code bits G0Z to g2Z (step 14).

Thereafter, the arithmetic processing section 62 performs Gray to binary conversion of the correction Gray code bits g0Z to g2Z to produce binary code bits B0Z to B2Z (step 15), thereby ending the error correction processing.

On the other hand, if it is discriminated in step 13 that at least one of the error signals EXa and EXb is "1" and there is an error, then the arithmetic processing section 62 performs correction of the error bit (step 16).

In this correction processing, processing represented by the following expressions is performed for the decomposed Gray code bits g0Xa, g0Xb and G1 with which the error signal EX1 or EXb is "1" to produce correction Gray code bits g0z and g1Z as shown in FIG. 51.

$$g1Z = (EXa + EXb)@G1$$

$$g0Z = /[(EXa + EXb)@(g0Xa + g0Xb)]$$

where + represents logical ORing, @ represents logical exclusive ORing, and/(bar) represents logical inversion.

In particular, if at least one of the error signals EXa and EXb is "1", then the Gray code bit G1 is inverted to produce the correction Gray code bit g1Z, and the decomposed Gray code bit g0Xa or g0Xb which is "1" is inverted to produce the correction Gray code bit g0Z. In other words, any bit which is an error is inverted to produce correction Gray code bits g0Z and g1Z. Then, the Gray code bit G2 is determined as it is as a correction Gray code bit g2Z, thereby completing production of the correction Gray code g0Z to g2Z, and Gray to binary conversion is performed to produce the binary code B0Z to B2Z (steps 14 and 15).

By such operation, as shown from FIG. 51, the binary code bits B0Z to B2Z have values more likely than those of the non-corrected binary code bits B0 to B2 which are produced based on the non-corrected Gray code bits G0 to G2.

<Third Operation>

Figure 52:
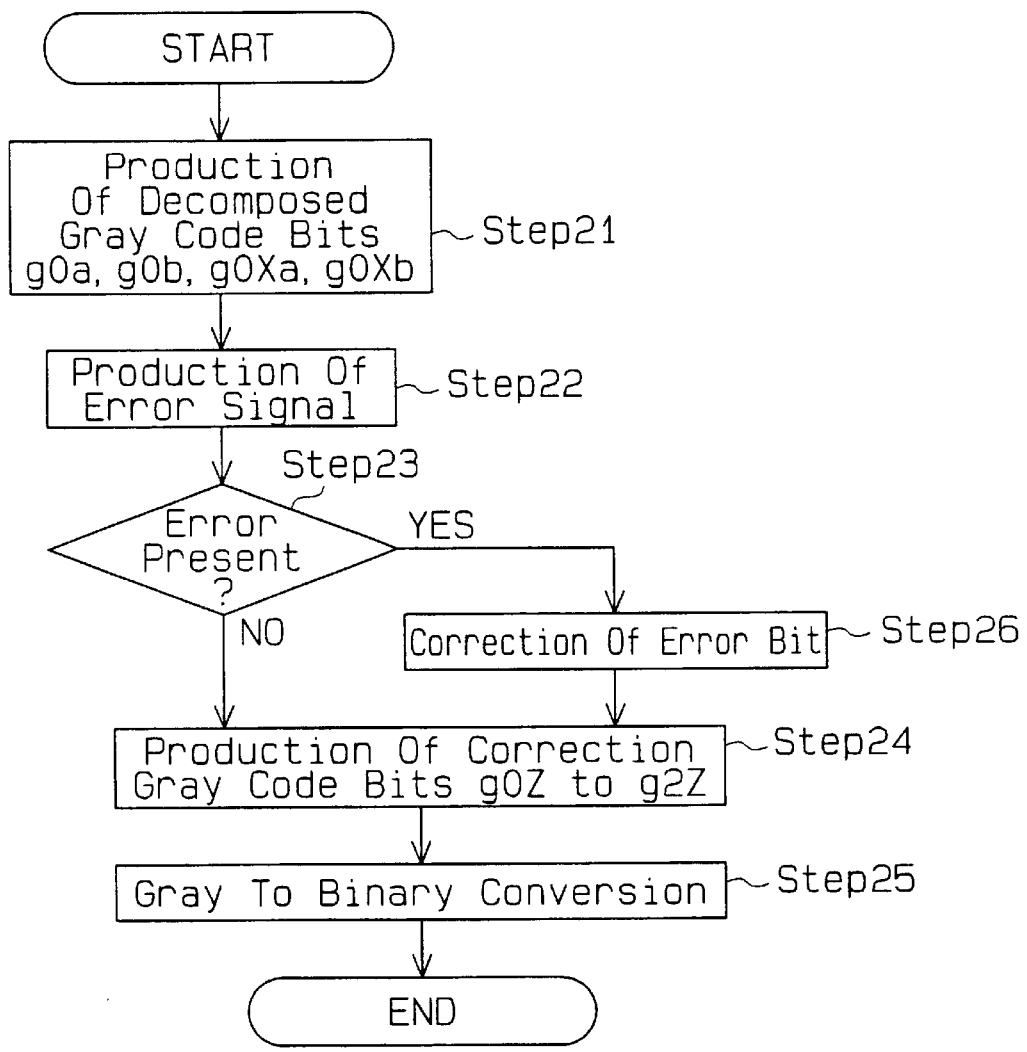
FIG. 52 is a flow chart illustrating a third operation of the third embodiment.

FIGS. 52 to 54 illustrate third operation of the arithmetic processing section 62. When a Gray code G0 to G2 is input from the encoding section 61 to the arithmetic processing section 62, the arithmetic processing section 62 decomposes the Gray code bit G0 of the lowest order into decomposed Gray code bits g0a and g0b of a front code and decomposed Gray code bits g0Xa and g0Xb of a back code similar to those in the first embodiment (step 21).

In the program storage section 63, codes when the Gray code bit G0 of the lowest order of each of normal Gray code bits G0 to G2 is decomposed into decomposed Gray code bits g0a, g0b, g0Xa and g0Xb and binary codes corresponding to the Gray codes are stored in advance as shown in FIG. 53.

When the decomposed Gray code bit g0b is "1" in FIG. 53, the Gray code bit G2 is "1" without fail, and when the decomposed Gray code bit g0a is "1", the Gray code bit G2 is "1" without fail. Further, when the decomposed Gray code bit g0Xa is "1", the Gray code bit G1 is "0" without fail, and when the decomposed Gray code bit g0Xb is "1", the Gray code bit G1 is "1" without fail. Consequently, presence or absence of an error is detected depending upon whether or not those conditions are satisfied.

If a normal Gray code G0 to G2 is input, then decomposed Gray code bits g0a, g0b, g0Xa and g0Xb and Gray code bits G1 and G2 in a normal case illustrated in FIG. 54 are obtained. Then, the arithmetic processing section 62 produces an error signal based on the decomposed Gray codes g0Xa and g0Xb and the Gray code bits G1 and G2 (step 22). In this error signal production processing, error signals Er and ErX are calculated in accordance with the following expressions:

$$Er = (g0a \times /G2) + (g0b \times G2 = 1)$$

$$ErX = (g0Xa \times G1) + (g0Xb \times /G1)$$

where x represents logical ANDing, + represents logical ORing, and/(bar) represents logical inversion.

If all of the Gray code bits are normal, then both of the error signals Er and ErX exhibit "0", but if an error is present, one of the error signals Er and ErX exhibits "1".

Then, the arithmetic processing section 62 discriminates presence or absence of an error depending upon whether or not at least one of the error signals Er and ErX is "1" (step 23).

If it is discriminated that both of the error signals Er and ErX are "0" and there is no error, then the arithmetic processing section 62 determines the input Gray code G0 to G2 as a correction Gray code g0Z to g2Z (step 24).

Then, the arithmetic processing section 62 performs Gray to binary conversion of the correction Gray code g0Z to g2Z to produce a binary code B0Z to B2Z (step 25), thereby ending the error correction operation.

On the other hand, if it is discriminated in step 23 that at least one of the error signals Er and ErX is "1" and there is an error, then the arithmetic processing section 62 performs correction of the error bit (step 26).

In this correction operation, processing represented by the following expressions is performed for the decomposed Gray code bits g0a, g0b, g0Xa and g0Xb and the Gray code bits G1 and G2 with which the error signals Er and ErX are "1" to produce correction Gray code bits g0Z to g2Z as shown in FIG. 54:

$$g2Z=/(Er@G2)$$

$$g1Z=/(ErX@G1)$$

$$g0Z=(Er+ErX)@ (g0a+g0b)$$

where + represents logical ORing, @ represents logical exclusive ORing, and/(bar) represents logical inversion.

In particular, any bit which is an error is inverted to a produce correction Gray code bits g0Z to g2Z.

Thereafter, Gray to binary conversion is performed for the correction Gray code g0Z to g2Z to produce a correction binary code B0Z to B2Z (steps 24 and 25). By such operation, as shown in FIG. 54, the binary code bits B0Z to B2Z have values more likely than those of the non-corrected binary code bits B0Z to B2Z produced based on the non-corrected Gray code bits G0 to G2 and have values more likely than those of the non-corrected binary code bits B0Z to B2Z obtained by the first and second operations.

With the encoder, a binary code with a babble error included in an input thermometer code has been corrected at a high speed by the arithmetic processing section 62, which operates in accordance with the program stored in the program storage section 63.

Figure 55:
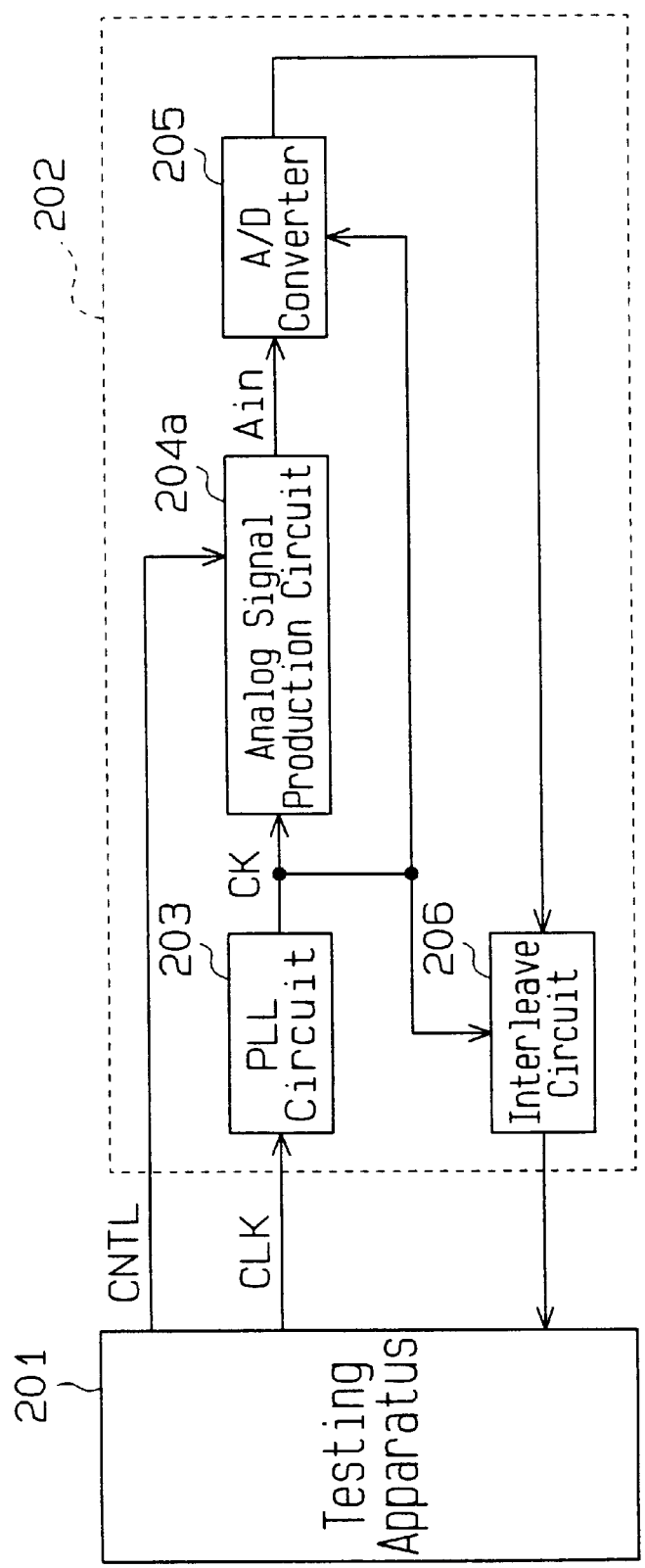
FIG. 55 is a block diagram showing a semiconductor device including an A/D converter connected to a testing apparatus for high speed performance testing of a first example according to the present invention.

FIG. 55 shows a semiconductor device for which a high speed performance test of a first example in accordance with the present invention is performed. A testing apparatus 201 outputs an original clock signal CLK and a control signal CNTL to a semiconductor device 202 which includes a high speed A/D converter 205. The original clock signal CLK is a signal of approximately 50 MHZ which is produced sufficiently by the testing apparatus 201 which is similar to a conventional testing apparatus, and the control signal CNTL is produced as an analog signal whose voltage is gradually varied by a time constant circuit or the like provided in the testing apparatus 201.

The original clock signal CLK is input to a PLL circuit 203 in the semiconductor device 202. The PLL circuit 203 produces an internal clock signal CK of, for example, 200 MHZ based on the original clock signal CLK and outputs the internal clock signal CK to an analog signal production circuit 204a, an A/D converter 205, an interleave circuit 206 and other internal circuits (not shown).

The control signal CNTL is input to the analog signal production circuit 204a. The analog signal production circuit 204a produces, is a performance test mode, an analog signal Ain, which has an equal frequency to but having a different phase from those of the internal clock signal CK, based on the internal clock signal CK and the control signal CNTL and outputs the analog signal Ain to the A/D converter 205.

While the internal clock signal CK is output as a pulse signal of a rectangular wave from the PLL circuit 203, actually it is input as a signal of a sine wave by an action of a parasitic capacitance or the like to the analog signal production circuit 204a and the A/D converter 205, and the analog signal production circuit 204a outputs the analog signal Ain, which has a phase delayed relative to the internal clock signal CK.

Figure 56:
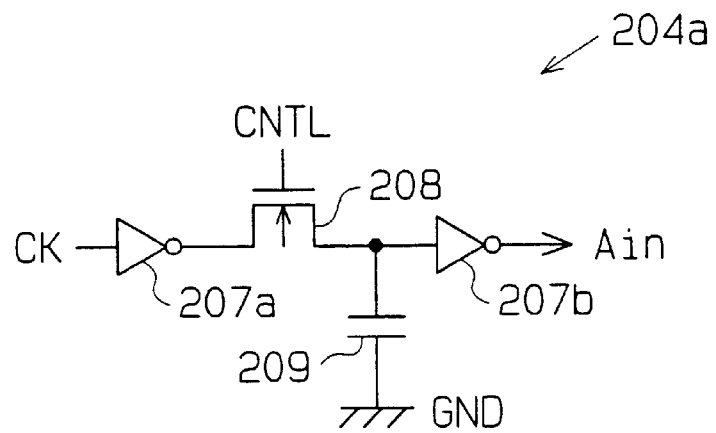
FIG. 56 is a circuit diagram showing an analog signal production circuit of the semiconductor device of FIG. 55.

A detailed construction of the analog signal production circuit 204a is shown in FIG. 56. The internal clock signal CK is input to an inverter circuit 207a, and an output signal of the inverter circuit 207a is input to another inverter circuit 207b through an N-channel MOS transistor 208. The control signal CNTL is input to the gate of the transistor 208, and an input terminal of the inverter circuit 207b is connected to the ground GND through a capacitor 209. The analog signal Ain is output from the inverter circuit 207b.

In the analog signal production circuit 204a, if the voltage level of the control signal CNTL varies, then the on-resistance of the transistor 208 varies to vary the time constant of the transistor 208 and the capacitor 209. Consequently, the phase difference between the internal clock signal CK and the analog signal Ain is varied by the variation of the control signal CNTL. The analog signal Ain is input to the A/D converter 205. The A/D converter 205 operates using the internal clock signal CK as a sampling clock signal to sample the analog signal Ain output from the analog signal production circuit 204a, converts the sampled analog value into a digital signal and outputs the digital signal to the interleave circuit 206. Except when a performance test is performed, the A/D converter 205 converts another analog signal into a digital signal and outputs the digital signal to the internal circuit or an external circuit.

The interleave circuit 206 operates, in a performance test mode, to output a digital signal output from the A/D converter 205 at a rate of once per n times to the testing apparatus 201.

When a performance test of the A/D converter 205 of the semiconductor device 202 is performed, the original clock signal CLK and the control signal CNTL are supplied from the testing apparatus 201 to the semiconductor device 202. The phase difference between the internal clock signal CK and the analog signal varies as time passes.

Figure 57:
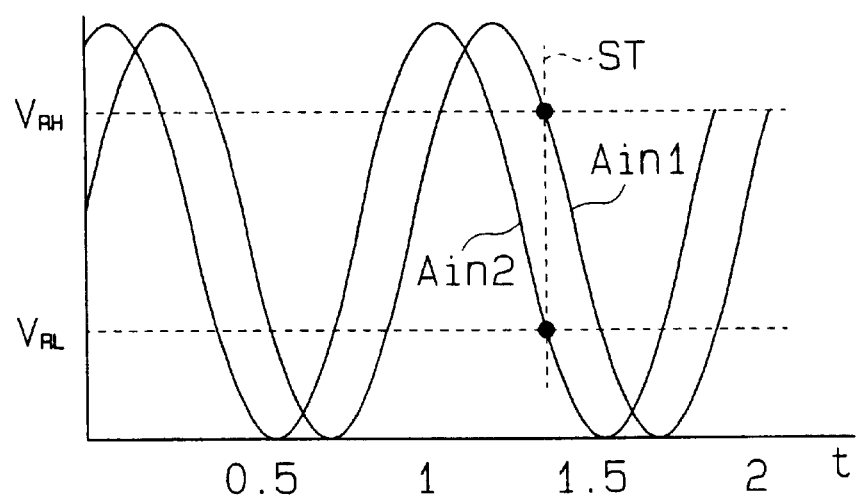
FIG. 57 is a diagram illustrating a sampling operation with an analog signal having a varied phase.

As shown in FIG. 57, if the phase of the analog signal Ain is gradually displaced from an analog signal Ain1 to another analog signal Ain2 with respect to a sampling timing ST of the A/D converter 205 by the internal clock signal CK, then the analog level sampled gradually varies within the range of predetermined comparison reference voltages $V_{RH}$ to $V_{RL}$ of the A/D converter 205. As a result, the analog value sampled by the A/D converter 205 successively varies within the range of the reference voltages $V_{RH}$ to $V_{RL}$, and the analog value is converted into a digital value and output to the testing apparatus 201 through the interleave circuit 206. The testing apparatus 201 detects whether or not the digital value of the digital signal output from the interleave circuit 206 successively varies to detect whether or not the A/D converter 205 is operating normally.

With the semiconductor device 202, the following effects are achieved:

(1) Since an analog signal need not be supplied from the testing apparatus 201 to the semiconductor device 202, a performance test of the A/D converter 205 installed in the semiconductor device 202 is performed with certainty irrespective of the operation speed of the testing apparatus 201;

(2) Based on the original clock signal CLK supplied from the testing apparatus 201, the internal clock signal CK of a high frequency is produced in the semiconductor device 202, and the analog signal Ain having a frequency equal to that of the internal clock signal CK is produced readily by the analog signal production circuit 204a based on the internal clock signal CK;

(3) The analog signal Ain is produced by the analog signal production circuit 204a successively displacing the phase of the internal clock signal CK, and by inputting the analog signal Ain to the A/D converter 205 to sample the internal clock signal CK, so that the sampled analog value is varied finely. Accordingly, by evaluating the digital value obtained by A/D conversion of the analog value, a performance test of the A/D converter 205 is performed with certainty; and (4) Since the digital output signal of the A/D converter 205 which operates at a high speed is output to the testing apparatus 201 through the interleave circuit 206 at a predetermined rate, even the testing apparatus 201 having an operation speed lower than that of the A/D converter 205 fetches and evaluates the digital output signal of the A/D converter 205 with certainty.

Where the analog signal Ain has a frequency equal to that of the internal clock signal CK, the internal clock signal CK should be divided by two by a divider and input to the analog signal production circuit 204a.

Further, the PLL circuit 203 may be provided in the testing apparatus 201 such that the internal clock signal CK may be supplied from the testing apparatus 201 to the analog signal production circuit 204a.

The internal clock signal CK may alternatively be input as an analog signal to the A/D converter 205 while the output signal of the analog signal production circuit 204a is input as a sampling clock signal to the A/D converter 205. In this instance, the analog signal production circuit 204a operates as a clock signal production circuit.

(Second Example)

Figure 58:
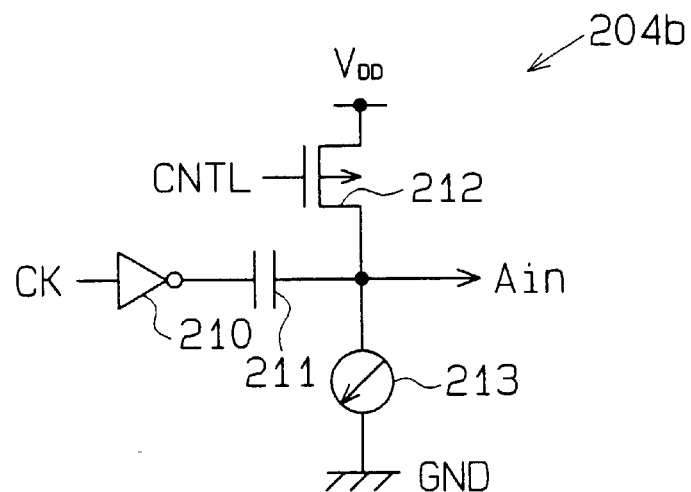
FIG. 58 is a circuit diagram showing a second example of an analog signal production circuit of the semiconductor device of FIG. 55.

In place of the analog signal production circuit 204a installed in the semiconductor device 202 of the first example, an analog signal production circuit 204b shown in FIG. 58 may be installed, in which the internal clock signal CK is input to an inverter circuit 210, and an output signal of the inverter circuit 210 is output as an analog signal Ain through a capacitor 211.

An output side terminal of the capacitor 211 is connected to a power supply $V_{DD}$ through a P-channel MOS transistor 212 and is connected to the ground GND through a current source 213. The control signal CNTL is input to the gate of the transistor 212.

From such an analog signal production circuit 204b, an analog signal Ain of a frequency equal to that of the internal clock signal CK is output based on an input of the internal clock signal CK.

In this instance, if the voltage level of the control signal CNTL rises, then since drain current of the transistor 212 decreases, the DC level of the analog signal Ain drops. However, if the voltage level of the control signal CNTL drops, then the drain current of the transistor 212 increases. Consequently, the DC level of the analog signal Ain rises.

When a performance test of the A/D converter 205 of the semiconductor device 202 which includes such an analog signal production circuit 204b is performed, the original clock signal CLK and the control signal CNTL are supplied from the testing apparatus 201 to the semiconductor device 202. The control signal CNTL is a signal whose voltage level varies as time passes in a similar manner as in the first example.

Figure 59:
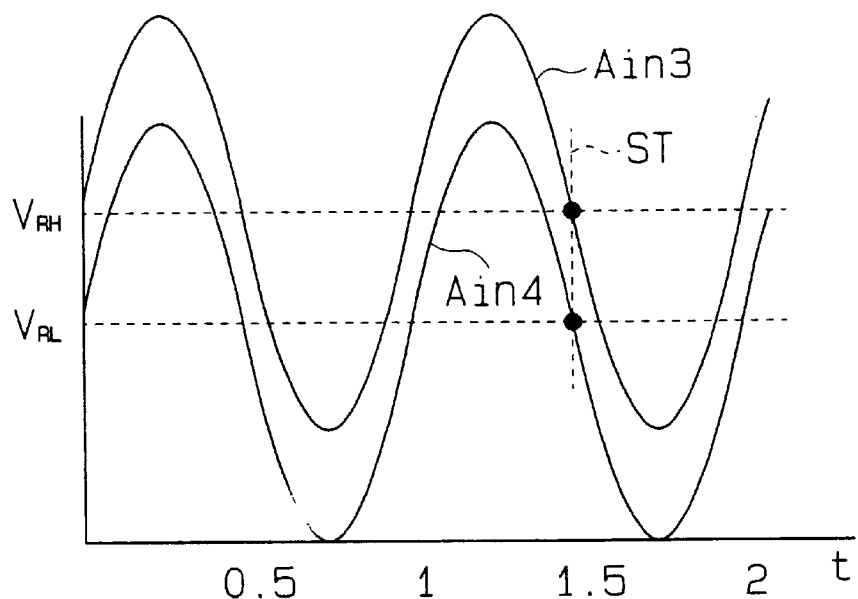
FIG. 59 is a diagram illustrating a sampling operation with an analog signal having a varied DC level.

As shown in FIG. 59, the DC level of the analog signal Ain varies as time passes. Then, if the DC level of the analog signal Ain is displaced gradually from an analog signal Ain3 to another analog signal Ain4 with respect to a sampling timing ST of the A/D converter 205 by the internal clock signal CK, then the analog level sampled gradually varies within the range of predetermined comparison reference voltages $V_{RH}$ to $V_{RL}$ of the A/D converter 205. As a result, the analog value sampled by the A/D converter 205 gradually varies within the range of the reference voltages $V_{RH}$ to $V_{RL}$, and the analog value is converted into a digital signal and output to the testing apparatus 201 through the inter-leave circuit 206. The testing apparatus 201 detects whether or not the digital value of the digital signal output from the interleave circuit 206 successively varies to determinate whether or not the A/D converter 205 is operating normally.

With such a semiconductor device 202, the following effect is achieved in addition to the effects (1), (2) and (4) achieved by the first example.

In particular, by successively displacing the DC level of the internal clock signal CK by means of the analog signal production circuit 204b to produce an analog signal Ain and inputting the analog signal Ain to the A/D converter 205 so that the analog signal Ain is sampled with the internal clock signal CK, the sampled analog value is varied finely. Accordingly, by evaluating the digital signal obtained by A/D conversion of the analog value, a performance test of the A/D converter 205 is performed with certainty.

The analog value to be sampled may be varied finely by varying the amplitude of the analog signal. Further, the DC level of the analog signal may be fixed while the DC level or the amplitude of the sampling clock signal may be varied.

Further, a construction wherein the output signal of the analog signal production circuit 204b is input as the clock signal CLK to the A/D converter 205 and the internal clock signal CK is input as an analog signal to the A/D converter 205 example may be employed alternatively.

(Second Embodiment)

Figure 60:
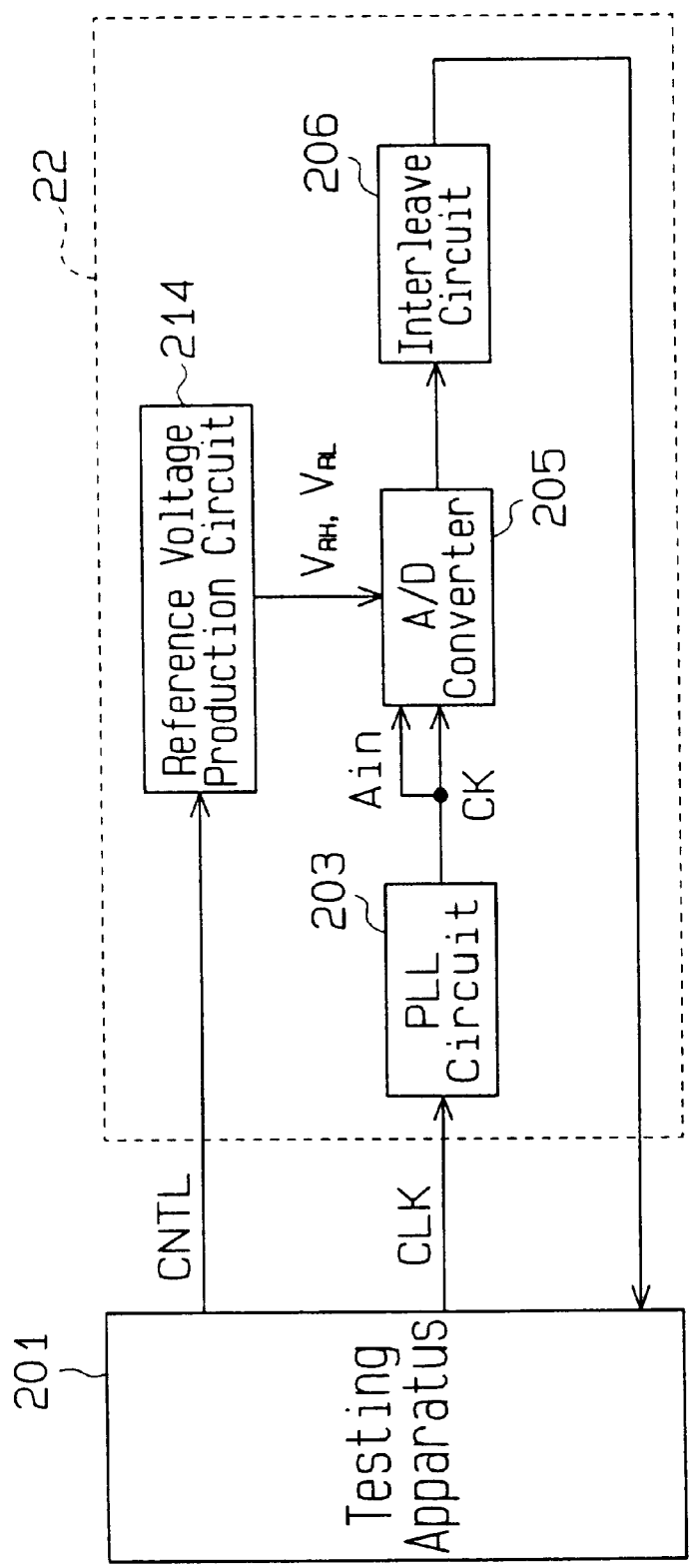
FIG. 60 is a block diagram showing a second embodiment of a semiconductor device according to the present invention.

FIG. 60 shows a second embodiment of a semiconductor device 22 in accordance with the present invention. The second embodiment produces the analog signal Ain to be input to the A/D converter 205 not by varying the phase or the DC level of the internal clock signal CK, but by varying the comparison reference voltage for the A/D converter 205.

As shown in FIG. 60, the control signal CNTL output from the testing apparatus 201 is input to a comparison reference voltage production circuit 214. The comparison reference voltage production circuit 214 varies, in response the control signal CNTL, comparison reference voltages to be supplied to the A/D converter 205 moderately within the ranges of $V_{RH1}$ and $V_{RL1}$ to $V_{RH2}$ and $V_{RL2}$ illustrated in FIG. 61.

The internal clock signal CK output from the PLL circuit 203 is input as a sampling clock signal and also as the analog signal Ain to the A/D converter 205.

In order to perform a performance test of the A/D converter 205 of the semiconductor device 202 which includes the comparison reference voltage production circuit 214, the original clock signal CLK and the control signal CNTL are supplied from the testing apparatus 201 to the semiconductor device 202.

Figure 61:
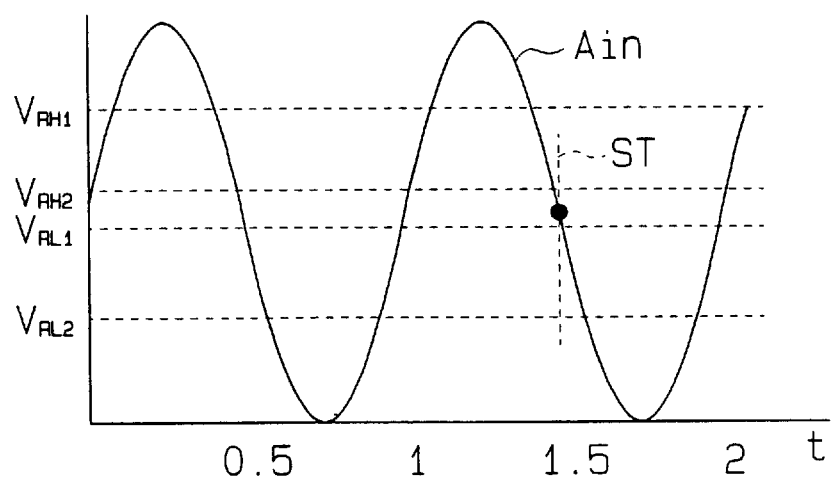
FIG. 61 is a diagram illustrating a sampling operation when a comparison reference voltage is varied.

As shown in FIG. 61, the comparison reference voltages to be supplied vary within the ranges of $V_{RH1}$ and $V_{RL1}$ to $V_{RH2}$ to $V_{RL2}$ as time passes. If the comparison reference voltages are displaced moderately from a sampling timing ST of the A/D converter 205 by the internal clock signal CK, then the comparison reference voltages vary moderately with respect to the analog level to be sampled. As a result, the comparison reference voltages successively vary within the ranges of $V_{RH1}$ and $V_{RL1}$ to $V_{RH2}$ and $V_{RL2}$ with respect to the analog value sampled by the A/D converter 205, and the analog value is converted into a digital signal and output to the testing apparatus 201 through the interleave circuit 206. The testing apparatus 201 detects whether or not the digital value of the digital signal output from the interleave circuit 206 successively varies to determinate whether or not the A/D converter 205 is operating normally.

In the semiconductor device 202, the following effect is achieved, in addition to the effects (1), (2) and (4) achieved by the first example.

In particular, since the comparison reference voltage production circuit 214 successively displaces and inputs the comparison reference voltages to the A/D converter 205 so that the comparison reference voltages and an analog value obtained by sampling of the analog signal Ain are compared with each other, the comparison reference voltages are varied finely with respect to the analog value to be sampled. Accordingly, by evaluating a digital signal obtained by A/D conversion of the analog value, a performance test of the A/D converter 205 is performed with certainty.

(Third Embodiment)

Figure 62:
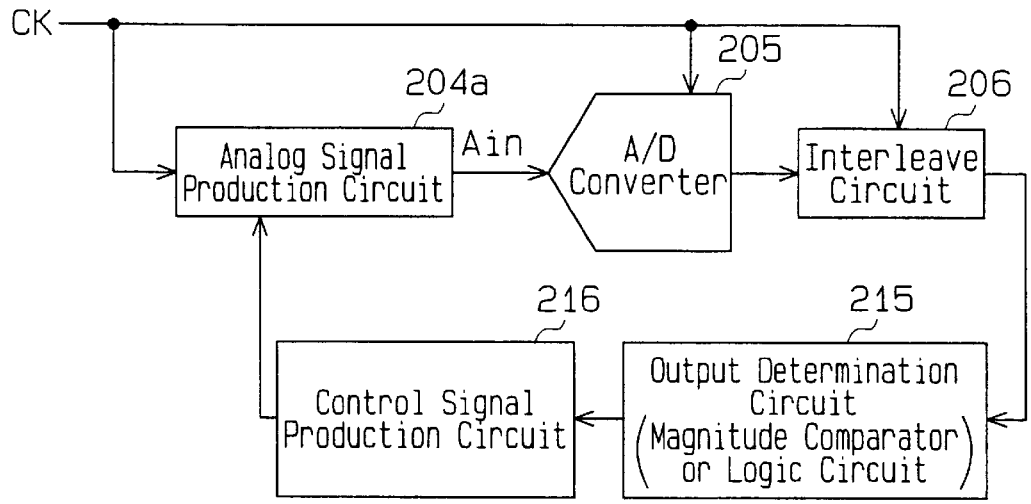
FIG. 62 is a block diagram showing a third embodiment of a semiconductor device according to the present invention.
Figure 63:
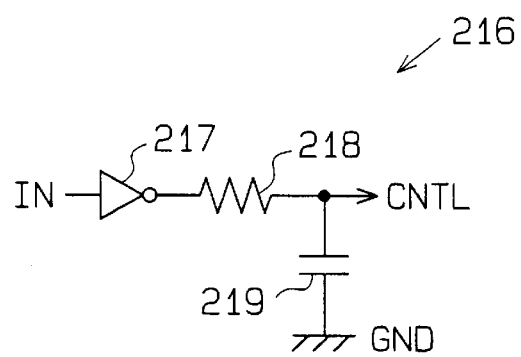
FIG. 63 is a circuit diagram showing a control signal production circuit of the semiconductor device of FIG. 62.

FIGS. 62 and 63 show a third embodiment of a semiconductor device in accordance with the present invention. The third embodiment includes an output determination circuit 215 and a control signal production circuit 216 in addition to the first example so that it has a self diagnosis circuit which performs self diagnosis of operation of the A/D converter 205.

The analog signal production circuit 204a delays the phase of the internal clock signal CK in response to the control signal CNTL to obtain an analog signal Ain and outputs the analog signal Ain to the A/D converter 205.

An output signal of the interleave circuit 206 is input to the output determination circuit 215. The output determination circuit 215 comprises a magnitude comparator and successively compares a digital signal successively input thereto from the interleave circuit 206. Thus, for example, if a digital value input later is higher, that is, when the digital signal exhibits a monotonous increase, the output determination circuit 215 outputs an L level, but if the digital value input later is lower, that is, when the digital value does not exhibit a monotonous increase, the output determination circuit 215 outputs an H level.

An output signal of the output determination circuit 215 is input to the control signal production circuit 216. A detailed construction of the control signal production circuit 216 is described with reference to FIG. 63.

An input signal IN is input to an inverter circuit 217, and an output signal of the inverter circuit 217 is output as the control signal CNTL to the analog signal production circuit 204a through a resistor 218. An output side terminal of the resistor 218 is connected to the ground GND through a capacitor 219. The time constant set by the resistor 218 and the capacitor 219 is sufficiently large with respect to an output signal frequency of the interleave circuit 206.

Thus, if the input signal IN has an L level, then the control signal production circuit 216 gradually raises the voltage level of the control signal CNTL, but if the input signal IN has an H level, then the control signal production circuit 216 gradually lowers the voltage level of the control signal CNTL.

In the self diagnosis circuit, when the internal clock signal CK is supplied to the analog signal production circuit 204a, A/D converter 205 and interleave circuit 206 to start a performance test of the A/D converter 205, if the digital value of the digital signal output from the interleave circuit 206 increases, then the voltage level of the control signal CNTL rises. Consequently, the phase of the analog signal Ain advances and the analog value to be sampled becomes larger, and the digital value of the digital signal to be output from the A/D converter 205 increases. As a result, the output signal of the output determination circuit 215 is maintained at an L level while the output signal of the inverter circuit 217 of the output determination circuit 215 is maintained at an H level, and the voltage level of the control signal CNTL to be output from the control signal production circuit 216 further rises.

By such operation, a positive feedback loop is formed by the analog signal production circuit 204a, A/D converter 205, interleave circuit 206, output determination circuit 215 and control signal production circuit 216, and if the monotony of the A/D converter 205 is normal, then the digital signal output from the A/D converter 205 rises up to its maximum value.

However, if the monotony of the A/D converter 205 is abnormal, then operation of the positive feedback loop stops at a time when a malfunction occurs stops and the rise of the voltage level of the control signal CNTL stops, and consequently, the rise of the digital signal output from the A/D converter 205 stops without reaching the maximum value.

Accordingly, by confirming, after a predetermined time passes after starting of a performance test, whether or not the maximum value of the digital signal output from the A/D converter 205 is reached, it is detected whether or not the A/D converter 205 is normal.

Further, such an A/D converter 205 is constructed such that it converts an analog signal Ain once into a digital signal of a Gray code and then converts the digital signal of the Gray code into a digital signal of a binary code. From the characteristic of the Gray code, when the digital value successively varies by "1", the Gray code varies at only one bit thereof. Making use of this characteristic, the output determination circuit 215 may includes a logic circuit for logically exclusively ORing output signals of is individual bits of two successive cycles from among digital signals of successive cycles of the Gray code, the monotony of the output signal of the A/D converter 205 is determinated.

Further, in the present example, the positive feedback loop may alternatively be formed using the analog signal production circuit 204b of the second example or the comparison reference voltage production circuit 214 of the second embodiment of the semiconductor device.

It should be apparent to those skilled in the art that the present invention may be embodied in many other specific forms without departing from the spirit or scope of the invention. Moreover, although the invention is shown as generating a 5-bit binary code, it will be understood that the disclosed embodiment may be modified to generate binary codes having a different number of bits Therefore, the present examples and embodiments are to be considered as illustrative and not restrictive and the invention is not to be limited to the details give herein, but may be modified without the scope and equivalence of the appended claims.

What is claimed is:

1. A testing method for an A/D converter, comprising the steps of:

detecting a logical boundary of a thermometer code to produce a Gray code including a lower order bit and an upper order bit which have a particular relationship;

determining whether the particular relationship is satisfied;

generating an error signal when the particular relationship is not satisfied; and detecting whether an error code is included in the thermometer code based on the error signal.

2. A testing method for an A/D converter operating in accordance with a sampling clock signal, comprising the steps of:

producing an analog signal having a phase which varies successively with respect to the sampling clock signal;

sampling the analog signal in accordance with the sampling clock signal to generate a digital signal using the A/D convertor; and evaluating the digital signal.

3. The testing method of claim 2, wherein the analog signal has a frequency equal to that of the sampling clock signal.

4. The testing method of claim 2, wherein the analog signal has a frequency equal to half that of the sampling clock signal.

5. The testing method of claim 2, wherein the evaluating step includes the step of evaluating the digital signal at a predetermined rate.

6. A testing method for an A/D converter operating in accordance with a sampling clock signal, comprising the steps of:
   producing an analog signal having one of a DC level and amplitude which varies successively with respect to the sampling clock signal;
   sampling the analog signal in accordance with the sampling clock signal to generate a digital signal using the A/D converter; and
   evaluating the digital signal.

7. A testing method for an A/D converter converting an analog signal to a digital signal, comprising the steps of:
   producing a sampling clock signal having a phase which varies successively with respect to the analog signal;
   sampling the analog signal in accordance with the sampling clock signal to generate the digital signal using the A/D converter; and
   evaluating the digital signal.

8. A testing method for an A/D converter comprising the steps of:
   producing a sampling clock signal having one of a DC level and amplitude which varies successively with respect to an analog signal;
   sampling the analog signal in accordance with the sampling clock signal to generate a digital signal using the A/D converter; and
   evaluating the digital signal.

9. A testing method for an A/D converter operating in accordance with a sampling clock signal, comprising the steps of:
   producing an analog signal from the sampling clock signal;
   producing a comparison reference voltage which successively varies;
   providing the analog signal and the comparison reference voltage to the A/D converter;
   sampling the analog signal in accordance with the sampling clock signal to generate a digital signal based on the sampled analog signal and the comparison reference voltage using the A/D converter; and
   evaluating the digital signal.

10. A semiconductor device, comprising:
    an analog signal production circuit for receiving a sampling clock signal and producing an analog signal having a phase which varies successively with respect to the sampling clock signal; and
    an A/D converter for sampling the analog signal in accordance with the sampling clock signal to generate a digital signal.

11. The semiconductor device of claim 10, further comprising a divider for dividing the analog signal into a frequency equal to half that of the sampling clock signal.

12. The semiconductor device of claims 10, further comprising an interleave circuit for receiving the digital signal from the A/D converter and outputting the digital signal at a predetermined rate.

13. The semiconductor device of claims 10, further comprising:
    an output determination circuit for receiving the digital signal from the A/D converter and determining whether monotony is present in a variation of the digital signal to output a determination signal; and
    a control signal production circuit for receiving the determination signal and producing a control signal for monotonously varying the analog signal from the analog signal production circuit in response to the determination signal.

14. The semiconductor device of claim 13, wherein the output determination circuit comprises a magnitude comparator.

15. The semiconductor device of claim 13, wherein the output determination circuit comprises a logic circuit which produces a logical exclusive OR signal of successive digital signals.

16. The semiconductor device of claim 10, further comprising a PLL circuit receiving an original clock signal externally supplied thereto and producing a sampling clock signal having a frequency higher than that of the original clock signal.

17. A semiconductor device, comprising:
    an analog signal production circuit for receiving a sampling clock signal and producing an analog signal having one of a DC level and amplitude which varies successively with respect to the sampling clock signal; and
    an A/D converter for receiving the analog signal and sampling the analog signal in accordance with the sampling clock signal to generate a digital signal.

18. A semiconductor device, comprising:
    a clock signal production circuit for receiving an analog signal and producing a sampling clock signal having a phase which varies successively with respect to the analog signal; and
    an A/D converter for receiving the analog signal and sampling the analog signal in accordance with the sampling clock signal to generate a digital signal.

19. A semiconductor device, comprising:
    a clock signal production circuit for receiving an analog signal and producing a sampling clock signal having one of a DC level and amplitude which varies successively with respect to the analog signal; and
    an A/D converter for receiving the analog signal and sampling the analog signal in accordance with the sampling clock signal to generate a digital signal.

20. A semiconductor device, comprising:
    an analog signal production circuit for receiving a sampling clock signal and producing an analog signal;
    a comparison reference voltage production circuit for producing a comparison reference voltage which successively varies; and
    an A/D converter for receiving the analog signal and the comparison reference voltage and sampling the analog signal in accordance with the sampling clock signal, the A/D converter further generating a digital signal based on the sampled analog signal and the comparison reference voltage.

* * * * *

UNITED STATES PATENT AND TRADEMARK OFFICE
CERTIFICATE OF CORRECTION

PATENT NO. : 6,703,951 B2
DATED : March 9, 2004
INVENTOR(S) : Sanroku Tsukamoto

It is certified that error appears in the above-identified patent and that said Letters Patent is hereby corrected as shown below:

Title page,
Item [30], Foreign Application Priority Data, please add
-- Sept. 5, 1997 (JP)    9-241376 --.

Signed and Sealed this

Twenty-second Day of June, 2004

JON W. DUDAS
*Acting Director of the United States Patent and Trademark Office*